United States Patent [19]

Newkirk et al.

[11] Patent Number: 5,163,499

[45] Date of Patent: * Nov. 17, 1992

[54] METHOD OF FORMING ELECTRONIC PACKAGES

[75] Inventors: Marc S. Newkirk, Newark, Del.; Danny R. White, Elkton, Md.; Christopher R. Kennedy, Newark, Del.; Alan S. Nagelberg, Wilmington, Del.; Michael K. Aghajanian, Bel Air, Md.; Robert J. Wiener, Newark, Del.; Steven D. Keck, Hockessin, Del.; John T. Burke, Hockessin, Del.; Peter M. Engelgau, Dover, Del.; Cheng-Tsin Lee, Newark, Del.; Michael A. Rocazella, Newark, Del.

[73] Assignee: Lanxide Technology Company, LP, Newark, Del.

[*] Notice: The portion of the term of this patent subsequent to Apr. 2, 2008 has been disclaimed.

[21] Appl. No.: 520,936

[22] Filed: May 9, 1990

Related U.S. Application Data

[63] Continuation-in-part of Ser. No. 484,575, Feb. 23, 1990, which is a continuation-in-part of Ser. No. 405,747, Sep. 11, 1989, abandoned, which is a continuation-in-part of Ser. No. 376,416, Jul. 7, 1989, abandoned, which is a continuation-in-part of Ser. No. 368,564, Jun. 20, 1989, abandoned, which is a continuation-in-part of Ser. No. 269,464, Nov. 10, 1988, Pat. No. 5,040,588.

[51] Int. Cl.[5] .................... B22D 19/14; B23K 31/00
[52] U.S. Cl. .................... 164/98; 164/108; 228/120
[58] Field of Search ............. 164/98, 107, 108, 109, 164/97; 228/120

[56] References Cited

U.S. PATENT DOCUMENTS

| 2,951,771 | 9/1960 | Butler | 117/114 |
|---|---|---|---|
| 3,031,340 | 4/1962 | Girardot | 117/118 |
| 3,149,409 | 9/1964 | Maruhn | 29/156.5 |
| 3,364,976 | 1/1968 | Reding et al. | 164/63 |
| 3,396,777 | 8/1968 | Reding, Jr. | 164/97 |
| 3,547,180 | 12/1970 | Cochran et al. | 164/61 |
| 3,608,170 | 9/1971 | Larson et al. | 29/149.5 |
| 3,718,441 | 2/1973 | Landingham | 29/182.1 |
| 3,864,154 | 2/1975 | Gazza et al. | 264/60 X |
| 3,868,267 | 2/1975 | Gazza et al. | 264/60 X |
| 3,915,699 | 10/1975 | Umehara et al. | 419/17 |
| 3,969,553 | 7/1976 | Kondo et al. | 427/299 |
| 3,970,136 | 7/1976 | Cannell et al. | 164/408 |
| 4,033,400 | 7/1977 | Gurwell | 164/98 |
| 4,044,816 | 8/1977 | Krueger | 164/98 |
| 4,055,451 | 10/1977 | Cockbain | 228/195 |

(List continued on next page.)

FOREIGN PATENT DOCUMENTS 1238428 6/1988 Canada .
0094353 11/1983 European Pat. Off. .
0115742 8/1984 European Pat. Off. .

(List continued on next page.)

Primary Examiner—Richard K. Seidel
Assistant Examiner—Rex E. Pelto
Attorney, Agent, or Firm—Mark G. Mortenson; Stanislav Antolin; Carol A. Lewis

[57] ABSTRACT

The present invention relates to the formation of a macrocomposite body by spontaneously infiltrating a permeable mass of filler material or a preform with molten matrix metal and bonding the spontaneously infiltrated material to at least one second material such as a ceramic or ceramic containing body and/or a metal or metal containing body. Particularly, an infiltration enhancer and/or infiltration enhancer precursor and/or infiltrating atmosphere are in communication with a filler material or a preform, at least at some point during the process, which permits molten matrix metal to spontaneously infiltrate the filler material or preform. Moreover, prior to infiltration, the filler material or preform is placed into contact with at least a portion of a second material such that after infiltration of the filler material or preform, the infiltrated material is bonded to the second material, thereby forming a sealable electronic package.

15 Claims, 25 Drawing Sheets

FOREIGN PATENT DOCUMENTS

| | | |
|---|---|---|
| 0183016 | 6/1986 | European Pat. Off. . |
| 0332384 | 9/1989 | European Pat. Off. . |
| 0340957 | 11/1989 | European Pat. Off. . |
| 0364963 | 4/1990 | European Pat. Off. . |
| 2819076 | 10/1979 | Fed. Rep. of Germany . |
| 144441 | 8/1983 | Japan . |
| 2156718 | 10/1985 | United Kingdom ................ 164/102 |

U.S. PATENT DOCUMENTS

| | | | |
|---|---|---|---|
| 4,067,379 | 1/1978 | Hässler | 164/98 |
| 4,082,864 | 4/1978 | Kendall et al. | 427/248 |
| 4,119,363 | 10/1978 | Camlibel et al. | 350/96.2 |
| 4,232,091 | 11/1980 | Grimshaw et al. | 428/472 |
| 4,347,265 | 8/1982 | Washo | 29/592.1 |
| 4,376,803 | 3/1983 | Katzman | 428/408 |
| 4,376,804 | 3/1983 | Katzman | 428/408 |
| 4,404,262 | 9/1983 | Watmough | 428/539.5 |
| 4,450,207 | 5/1984 | Donomoto et al. | 428/614 |
| 4,473,103 | 9/1984 | Kenney et al. | 164/97 |
| 4,559,246 | 12/1985 | Jones | 427/299 |
| 4,570,316 | 2/1986 | Sakamaki et al. | 29/156.82 |
| 4,587,177 | 5/1986 | Toaz et al. | 428/614 |
| 4,630,665 | 12/1986 | Novak | 164/97 |
| 4,657,065 | 4/1987 | Wada et al. | 164/461 |
| 4,662,429 | 5/1987 | Wada et al. | 164/461 |
| 4,673,435 | 6/1987 | Yamaguchi et al. | 75/235 |
| 4,677,901 | 7/1987 | Ban et al. | 92/213 |
| 4,679,493 | 7/1987 | Munro et al. | 92/212 |
| 4,713,111 | 12/1987 | Cameron et al. | 75/68 R |
| 4,731,298 | 3/1988 | Shindo et al. | 428/611 |
| 4,753,690 | 6/1988 | Wada et al. | 148/11.5 A |
| 4,802,524 | 2/1989 | Donomoto | 164/97 |
| 4,828,008 | 5/1989 | White et al. | 164/66.1 |
| 4,871,008 | 10/1989 | Dwivedi | 164/6 |
| 4,875,616 | 10/1989 | Nixdorf | 228/253 |
| 4,884,737 | 12/1989 | Newkirk | 228/248 |
| 4,932,099 | 6/1990 | Corwin | 164/97 |
| 4,935,055 | 6/1990 | Aghajanian et al. | 164/66.1 |
| 4,978,054 | 12/1990 | Ferrando | 228/120 |
| 5,000,986 | 3/1991 | Li | 228/120 |
| 5,004,034 | 4/1991 | Park | 164/97 |
| 5,011,063 | 4/1991 | Claar | 228/124 |
| 5,040,588 | 8/1991 | Newkirk | 164/97 |

OTHER PUBLICATIONS

F. Delannay, L. Froyen, and A. Deruyttere, "Review: The Wetting of Solids by Molten Metals and Its Relation to the Preparation of Metal–Matrix Composites", Journal of Materials Science, vol. 22, No. 1, pp. 1–16, Jan. 1987.

A. Mortensen, M. N. Gungor, J. A. Cornie, and M. C. Flemings "Alloy Microstructures in Cast Metal Matrix Composites", Journal of Metals, vol. 38, No. 3, pp. 30–35, Mar. 1986.

G. R. Edwards and D. L. Olson, "The Infiltration Kinetics of Aluminum in Silicon Carbide Compacts", Annual Report from Center for Welding Research, Colorado School of Mines, under ONR Contract No. M00014-85-K-0451, DTIC Report AD-A184 682, Jul. 1987.

K. G. Beasly, Industry–University Advanced Materials Conference II, date of conference: Mar. 6–9, 1989, Advanced Materials Institute, Colorado School of Mines, Golden, Colo.

J. J. Licari and L. R. Enlow, Hybrid Microcircuit Technology Handbook: Materials, Processes, Design, Testing and Production, pp. 174–248, copyright 1988, Noyes Publications, Park Ridge, N.J.

J. R. Tyler and M. R. van den Bergh, Electronic Materials and Processes, vol. 3, pp. 1068–1078, Jun. 20, 1989, SAMPE International, Covina, Calif.

A. L. Geiger and M. Jackson, Electronic Materials and Processes, 3rd Electronic Conference (restricted session), pp. 20–31, date of conference: Jun. 20–22, 1989, SAMPE International, Covina, Calif.

C. A. Neugebauer, Journal of Electronic Materials, pp. 229–239, vol. 18, No. 2, Feb. 1989, The Minerals, Metals and Materials Society (TMS), Warrendale, Pa.

J. D. Gardner, G. L. Hira and A. L. Oppedal, Electronic Materials and Processes, 3rd Electronic Conference (restricted session), pp. 32–42, date of conference; Jun. 20–22, 1989, SAMPE International, Covina, Calif.

W. De la Torre & W. C. Riley, Electronic Materials and (List continued on next page.)

OTHER PUBLICATIONS

Processes, vol. 3, pp. 1079–1091, Jun. 20, 1989, SAMPE International, Covina, Calif.

J. W. Roman, Proceedings, Eleventh Annual Discontinuously Reinforced MMC Working Group, pp. 193–206, date of proceedings: Feb. 14–16, 1989, available Dec. 1989, MMCIAC, Kaman Science Corporation, Santa Barbara, Calif.

A. L. Geiger and M. Jackson, Microelectronic Packaging Technology: Materials and Processes, pp. 93–102, date of conference: Apr. 24–28, 1989, ASM International, Metals Park, Ohio.

R. Keller, Electronic Packaging and Production, pp. 80–82, Feb. 1989, Cahners Publishing Co., Denver, Colo.

K. A. Schmidt, C. Zweben and R. Arsenault, Thermal and Mechanical Behavior of Metal Matrix and Ceramic Matrix Composites, pp. 155–164, date of conference: Nov. 7–8, 1988, American Society for Testing (ASTM), Philadelphia, Pa.

C. Thaw, R. Minet, J. Zemany, and C. Zweben, SAMPE Jorunal, pp. 40–43, vol. 23, No. 6, Nov./Dec. 1987, SAMPE International, Covina, Calif.

N. R. Stockham and C. J. Dawes, International Journal for Hybrid Microelectronics, pp. 509–519, vol. 6, No. 1, Oct. 1983.

C. Davidoff, Metal Finishing Guidebook & Directory: 44th Annual Edition, pp. 413–418, 1976, Metals and Plastics Publications, Inc., Hackensack, N.J.

Fig. 9
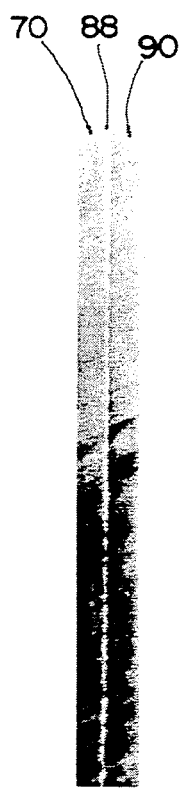
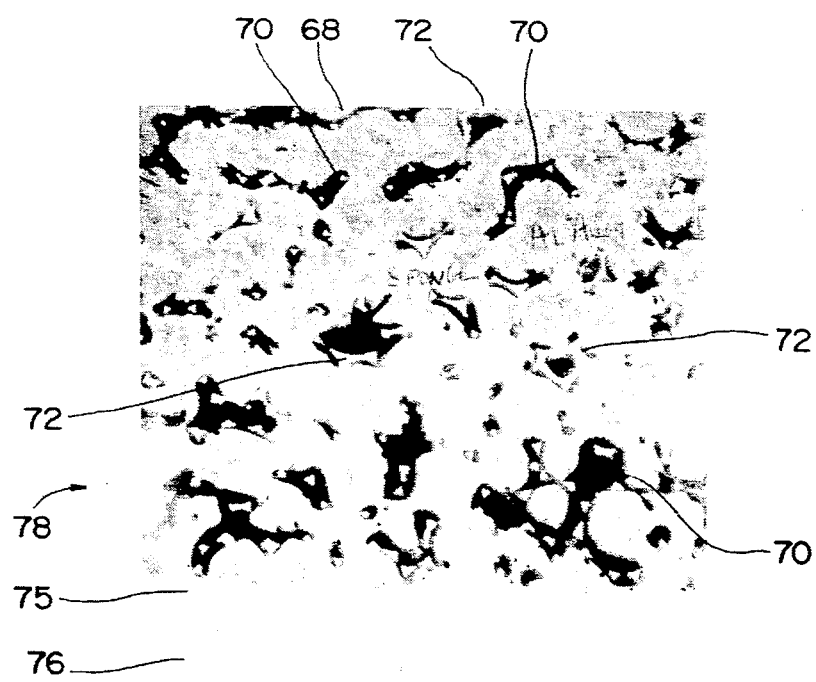
Fig. 13
Fig. 11

METHOD OF FORMING ELECTRONIC PACKAGES

CROSS REFERENCE TO RELATED APPLICATION

This application is a Continuation-in-Part of application Ser. No. 07/484,575, filed on Feb. 23, 1990, which is a Continuation-in-Part of application Ser. No. 07/405,747 (now abandoned), filed on Sep. 11, 1989, filed in the names of Marc S. Newkirk et al, and entitled "Methods for Forming Macrocomposite Bodies and Macrocomposite Bodies Produced Thereby" which in turn in a Continuation-in-Part Application of application Ser. No. 07/376,416 (now abandoned), filed on Jul. 7, 1989, filed in the names of Marc S. Newkirk et al., and entitled "Methods For Forming Macrocomposite Bodies and Macrocomposite Bodies Produced Thereby", which in turn in a Continuation-in-Part Application of application Ser. No. 07/368,564 (now abandoned), filed on Jun. 20, 1989, filed in the names of Marc S. Newkirk et al., and entitled "Methods For Forming Macrocomposite Bodies and Macrocomposite Bodies Produced Thereby", which in turn in a Continuation-in-Part Application of application Ser. No. 07/269,464, filed on Nov. 10, 1988, filed in the names of Marc S. Newkirk et al., and now U.S. Pat. No. 5,040,588, issued Aug. 20, 1991, entitled "Methods For Forming Macrocomposite Bodies and Mac ocomposite Bodies Produced Thereby", the subject matter of each of which is expressly incorporated herein by reference.

FIELD OF THE INVENTION

The present invention relates to the formation of a macrocomposite body by spontaneously infiltrating a permeable mass of filler material or a preform with molten matrix metal and bonding the spontaneously infiltrated material to at least one second material such as a ceramic and/or a metal. Particularly, an infiltration enhancer and/or infiltration enhancer precursor and/or infiltration atmosphere are in communication with a filler material or a preform, at least at some point during the process, which permits molten matrix metal to spontaneously infiltrate the filler material or preform. Moreover, prior to infiltration, the filler material or preform is placed into contact with at least a portion of a second material such that after infiltration of the filler material or preform, the infiltrated material is bonded to the second material, thereby forming a macrocomposite body.

BACKGROUND OF THE INVENTION

Composite products comprising a metal matrix and a strengthening or reinforcing phase such as ceramic particulates, whiskers, fibers or the like, show great promise for a variety of applications because they combine some of the stiffness and wear resistance of the reinforcing phase with the ductility and toughness of the metal matrix. Generally, a metal matrix composite will shown an improvement in such properties as strength, stiffness, contact wear resistance, and elevated temperature strength retention relative to the matrix metal in monolithic form, but the degree to which any given property may be improved depends largely on the specific constituents, their volume or weight fraction, and how they are processed in forming the composite. In some instances, the composite also may be lighter in weight than the matrix metal per se. Aluminum matrix composites reinforced with ceramics such as silicon carbide in particulate, platelet, or whisker form, for example, are of interest because of their higher stiffness, wear resistance and high temperature strength relative to aluminum.

Various metallurgical processes have been described for the fabrication of aluminum matrix composites, including methods based on powder metallurgy techniques and liquid-metal infiltration techniques which make use of pressure casting, vacuum casting, stirring, and wetting agents. With powder metallurgy techniques, the metal in the form of a powder and the reinforcing material in the form of a powder, whiskers, chopped fibers, etc., are admixed and then either cold-pressed and sintered, or hot-pressed. The maximum ceramic volume fraction in silicon carbide reinforced aluminum matrix composites produced by this method has been reported to be about 25 volume percent in the case of whiskers, and about 40 volume percent in the case of particulates.

The production of metal matrix composites by powder metallurgy techniques utilizing conventional processes imposes certain limitations with respect to the characteristics of the products attainable. The volume fraction of the ceramic phase in the composite is limited typically, in the case of particulates, to about 40 percent. Also, the pressing operation poses a limit on the practical size attainable. Only relatively simple product shapes are possible without subsequent processing (e.g., forming or machining) or without resorting to complex presses. Also, nonuniform shrinkage during sintering can occur, as well as nonuniformity of microstructure due to segregation in thee compacts and grain growth.

U.S. Pat. No. 3,970,136, granted Jul. 20, 1976, to J. C. Cannell et al., describes a process for forming a metal matrix composite incorporating a fibrous reinforcement, e.g. silicon carbide or alumina whiskers, having a predetermined pattern of fiber orientation. The composite is made by placing parallel mats or felts of coplanar fibers in a mold with a reservoir of molten matrix metal, e.g., aluminum, between at least some of the mats, and applying pressure to force molten metal to penetrate the mats and surround the oriented fibers, Molten metal may be poured onto the stack of mats while being forced under pressure to flow between the mats. Loadings of up to about 50% by volume of reinforcing fibers in the composite have been reported.

The above-described infiltration process, in view of its dependence on outside pressure to force the molten matrix metal through the stack of fibrous mats, is subject to the vagaries of pressure-induced flow processes, i.e., possible non-uniformity of matrix formation, porosity, etc. Non-uniformity of properties is possible even though molten metal may be introduced at a multiplicity of sites within the fibrous array. Consequently, complicated mat/reservoir arrays and flow pathways need to be provided to achieve adequate and uniform penetration of the stack of fiber mats. Also, the aforesaid pressure-infiltration method allows for only a relatively low reinforcement to matrix volume fraction to be achieved because of the difficulty inherent in infiltrating a large mat volume. Still further, molds are required to contain the molten metal under pressure, which adds to the expense of the process. Finally, the aforesaid process, limited to infiltrating aligned particles or fibers, is not directed to formation of aluminum metal matrix composites reinforced with materials in the form of randomly oriented particles, whiskers or fibers.

In the fabrication of aluminum matrix-alumina filled composites, aluminum does not readily wet alumina, whereby making it difficult to form a coherent product. Various solutions to this problem have been suggested. One such approach is to coat the alumina with a metal (e.g., nickel or tungsten), which is then hot-pressed along with the aluminum. In another technique, the aluminum is alloyed with lithium, and the alumina may be coated with silica. However, these composites exhibit variations in properties, or the coatings can degrade the filler, or the matrix contains lithium which can affect the matrix properties.

U.S. Pat. No. 4,232,091 to R. W. Grimshaw et al., overcomes certain difficulties in the art which are encountered in the product of aluminum matrix-alumina composites. This patent describes applying pressures of 75-375 kg/cm$^2$ to force molten aluminum (or molten aluminum alloy) into a fibrous or whisker mat of alumina which has been preheated to 700° to 1050° C. The maximum volume ratio of alumina to metal in the resulting solid casting was 0.25/1. Because of its dependency on outside force to accomplish infiltration, this process is subject to many of the same deficiencies as that of Cannell et al.

European Patent Application Publication No. 115,742 describes making aluminum-alumina composites, especially useful as electrolytic cell components, by filling the voids of a preformed alumina matrix with molten aluminum. The application emphasizes the non-wettability of alumina by aluminum, and therefore various techniques are employed to wet the alumina throughout the preform. For example, the alumina is coated with a wetting agent of a diboride of titanium, zirconium, hafnium, or niobium, or with a metal, i.e., lithium, magnesium, calcium, titanium, chromium, iron, cobalt, nickel, zirconium, or hafnium. Inert atmospheres, such as argon, are employed to facilitate wetting. This reference also shows applying pressure to cause molten aluminum to penetrate an uncoated matrix. In this aspect, infiltration is accomplished by evacuating the pores and then applying pressure to the molten aluminum in an inert atmosphere, e.g., argon. Alternatively, the preform can be infiltrated by vapor-phase aluminum deposition to set the surface prior to filling the voids by infiltration with molten aluminum. To assure retention of the aluminum in the pores of the preform, heat treatment, e..g, at 1400° to 1800° C., in either a vacuum or in argon is required. Otherwise, either exposure of the pressure infiltrated material to gas or removal of the infiltration pressure will cause loss of aluminum from the body.

The use of wetting agents to effect infiltration of an alumina component in an electrolytic cell with molten metal is also shown in European Patent Application Publication No. 94353. This publication describes production of aluminum by electrowinning with a cell having a cathodic current feeder as a cell liner or substrate. In order to protect this substrate from molten cryolite, a thin coating of a mixture of a wetting agent and solubility suppressor is applied to the alumina substrate prior to start-up of the cell or while immersed in the molten aluminum produced by the electrolytic process. Wetting agents disclosed are titanium, zirconium, hafnium, silicon, magnesium, vanadium, chromium, niobium, or calcium, and titanium is stated as the preferred agent. Compounds of boron, carbon and nitrogen are described as being useful in suppressing the solubility of the wetting agents in molten aluminum. The reference, however, does not suggest the production of metal matrix composites, nor does it suggest the formation of such a composite in, for example, a nitrogen atmosphere.

In addition to application of pressure and wetting agents, it has been disclosed that an applied vacuum will aid in the penetration of molten aluminum into a porous ceramic compact. For example, U.S. Pat. No. 3,718,441, granted Feb. 27, 1973, to R. L. Landingham, reports infiltration of a ceramic compact (e.g., boron carbide, alumina and beryllia) with either molten aluminum, beryllium, magnesium, titanium, vanadium, nickel or chromium under a vacuum of less than $10^{-6}$ torr. A vacuum of $10^{-2}$ to $10^{-6}$ torr resulted in poor wetting of the ceramic by the molten metal to the extent that the metal did not flow freely into the ceramic void spaces. However, wetting was said to have improved when the vacuum was reduced to less than $10^{-6}$ torr.

U.S. Pat. No. 3,864,154, granted Feb. 4, 1975, to G. E. Gazza et al., also shows the use of vacuum to achieve infiltration. This patent describes loading a cold-pressed compact of AlB$_{12}$ powder onto a bed to cold-pressed aluminum powder. Additional aluminum was then positioned on top of the AlB$_{12}$ powder compact. The crucible, loaded with the AlB$_{12}$ compact "sandwiched" between the layers of aluminum powder, was placed in a vacuum furnace. The furnace was evacuated to approximately $10^{-5}$ torr to permit outgassing. The temperature was subsequently raised to 1100° C. and maintained for a period of 3 hours. At these conditions, the molten aluminum penetrated the porous AlB$_{12}$ compact.

U.S. Pat. No. 3,364,976, granted Jan. 23, 1986, to John N. Reding et al., disclosed the concept of creating a self-generated vacuum in a body to enhance penetration of a molten metal into the body. Specifically, it is disclosed that a body, e.g., a graphite mold, a steel mold, or a porous refractory material, is entirely submerged in a molten metal. In the case of a mold, the mold cavity, which is filled with a gas reactive with the metal, communicates with the externally located molten metal through at least one orifice in the mold. When the mold is immersed into the melt, filling of the cavity occurs as the self-generated vacuum is produced from the reaction between the gas in the cavity and the molten metal. Particularly, the vacuum is a result of the formation of a solid oxidized form of the metal. Thus, Reding et al. disclose that it is essential to induce a reaction between gas in the cavity and the molten metal. However, utilizing a mold to create a vacuum may be undesirable because of the inherent limitations associated with the use of a mold. Molds must first be machined into a particular shape; then finished, machined to produce an acceptable casting surface on the mold; then assembled prior to their use; then disassembled after their use to remove the cast piece therefrom; and thereafter reclaim the mold, which most likely would include refinishing surfaces of the mold or discarding the mold if it is no longer acceptable for use. Machining of a mold into a complex shape can be very costly and time-consuming. Moreover, removal of a formed piece from a complex-shaped mold can also be difficult (i.e., cast pieces having a complex shape could be broken when removed from the mold). Still further, while there is a suggestion that a porous refractory material can be immersed directly in a molten metal without the need for a mold, the refractory material would have to be an integral piece because there is no provision for infiltrating a loose or separated porous material absent the use of a container mold (i.e., it is generally believed that the particulate material would typically disassociated or float apart when placed in a molten metal). Still further, if it was desired to infiltrate a particulate material or loosely formed preform, precautions should be taken so that the infiltrating metal does not displace at least portions of the particulate or preform resulting in a non-homogeneous microstructure.

Accordingly, there has been a long felt need for a simple and reliable process to produce shaped metal matrix composites which does not rely upon the use of applied pressure or vacuum (whether externally applied or internally created), or damaging wetting agents to create a metal matrix embedding another material such as a ceramic material. Moreover, there has been a long felt need to minimize the amount of final machining operations needed to produce a metal matrix composite body. The present invention satisfies these needs by providing a spontaneous infiltration mechanism for infiltrating a material (e.g., a ceramic material), which can be formed into a preform and/or supplied with a barrier, with molten matrix metal (e.g., aluminum) in the presence of an infiltrating atmosphere (e.g., nitrogen) under normal atmospheric pressures so long as an infiltration enhancer is present at least at some point during the process.

Still further, there has been long felt need in the electronic packages container art to provide a desirable container or package within which an electronic chip can be mounted and hermetically sealed.

Historically, electronic chips have been made of ceramic materials such as alumina and, more recently, materials such as gallium arsenide. Thus, some of the requirements for the package or container are that thermal expansion coefficients of the container should approach those of the ceramic chip; the package or container should be capable of dissipating any heat generated by the ceramic chip; the package or container should be readily fixable (e.g., weldable or solderable) to a lid for hermetically sealing the ceramic chip inside of the package or container; and the package or container should preferably be relatively inexpensive to manufacture into desirable shapes. Moreover, in many cases it is necessary for electrical leads to be connected with, for example, the ceramic chip within the package or container. Thus, some means for insulating the electrical leads from the package or container may also be required. Moreover, the electrical leads may need to be hermetically sealed within the container to prevent exposure of the contents of the package or container to the external environment.

Still further, in some cases it may be desirable to provide a coating or series of coatings (e.g., by electroplating, chemical vapor deposition, etc.) onto at least a portion, or substantially all, of a surface of the formed package. Such a coating or layer may: facilitate bonding of electrical leads directly to the electronic package; create a protective layer on the electronic package to enhance the corrosion resistance, erosion resistance, etc., of the package; and/or may function as an electric ground for the electronic chip, etc. Examples of coating materials are Au, Zn, Ni, etc. and mixtures thereof. Thus, a means for coating the surface of the package or container required. The art is replete with attempts to satisfy each of the needs discussed above, however, to date, the art has not satisfactorily solved all of the above problems.

DESCRIPTION OF COMMONLY OWNED U.S. PATENT APPLICATIONS

The subject matter of this application is related to that of several other copending and co-owned patent applications. Particularly, these other copending patent applications describe novel methods for making metal matrix composite materials (hereinafter sometimes referred to as "Commonly Owned Metal Matrix Patent Applications").

A novel method of making a metal matrix composite material is disclosed in Commonly Owned U.S. Pat. No. 4,828,008, issued May 8, 1989, from U.S. patent application Ser. No. 049,171, filed May 13, 1987, in the names of White et al., and entitled "Metal Matrix Composites", now allowed in the United States. According to the method of White et al. invention, a metal matrix composite is produced by infiltrating a permeable mass of filler material (e.g., a ceramic or a ceramic-coated material) with molten aluminum containing at least about 1 percent by weight magnesium, and preferably at least about 3 percent by weight magnesium. Infiltration occurs spontaneously without the application of external pressure or vacuum. A supply of the molten metal alloy is contacted with the mass of filler material at a temperature of at least about 675° C. in the presence of a gas comprising from about 10 to 100 percent, and preferably at least about 50 percent, nitrogen by volume, and a remainder of the gas, if any, being a nonoxidizing gas, e.g., argon. Under these conditions, the molten aluminum alloy infiltrates the ceramic mass under normal atmospheric pressures to form an aluminum (or aluminum alloy) matrix composite. When the desired amount of filler material has been infiltrated with the molten aluminum alloy, the temperature is lowered to solidify the alloy, thereby forming a solid metal matrix structure that embeds the reinforcing filler material. Usually, and preferably, the supply of molten alloy delivered will be sufficient to permit the infiltration to proceed essentially to the boundaries of the mass of filler material. The amount of filler material in the aluminum matrix composites produced according to the White et al. invention may be exceedingly high. In this respect, filler to alloy volumetric ratios of greater than 1:1 may be achieved.

Under the process conditions in the aforesaid White et al. invention, aluminum nitride can form as a discontinuous phase dispersed throughout the aluminum matrix. The amount of nitride in the aluminum matrix may vary depending on such factors as temperature, alloy composition, gas composition and filler material. Thus, by controlling one or more such factors in the system, it is possible to tailor certain properties of the composite. For some end use applications, however, it may be desirable that the composite contain little or substantially no aluminum nitride.

It has been observed that higher temperature favor infiltration but render the process more conducive to nitride formation. The White et al. invention allows the choice of a balance between infiltration kinetics and nitride formation.

An example of suitable barrier means for use with metal matrix composite formation is described in Commonly Owned U.S. Pat. No. 4,935,055, issued Jun. 19, 1990, from U.S. patent application Ser. No. 141,642, filed Jan. 7, 1988, in the names of Michael K. Aghajanian et al., and entitled "Method of Making Metal Matrix Composite with the use of a Barrier". According to the method of this Aghajanian et al. invention a barrier means (e.g., particulate titanium diboride or a graphite material such as a flexible graphite tape product sold by Union Carbide under the trade name Grafoil ®) is disposed on a defined surface boundary of a filler material and matrix alloy infiltrates up to the boundary defined by the barrier means. The barrier means is used to inhibit, prevent, or terminate infiltration of the molten alloy, thereby providing net, or near net, shapes in the resultant metal matrix composite. Accordingly, the formed metal matrix composite bodies have an outer shape which substantially corresponds to the inner shape of the barrier means.

The method of U.S. Pat. No. 4,828,008 was improved upon by Commonly Owned, and Copending U.S. patent application Ser. No. 168,284 (now abandoned), filed Mar. 15, 1988, in the names of Michael K. Aghajanian and Marc S. Newkirk and entitled "Metal Matrix Composites and Techniques for Making the Same." In accordance with the methods disclosed in this U.S. Patent Application, a matrix metal alloy is present as a first source of metal and as a reservoir of matrix metal alloy which communicates with the first source of molten metal due to, for example, gravity flow. Particularly, under the conditions described in this patent application, the first source of molten matrix alloy begins to infiltrate the mass of filter material under normal atmospheric pressures and thus begins the formation of a metal matrix composite. The first source of molten matrix metal alloy is consumed during its infiltration into the mass of filter material and, if desired, can be replenished, preferably by a continuous means, from the reservoir of molten matrix metal as the spontaneous infiltration continues. When a desired amount of permeable filler has been spontaneously infiltrated by the molten matrix alloy, the temperature is lowered to solidify the alloy, thereby forming a solid metal matrix structure that embeds the reinforcing filler material. It should be understood that the use of a reservoir of metal is simply one embodiment of the invention described in this patent application and it is not necessary to combine the reservoir embodiment with each of the alternate embodiments of the invention disclosed therein, some of which could also be beneficial to use in combination with the present invention.

The reservoir of metal can be present in an amount such that it provides for a sufficient amount of metal to infiltrate the permeable mass of filler material to a predetermined extent. Alternatively, an optional barrier means can contact the permeable mass of filler on at least one side thereof to define a surface boundary.

Moreover, while the supply of molten matrix alloy delivered should be at least sufficient to permit spontaneous infiltration to proceed essentially to the boundaries (e.g., barriers) of the permeable mass of filler material, the amount of alloy present in the reservoir could exceed such sufficient amount so that not only will there be a sufficient amount of alloy for complete infiltration, but excess molten metal alloy could remain and be attached to the metal matrix composite body. Thus, when excess molten alloy is present, the resulting body will be a complex composite body (e.g., a macrocomposite), wherein an infiltrated ceramic body having a metal matrix therein will be directly bonded to excess metal remaining in the reservoir.

Each of the above-discussed Commonly Owned Metal Matrix Patent Applications describes methods for the production of metal matrix composite bodies and novel metal matrix composite bodies which are produced therefrom. The entire disclosures of all of the foregoing Commonly Owned Metal Matrix Patent Applications are expressed incorporated herein by reference.

SUMMARY OF THE INVENTION

A complex composite body is produced by first forming a metal matrix composite body which is contacted with and bonded to a second material. A metal matrix composite body is produced by spontaneously infiltrating a permeable mass of filler material or a preform with molten matrix metal. Specifically, an infiltration enhancer and/or infiltration enhancer precursor and/or an infiltrating atmosphere are in communication with the filler material or preform, at least at some point during the process, which permits molten matrix metal to spontaneously infiltrate the filler material or preform.

In a preferred embodiment of the invention, an infiltration enhancer may be supplied directly to at least one of the preform (or filler material) and/or matrix metal, and/or infiltrating atmosphere. Ultimately, at least during spontaneous infiltration, the infiltration enhancer should be located in at least a portion of the filler material or preform.

In a first preferred embodiment for forming a macrocomposite body, the quantity or amount of matrix metal supplied to spontaneously infiltrate the filler material or preform is provided in excess of that which is needed to achieve complete infiltration of the permeable material. Thus, residual or excess matrix metal (e.g., that matrix metal which was not utilized to infiltrate the filler material or preform) remains in contact with the infiltrated mass and becomes intimately bonded to the infiltrated mass. The amount, size, shape, and/or composition of the residual matrix metal can be controlled to produce a virtually limitless number of combinations. Moreover, the relative size of metal matrix composite to residual matrix metal can be controlled from one extreme of forming a metal matrix composite skin on a surface of residual matrix metal (e.g., only a small amount of spontaneous infiltration occurred) to another extreme of forming residual matrix metal as a skin on a surface of a metal matrix composite (e.g., only a small amount of excess matrix metal was provided).

In a second preferred embodiment, a filler material or preform is placed into contact with at least a portion of another or second body (e.g., a ceramic body or a metal body) and molten matrix metal spontaneously infiltrates the filler material or preform at least up to a surface of the second body causing the metal matrix composite to become intimately bonded to the second body. The bonding of the metal matrix composite to the second body may be due to the matrix metal and/or the filler material or preform reacting with the second body. For example, the aforementioned another or second body could comprise a metal which is similar (or different) in composition to the matrix metal, thereby facilitating a bond between the formed metal matrix composite and the second body. This technology could be successfully applied to the electronic packages art wherein it is required for a ceramic chip to be hermetically sealed within a box or container. Specifically, the box or container can be formed spontaneously infiltrating a filler material or preform having a desired configuration, a portion of which (e.g., the portion which is to be bonded to a lid) is in contact with the second body, said second body comprising a weldable or solderable material (e.g., a metal). Thus, the resulting macrocomposite body comprises a metal matrix composite box or container intimately bonded to a metal lip which is, for example, weldable or solderable to an electronic package cover or lid.

Moreover, if the second body at least partially surrounds or substantially completely surrounds, or is surrounded by, the formed metal matrix composite, a shrink or compression fit may occur. Such shrink fit may be the only means of bonding the metal matrix composite to the second body or it may exist in combination with another bonding mechanism between the metal matrix composite or second body. Moreover, the amount of shrink fit can be controlled by selecting appropriate combinations of matrix metals, filler materials or preforms and/or second bodies to obtain a desirable match or selection of thermal expansion coefficients. Thus, for example, a metal matrix composite could be produced such that it has a higher coefficient of thermal expansion than a second body and the metal matrix composite surrounds, at least partially, a second body. In this example, the metal matrix composite would be bonded to the second body by at least a shrink fit. Thus, a wide spectrum of macrocomposite bodies can be formed comprising a metal matrix composite bonded to a second body such as another ceramic or metal. For example, in the electronic packages art, the second body could comprise an electrically insulating sheath (or sheaths) which is disposed within at least one wall portion (e.g., serves as an insulating conduit through a wall) of a metal matrix composite package or container. The electrically insulating sheath or conduit may be substantially completely nonreactive or the sheath may be at least partially chemically reactive with the metal matrix composite during formation thereof (e.g., reactive with molten matrix metal). Electrical lead wires may be contained within the insulating sheath and may be attached to, for example, a ceramic chip within the electronic package. This arrangement provides for electrical connection between the ceramic chip within a hermetically sealable package and an external electronic circuit. Further, as discussed above, the thermal expansion coefficients of the metal matrix composite package and the electrically insulating sheath may be chosen to provide for at least a compression or shrink fit of the metal matrix composite with the electrically insulating sheath (e.g., the thermal expansion coefficient of the metal matrix composite body may be greater than the thermal expansion coefficient of the electrical insulating sheath). Thus, the present invention provides a method for hermetically bonding, in situ (i.e., during formation of the metal matrix composite electronic package), at least one insulating sheath or conduit within at least one wall of an electronic package or container. The bonding may occur due to: (1) a mechanical bond (e.g., a shrink or compression fit) between the metal matrix composite and the insulating sheath; (2) a physical bond (e.g., a wetting of the insulating sheath by the matrix metal during formation of the metal matrix composite body) between the metal matrix composite and the insulating sheath; (3) a chemical reaction between the metal matrix composite body and the insulating sheath (e.g., a reaction between molten matrix metal and the insulating sheath); and (4) some combination of the three aforementioned phenomena.

In a further preferred embodiment, excess or residual matrix metal is supplied to the above-discussed second preferred embodiment (e.g., the combination of metal matrix composite and second body). In this embodiment, similar to the first preferred embodiment discussed above herein, the quantity or amount of matrix metal supplied to spontaneously infiltrate the filler material or preform is provided in excess of that which is needed to achieve complete infiltration of the permeable material. Moreover, similar to the second preferred embodiment discussed above herein, a filler material or preform is placed into contact with at least a portion of another or second body (e.g., a ceramic body or metal body) and molten matrix metal spontaneously infiltrates the filler material or preform at least up to a surface of the second body causing the metal matrix composite to become intimately bonded to the second body. Thus, an even more complex macrocomposite body can be achieved than the macrocomposite discussed in the first two preferred embodiments. Specifically, by being able to select and combine a metal matrix composite with both a second body (e.g., a ceramic and/or a metal) and with excess or residual matrix metal, a virtually limitless number of permutations or combinations can be achieved. For example, if it was desired to produce a macrocomposite shaft or rod, an interior portion of the shaft could be a second body (e.g., a ceramic or a metal). The second body could be at least partially surrounded by a metal matrix composite. The metal matrix composite could then be at least partially surrounded by a second body or residual matrix metal. If the metal matrix composite was surrounded by residual matrix metal, another metal matrix composite could at least partially surround the residual matrix metal (e.g., the residual matrix metal could be supplied in a sufficient quantity such that it infiltrates both inward toward a filler material (or preform) which contacts an interior portion of a matrix metal and outward toward a filler material (or preform) which contacts an exterior portion of the matrix metal). Accordingly, significantly engineering opportunities are provided by this third embodiment of the invention.

In a further preferred embodiment, a macrocomposite body may be formed by coating at least a portion, or substantially all, of a surface of a formed metal matrix composite body. The coating may bond with at least a portion of the metal matrix composite (e.g., a bond may form between metal and/or filler material contained in the metal matrix composite and the coating). A coating may be created by a number of traditional or conventional means including chemical, physical and/or mechanical means. More specifically, the coating may be provided by such methods as electroplating, electroless deposition, chemical vapor deposition, physical vapor deposition, sputtering, etc. The coating material may comprise, for example, a metal (e.g., Au, Ni, Zn), an organic metal (e.g., an epoxy or resin) or any other material(s) which impart(s) desired properties to the macrocomposite. With respect to the electronic packaging art, a coating or coatings may be provided on at least a portion of the surface of the metal matrix composite body to facilitate bonding of electrical leads directly to the electronic package; create a protective layer on the electronic package to enhance the corrosion resistance, erosion resistance, etc., of the packages; and/or may function as an electric ground for the electronic chip, etc. Examples of coating materials are Au, Zn, Ni, epoxy, resin, etc., and mixtures thereof.

In a further preferred embodiment, it may be desirable for the formed metal matrix composite and/or the macrocomposite body to be machinable. For example, even though a metal matrix composite and/or macrocomposite body can be formed to net or near net shape, it may be desirable for at least a portion of the formed body to be machinable by conventional techniques. Specifically, it may be possible to machine, such as by, e.g., drilling, grinding, thermoforming, etc., the formed body to meet a desired need. With respect to the electronic packaging art, at least a portion of a metal matrix composite or macrocomposite body may be tailored by, e.g., drilling or thermoforming, to tailor the body to a specific application.

In each of the above-discussed preferred embodiments, a metal matrix composite body may be formed as either an exterior or interior surface, or both, on a substrate of matrix metal. Moreover, the metal matrix composite surface may be of a selected or predetermined thickness with respect to the size of the matrix metal substrate. The spontaneous infiltration techniques of the present invention enable the preparation of thick wall or thin wall metal matrix composite structures in which the relative volume of matrix metal providing the metal matrix composite surface is substantially greater than or less than the volume of metal substrate. Still further, the metal matrix composite body which may be either an exterior or interior surface or both, may be also bonded to a second material such as a ceramic or metal, thereby providing for a significant number of combinations of bonding between metal matrix composite, and/or excess matrix metal and/or a second body such as a ceramic or metal body.

In regard to the formation of the metal matrix composite body, it is noted that this application discusses primarily aluminum matrix metals which, at some point during the formation of the metal matrix composite body, are contacted with magnesium, which functions as the infiltration enhancer precursor, in the presence of nitrogen, which functions as the infiltrating atmosphere. Thus, the matrix metal/infiltration enhancer precursor/infiltrating atmosphere system of aluminum/magnesium/nitrogen exhibits spontaneous infiltration. However, other matrix metal/infiltration enhancer precursor/infiltrating atmosphere systems may also behave in a manner similar to the system aluminum/magnesium/nitrogen. For example, similar spontaneous infiltration behavior has been observed in the aluminum/strontium/nitrogen system; the aluminum/zinc/oxygen system; and the aluminum/calcium/nitrogen system. Accordingly, even though the aluminum/magnesium/nitrogen system is discussed primarily herein, it should be understood that other matrix metal/infiltration enhancer precursor/infiltrating atmosphere systems may behave in a similar manner.

When the matrix metal comprises an aluminum alloy, the aluminum alloy is contacted with a preform comprising a filler material (e.g., alumina or silicon carbide) or a filler material, said filler material or preform having admixed therewith, and/or at some point during the process being exposed to, magnesium. Moreover, in a preferred embodiment, the aluminum alloy and/or preform or filler material are contained in a nitrogen atmosphere for at least a portion of the process. The preform will be spontaneously infiltrated and the extent or rate of spontaneous infiltration and formation of metal matrix composite will vary with a given set of process conditions including, for example, the concentration of magnesium provided to the system (e.g., in the aluminum alloy and/or in the filler material or preform and-/or in the infiltrating atmosphere), the size and/or composition of the particles int eh preform or filler material, the concentration of nitrogen in the infiltrating atmosphere, the time permitted for infiltration, and/or the temperature at which infiltration occurs. Spontaneous infiltration typically occurs to an extent sufficient to embed substantially completely the preform or filler material.

Definitions

"Aluminum", as used herein, means and includes essentially pure metal (e.g., a relatively pure, commercially available unalloyed aluminum) or other grades of metal and metal alloys such as the commercially available metals having impurities and/or alloying constituents such as iron, silicon, copper, magnesium, manganese, chromium, zinc, etc., therein. Al aluminum alloy for purposes of this definition is an alloy or intermetallic compound in which aluminum is the major constituent.

"Balance Non-Oxidizing Gas", as used herein, means that any gas present in addition to the primary gas comprising the infiltrating atmosphere, is either an inert gas or a reducing gas which is substantially non-reactive with the matrix metal under the process conditions. Any oxidizing gas which may be present as an impurity in the gas(es) used should be insufficient to oxidize the matrix metal to any substantial extent under the process conditions.

"Barrier" or "barrier means", as used herein, means any suitable means which interferes, inhibits, prevents or terminates the migration, movement, or the like, of molten matrix metal beyond a surface boundary of a permeable mass of filler material or preform, where such surface boundary is defined by said barrier means. Suitable barrier means may be any such material, compound, element, composition, or the like, which, under the process conditions, maintains some integrity and is not substantially volatile (i.e., the barrier material does not volatilize to such an extent that is rendered non-functional as a barrier).

Further, suitable "barrier means" includes materials which are substantially non-wettable by the migrating molten matrix metal under the process conditions employed. A barrier of this type appears to exhibit substantially little or no affinity for the molten matrix metal, and movement beyond the defined surface boundary of the mass of filler material or preform is prevented or inhibited by the barrier means. The barrier reduces any final machining or grinding that may be required and defines at least a portion of the surface of the resulting metal matrix composite product. The barrier may in certain cases be permeable or porous, or rendered permeable by, for example, drilling holes or puncturing the barrier, to permit gas to contact the molten matrix metal.

"Carcass" or "Carcass of Matrix Metal", as used herein, refers to any of the original body of matrix metal remaining which has not been consumed during formation of the metal matrix composite body, and typically, if allowed to cool, remains in at least partial contact with the metal matrix composite body which has been formed. It should be understood that the carcass may also include a second or foreign metal therein.

"Ceramic Chip" or "Electronic Chip", as used herein means electronic resistors, semiconductors, transistors, diodes or other semiconducting devices, integrated electronic devices, etc., that may perform a plurality of functions. The composition of such bodies may include:

metals (e.g., aluminum, nickel, etc.), alloys (e.g., steel, inconel, bronze, etc.), polymers (polypropylene, polyethylene, polymethyl methacrylate, etc.), ceramics (e.g., oxide, borides, nitrides, etc.), semiconducting compounds (e.g., copper oxide, cadmium selenide, etc.), semiconducting crystals (e.g., silicon, germanium, etc.), or amorphous semiconductors (e.g., hydrogenated amorphous silicon, etc.) and combinations thereof. Such bodies may be capable of being bonded (e.g., by an organic or inorganic means) to one or more surfaces of a metal matrix composite and/or macrocomposite body.

"Excess Matrix Metal" or "Residual Matrix Metal", as used herein, means that quantity or amount of matrix metal which remains after a desired amount of spontaneous infiltration into a filler material or preform has been achieved and which is intimately bonded to the formed metal matrix composite. The excess of residual matrix metal may have a composition which is the same as or different from the matrix metal which has spontaneously infiltrated the filler material or preform.

"Filler", as used herein, is intended to include either single constituents or mixtures of constituents which are substantially non-reactive with and/or of limited solubility in the matrix metal and may be single or multiphase. Fillers may be provided in a wide variety of forms, such as powders, flakes, platelets, microspheres, whiskers, bubbles, etc., and may be either dense or porous. "Filler" may also include ceramic fillers, such as alumina or silicon carbide as fibers, chopped fibers, particulates, whiskers, bubbles, spheres, fiber mats, or the like, and ceramic-coated fillers such as carbon fibers coated with alumina or silicon carbide to protect the carbon from attack, for example, by a molten aluminum matrix metal. Fillers may also include metals.

"Infiltrating Atmosphere", as used herein, means that atmosphere which is present which interacts with the matrix metal and/or preform (or filler material) and/or infiltration enhancer precursor and/or infiltration enhancer and permits or enhances spontaneous infiltration of the matrix metal to occur.

"Infiltration Enhancer", as used herein, means a material which promotes or assists in the spontaneous infiltration of a matrix metal into a filler material or preform. An infiltration enhancer may be formed from, for example, a reaction of an infiltration enhancer precursor with an infiltrating atmosphere to form (1) a gaseous species and/or (2) a reaction product of the infiltration enhancer precursor and the infiltrating atmosphere and/or (3) a reaction product of the infiltration enhancer precursor and the filler material or preform. Moreover, the infiltration enhancer may be supplied directly to at least one of the preform, and/or matrix metal, and/or infiltrating atmosphere and function in a substantially similar manner to an infiltration enhancer which has formed as a reaction between an infiltration enhancer which has formed a reaction between an infiltration enhancer precursor and another species. Ultimately, at least during the spontaneous infiltration, the infiltration enhancer should be located in at least a portion of the filler material or preform to achieve spontaneous infiltration.

"Infiltration Enhancer Precursor" or "Precursor to the Infiltration Enhancer", as used herein, means a material which when used in combination with the matrix metal, preform and/or infiltrating atmosphere forms an infiltration enhancer which induces or assist the matrix metal to spontaneously infiltrate the filler material or preform. Without wishing to be bound by any particular theory or explanation, it appears as through it may be necessary for the precursor to the infiltration enhancer to be capable of being positioned, located or transportable to a location which permits the infiltration enhancer precursor to interact with the infiltrating atmosphere and/or the preform or filler material and/or matrix metal. For example, in some matrix metal/infiltration enhancer precursor/infiltrating atmosphere systems, it is desirable for the infiltration enhancer precursor to volatilize at, near, or in some cases, even somewhat above the temperature at which the matrix metal becomes molten. Such volatilization may lead to: (1) a reaction of the infiltration enhancer precursor with the infiltrating atmosphere to form a gaseous species which enhances wetting of the filler material or preform by the matrix metal; and/or (2) a reaction of the infiltration enhancer precursor with the infiltrating atmosphere to form a solid, liquid or gaseous infiltration enhancer in at least a portion of the filler material or preform which enhances wetting; and/or (3) a reaction of the infiltration enhancer precursor within the filler material or preform which forms a solid, liquid or gaseous infiltration enhancer in at least a portion of the filler material or preform which enhances wetting.

"Macrocomposite", as used herein, means any combination of two or more materials in any configuration which are intimately bonded together by, for example, a chemical reaction and/or a pressure or shrink fit, wherein at least one of the materials comprises a metal matrix composite formed by the spontaneous infiltration of molten matrix metal into a permeable mass of filler material, a preform, or a finished ceramic or metal body containing at least some porosity. The metal matrix composite may be present as an exterior surface and/or as an interior surface. It should be understood that the order, number, and/or location of a metal matrix composite body or bodies relative to residual matrix metal and/or second bodies can be manipulated or controlled in an unlimited fashion.

"Matrix Metal" or "Matrix Metal Alloy", as used herein means that metal which is utilized to form a metal matrix composite (e.g., before infiltration) and/or that metal which is intermingled with a filler material to form a metal matrix composite body (e.g., after infiltration). When a specified metal is mentioned as the matrix metal, it should be understood that such matrix metal includes that metal as an essentially pure metal, a commercially available metal having impurities and/or alloying constituents therein, an intermetallic compound or an alloy in which that metal is the major or predominant constituent.

"Matrix Metal/Infiltration Enhancer Precursor/Infiltrating Atmosphere System" or "Spontaneous System", as used herein, refers to that combination of materials which exhibits spontaneous infiltration into a preform or filler material. It should be understood that whenever a "/" appears between an exemplary matrix metal, infiltration enhancer precursor and infiltrating atmosphere that, the "/" is used to designate a system or combination of materials which, when combined in a particular manner, exhibits spontaneous infiltration into a preform or filler material.

"Metal Matrix Composite" or "MMC", as used herein, means a material comprising a two- or three-dimensionally interconnected alloy or matrix metal which has embedded a preform or filler material. The matrix metal may include various alloying elements to provide specifically desired mechanical and physical properties in the resulting composite.

A Metal "Different" from the Matrix Metal means a metal which does not contain, as a primary constituent, the same metal as the matrix metal (e.g., if the primary constituent of the matrix metal is aluminum, the "different" metal could have a primary constituent of, for example, nickel).

"Nonreactive Vessel for Housing Matrix Metal" means any vessel which can house or contain molten metal matrix metal under the process conditions and not react with the matrix and/or the infiltration atmosphere and/or infiltration enhancer precursor and/or of filler material or preform in a manner which would be significantly detrimental to the spontaneous infiltration mechanism. "Preform" or "Permeable Preform", as used herein, means a porous mass of filler or filler material which is finished (i.e., fully sintered or formed ceramic and metal bodies) with at least one surface boundary which essentially defines a boundary for infiltration matrix metal, such mass retaining sufficient shape integrity and green strength to provide dimensional fidelity prior to being infiltrated by the matrix metal. The mass should be sufficiently porous to accommodate spontaneous infiltration of the matrix metal thereinto. A preform typically comprises a bonded array or arrangement of filler, either homogeneous or heterogeneous, and may be comprised of any suitable material (e.g., ceramic and/or metal particulates, powders, fibers, whiskers, etc., and any combination thereof). A preform may exist either singularly or as an assemblage.

"Reservoir", as used herein, means a separate body of matrix metal positioned relative to a mass of filler or a preform so that, when the metal is molten, it may flow to replenish, or in some cases to initially provide and subsequently replenish, that portion, segment or source of matrix metal which is in contact with the filler or preform.

"Second Body" or "Additional Body", as used herein, means another body which is capable of being bonded to a metal matrix composite body by at least one of a chemical reaction and/or a mechanical or shrink fit. Such a body includes traditional ceramics such as sintered ceramics, hot pressed ceramics, extruded ceramics, etc., and also, non-traditional ceramic and ceramic composite bodies such as those produced by the methods described in Commonly Owned U.S. Pat. No. 4,713,360, which issued on Dec. 15, 1987, in the names of Marc S. Newkirk et al.; Commonly Owned U.S. patent application No. 819,397, filed Jan. 17, 1986 in the names of Marc S. Newkirk et al. and entitled "Composite Ceramic Articles and Methods of Making Same", now allowed; Commonly Owned and Copending U.S. patent application Ser. No. 861,025, filed May 8, 1986 in the names of Marc S. Newkirk et al. and entitled "Shaped Ceramic Composites and Methods of Making the Same"; Commonly Owned U.S patent application No. 152,518 filed on Feb. 5, 1988 in the names of Robert C. Kantner et al. and entitled "Method For In Situ Tailoring the Metallic Component of Ceramic Articles and Articles Made Thereby", now allowed; Commonly Owned and Copending U.S. application Ser. No. 137,044, filed Dec. 23, 1987 in the names of T. Dennis Clarr et al. and entitled "Process for Preparing Self-Supporting Bodies and Products Made Thereby"; and variations and improvements on these processes contained in other Commonly Owned Allowed and Copending U.S. Applications. For the purpose of teaching the method of production and characteristics of the ceramic and ceramic composite bodies disclosed and claimed in these commonly owned applications, the entire disclosures of the above-mentioned applications are hereby incorporated by reference. Moreover, the second or additional body of the instant invention also includes metal matrix composites and structural bodies of metal such as high temperature metals, corrosion resistant metals, erosion resistant metals, weldable metals, solderable metals, etc. Accordingly, a second or additional body includes a virtually unlimited number of bodies.

"Spontaneous Infiltration", as used herein, means that the infiltration of matrix metal into the permeable mass of filler or preform occurs without requirement for the application of pressure or vacuum (whether externally applied or internally created).

BRIEF DESCRIPTION OF THE FIGURES

The following Figures are provided to assist in understanding the invention, but are not intended to limit the scope of the invention. Similar reference numerals have been used wherever possible in each of the Figures to denote like components, wherein:

FIG. 9 is a photograph displaying a cross-section of the macrocomposite produced in Example 4.

FIG. 11 is a photomicrograph of a cross-section of the macrocomposite formed in Example 5.

FIG. 13 is a photograph of a cross-section of the macrocomposite formed in Example 6.

DETAILED DESCRIPTION OF THE INVENTION AND PREFERRED EMBODIMENTS

Figure 1:
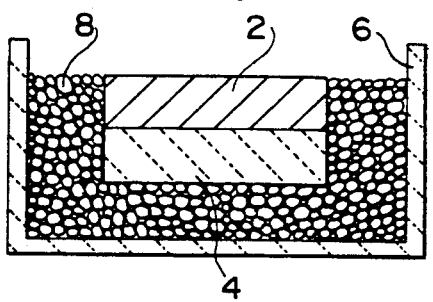
FIG. 1 is a cross-sectional view of the setup utilized to create the macrocomposite produced in Example 1.

The present invention relates to forming a macrocomposite body, a portion of which comprises a metal matrix composite body which has been formed by spontaneously infiltrating a filler material or preform with molten matrix metal.

A complex composite body according to the invention is produced by forming a metal matrix composite in contact with at least one second or additional body. Specifically, a metal matrix composite body is produced by spontaneously infiltrating a permeable mass of filler material or a preform with molten matrix metal. Specifically, an infiltration enhancer and/or infiltration enhancer precursor and/or an infiltrating atmosphere are in communication with the filler material or preform, at least at some point during the process, which permits molten matrix metal to spontaneously infiltrate the filler material or preform.

In a preferred embodiment of the invention, an infiltration enhancer may be supplied directly to at least one of the preform (or filler material) and/or matrix metal, and/or infiltrating atmosphere. Ultimately, at least during the spontaneous infiltration, the infiltration enhancer should be located in at least a portion of the filler material or preform.

In a first preferred embodiment for forming a macrocomposite body, the amount of matrix metal supplied to infiltrate is in excess of that needed to infiltrate. In other words, matrix metal is provided in a quantity which is greater than that which is needed to infiltrate completely the filler material or preform such that residual or excess matrix metal (e.g., that matrix metal which was not utilized to infiltrate the filler material or preform) is intimately bonded to the filler material or preform which has been infiltrated.

In another preferred embodiment, a filler material or preform is placed into contact with another body such as a ceramic or metal (the metal having a composition which is similar to or different from the composition of the matrix metal, and, in a preferred embodiment, being solderable or weldable by conventional techniques), and molten matrix metal is induced to spontaneously infiltrate the filler material or preform up to the second body of, for example, ceramic or metal and becomes intimately bonded to the second body thus forming a macrocomposite comprising a metal matrix composite body bonded to a second body such as another ceramic or metal. For example, the aforementioned another or second body could comprise a metal which is similar (or different) in composition to the matrix metal, thereby facilitating a bond between the formed metal matrix composite and the second body. This technology could be successfully applied to the electronic packages art wherein it is required for a ceramic chip to be hermetically sealed within a box or container. Specifically, the box or container can be formed by spontaneously infiltrating a filler material or preform, a portion of which (e.g., the portion which is to be bonded to a lid) is in contact with the second body, said second body comprising a weldable or solderable material (e.g., a metal). Thus, the resulting macrocomposite body comprises a metal matrix composite body intimately bonded to a metal lip which is, for example, weldable or solderable to an electronic package cover or lid. Still further, the second body could comprise an electrically insulating sheath (or sheaths) which is disposed within at least one wall portion (e.g., serves as an insulating conduit through a wall) of a metal matrix composite package or container. The electrically insulating sheath or conduit may be substantially completely nonreactive or the sheath may be at least partially chemically reactive with the metal matrix composite during formation thereof (e.g., reactive with molten matrix metal). Electrical lead wires may be contained within the insulating sheath and may be attached to, for example, a ceramic chip within the electronic package. This arrangement provides for electrical connection between the ceramic chip within a hermetically sealable package and an external electronic circuit. Further, as discussed above, the thermal expansion coefficients of the metal matrix composite package and the electrically insulting sheath may be chosen to provide for at least a compression or shrink fit of the metal matrix composite with the electrically insulating sheath (e..g, the thermal expansion coefficient of the metal matrix composite body may be greater than the thermal expansion coefficient of the electrical insulating sheath). Thus, the present invention provides a method for hermetically bonding, in situ (i.e., during formation of the metal matrix composite electronic package), an insulating sheath or conduit within at least one wall of an electronic package or container. The bonding may occur due to: (1) a mechanical bond (e.g., a shrink or compression fit) between the metal matrix composite and the insulating sheath; (2) a physical bond (e.g., a wetting of the insulating sheath by the matrix metal during formation of the metal matrix composite body) between the metal matrix composite and the insulating sheath; (3) a chemical reaction between the metal matrix composite body and the insulating sheath (e.g., a reaction between molten matrix metal and the insulating sheath); and (4) some combination of the three aforementioned phenomena.

Still further, the above-discussed concepts of forming a weldable or solderable lip on a net or near-net shaped metal matrix composite box or container and forming an electrically insulating conduit which is integral with at least one wall of a metal matrix composite box or container, could be combined. The combination of these novel concepts results in a novel electronic package or container which has the capability of being hermetically sealed (i.e., isolating the contents of box or container from the external environment). Moreover, the spontaneous infiltration technique for forming the hermetically sealable box or container is a significant advancement in the art. Specifically, the ability to form a weldable lip which is integral with a metal matrix composite box and the ability to form an electrically insulating conduit, all in a single step during formation of the net or near-net shaped metal matrix composite box or container, has not heretofore been known in the art.

Further, it is possible for electrical wires or leads to be placed into the electrically insulating conduit prior to the metal matrix composite body being formed therearound. In this instance, the wires could be made of a material which, when heated to the temperature at which spontaneous infiltration occurs, would flow (e.g., be at least partially deformable) a sufficient amount so as to provide for a hermetic seal within at least a portion of the electrically insulating conduit. Alternatively, a second material in addition to the wire could be placed within the electrically insulating conduit. This second metal would be a material which, when heated to the temperature at which spontaneous infiltration occurs, flows, grows, etc., into any gap or space which exists between the wire and the electrically insulating conduit, thereby forming a hermetic seal within at least a portion of the electrically insulating conduit. Examples of such materials would be glasses, metals, polymers, etc. Moreover, such materials could be introduced into the electrically insulating conduit as, for example, a power mixture, a coating on the conduit wall or on the wire, etc.

In a further preferred embodiment, a filler material or preform is placed into contact with a second body such as another ceramic body or metal, and molten matrix metal is induced to spontaneously infiltrate the filler material or preform up to a contact point between the filler material or preform and the second body. The formed metal matrix composite body will be intimately bonded to the second body. Moreover, additional matrix metal can be supplied such that it is present in a quantity which is greater than that required to spontaneously infiltrate the filler material or preform. Accordingly, a macrocomposite body is formed comprising excess matrix metal which is intimately bonded to a metal matrix composite body which is intimately bonded to a second body such as a ceramic or ceramic composite body.

In a further preferred embodiment, a macrocomposite body may be formed by coating at least a portion, or substantially all, of a surface of a formed metal matrix composite body. The coating may bond with at least a portion of the metal matrix composite (e.g., a bond may form between metal and/or filler material contained in the metal matrix composite and the coating). A coating may be created by a number of traditional or conventional means including chemical, physical and/or mechanical means. More specifically, the coating may be provided by such methods as electroplating, electroless deposition, chemical vapor deposition, physical vapor deposition, sputtering, etc. The coating material may comprise, for example, a metal (e.g., Au, Ni, Zn), an organic metal (e.g., an epoxy or resin) or any other material(s) which impart(s) desired properties to the macrocomposite. With respect to the electronic packaging art, a coating or coatings may be provided on at least a portion of the surface of the metal matrix composite body to facilitate bonding of electrical leads directly to the electronic package (e.g., by welding or soldering); facilitate attaching a body to the electronic package; create a protective layer on the electronic package to enhance the corrosion resistance, erosion resistance, etc., of the package; and/or may function as an electric ground for the electronic chip, etc. Examples of coating materials are Au, Zn, Ni, Sn, epoxy, resin, etc., and mixtures thereof.

In a further preferred embodiment, it may be desirable for the formed metal matrix composite and/or the macrocomposite body to be machinable. For example, even though a metal matrix composite and/or macrocomposite body can be formed to net or near net shape, it may be desirable for at least a portion of the formed body to be machinable by conventional techniques. Specifically, it may be possible to machine, such as by, e.g., drilling, grinding, thermoforming, etc., the formed body to meet a desired need. With respect to the electronic packaging art, at least a portion of a metal matrix composite or macrocomposite body may be tailored by, e.g., drilling or thermoforming, to tailor the body to a specific application.

In the above-discussed preferred embodiments, a metal matrix composite body may be formed as either an exterior or interior surface, or both, on a substrate of matrix metal. Moreover, the metal matrix composite surface may be of a selected or predetermined thickness with respect to the size of the matrix metal substrate. The techniques of the present invention enable the preparation of thick wall or thin wall metal matrix composite structures in which the relative volume of matrix metal providing the metal matrix composite surface is substantially greater than or less than the volume of metal substrate. Still further, the metal matrix composite body which may be either an exterior or interior surface or body, may be also bonded to a second material such as a ceramic or metal, thereby providing for a significant number of combinations of bonding between metal matrix composite, and/or excess matrix metal and/or a second body such a ceramic or metal body.

Accordingly, the present invention can be utilized to meet or satisfy a large number of industrial demands thereby providing the efficacy of the present invention.

In order to form the macrocomposites of the present invention, a metal matrix composite body must be formed by the spontaneous infiltration of a matrix metal into a mass filler material or a preform. In order to effect spontaneous infiltration of the matrix metal into the filler material or preform, an infiltration enhancer should be provided to the spontaneous system. An infiltration enhancer could be formed from an infiltration enhancer precursor which could be provided (1) in the matrix metal; and/or (2) in the filler material or preform; and/or (3) from the infiltrating atmosphere and/or (4) from an external source into the spontaneous system. Moreover, rather than supplying an infiltration enhancer precursor, an infiltration enhancer may be supplied directly to at least one of the filler material or preform, and/or matrix metal, and/or infiltrating atmosphere. Ultimately, at least during the spontaneous infiltration, the infiltration enhancer should be located in at least a portion of the filler material or preform.

In a preferred embodiment, it is possible that the infiltration enhancer precursor can be at least partially reacted with the infiltrating atmosphere such that infiltration enhancer can be formed in at least a portion of the filler material or preform prior to or substantially simultaneously with contacting the preform with molten matrix metal (e.g., if magnesium was the infiltration enhancer precursor and nitrogen was the infiltrating atmosphere, the infiltration enhancer could be magnesium nitride which would be located in at least a portion of the filler material or preform).

An example of a matrix metal/infiltration enhancer precursor/infiltrating atmosphere system is the aluminum/magnesium/nitrogen system. Specifically, an aluminum matrix metal can be contained within a suitable refractory vessel which, under the process conditions, does not react with the aluminum matrix metal when the aluminum is made molten. A filler material containing or being exposed to magnesium, and being exposed to, at least at some point during the processing, a nitrogen atmosphere, can then be contacted with the molten aluminum matrix metal. The matrix metal will then spontaneously infiltrate the filler material or preform.

Moreover, rather than supplying an infiltration enhancer precursor, an infiltration enhancer may be supplied directly to at least one of the preform, and/or matrix metal, and/or infiltrating atmosphere. Ultimately, at least during the spontaneous infiltration, the infiltration enhancer should be located in at least a portion of the filler material or preform.

Under the conditions employed in the method of the present invention, in the case of an aluminum/magnesium/nitrogen spontaneous infiltration system, the filler material or preform should be sufficiently permeable to permit the nitrogen-containing gas to penetrate or permeate the filler material or preform at some point during the process and/or contact the molten matrix metal. Moreover, the permeable filler material or preform can accommodate infiltration of the molten matrix metal, thereby causing the nitrogen-permeated filler material or preform to be infiltrated spontaneously with molten matrix metal to form a metal matrix composite body and/or cause the nitrogen or react with an infiltration enhancer precursor to form infiltration enhancer in the filler material or preform and thereby resulting in spontaneous infiltration. The extent or rate of spontaneous infiltration and formation of the metal matrix composite will vary with a given set of process conditions, including magnesium content of the aluminum alloy, magnesium content of the filler material or preform, amount of magnesium nitride in the filler material or preform, the presence of additional alloying elements (e.g., silicon, iron, copper, manganese, chromium, zinc, and the like), average size of the filler material (e.g, particle diameter), surface condition and type of filler material, nitrogen concentration of the infiltrating atmosphere, time permitted for infiltration and temperature at which infiltration occurs. For example, for infiltration of the molten aluminum matrix metal to occur spontaneously, the aluminum can be alloyed with at least about 1% by weight, and preferably at least about 3% by weight, magnesium (which functions as the infiltration enhancer precursor), based on alloy weight. Auxiliary alloying elements, as discussed above, may also be included in the matrix metal to tailor specific properties thereof. (Additionally, the auxiliary alloying elements may affect the minimum amount of magnesium required int he matrix aluminum metal to result in spontaneous infiltration of the filler material or preform.) Loss of magnesium from the spontaneous system due to, for example, volatilization should not occur to such an extent that no magnesium was present to form infiltration enhancer. Thus, it is desirable to utilize a sufficient amount of initial alloying elements to assure that spontaneous infiltration will not be adversely affected by volatilization. Still further, the presence of magnesium in both of the filler material or preform and matrix metal or the filler material or preform alone may result in a reduction in the required amount of magnesium to achieve spontaneous infiltration (discussed in greater detail later herein).

The volume percent of nitrogen in the nitrogen atmosphere also affects formation rates of the metal matrix composite body. Specifically, if less than about 10 volume percent of nitrogen is present in the atmosphere, very slow or little spontaneous infiltration will occur. It has been discovered that it is preferable for at least about 50 volume percent of nitrogen to be present in the atmosphere, thereby resulting in, for example, shorter infiltration times due to a much more rapid rate of infiltration. The infiltrating atmosphere (e.g., a nitrogen-containing gas) can be supplied directly to the filler material or preform and/or matrix metal, or it may be produced or result from a decomposition of a material.

The minimum magnesium content required for the molten matrix metal to infiltrate a filler material or preform depends on one or more variable such as the processing temperature, time, the presence of auxiliary alloying elements such as silicon or zinc, the nature of the filler material, the location of the magnesium in one or more components of the spontaneous system, the nitrogen content of the atmosphere, and the rate at which the nitrogen atmosphere flows. Lower temperatures or shorter heating times can be used to obtain complete infiltration as the magnesium content of the alloy and/or preform is increased. Also, for a given magnesium content, the addition of certain auxiliary alloying elements such as zinc permits the use of lower temperatures. For example, a magnesium content of the matrix metal at the lower end of the operable range, e.g., from about 1 to 3 weight percent, may be used in conjunction with at least one of the following: an above-minimum processing temperature, a high nitrogen concentration, or one or more auxiliary alloying elements. When no magnesium is added to the filler material or preform, alloys containing from about 3 to 5 percent magnesium are preferred on the basis of their general utility over a wide variety of process conditions, with at least about 5 percent being preferred when lower temperatures and shorter times are employed. Magnesium contents in excess of about 10 percent by weight of the aluminum alloy may be employed to moderate the temperature conditions required for infiltration. The magnesium content may be reduced when used in conjunction with an auxiliary alloying element, but these elements serve an auxiliary function only and are used together with at least the above-specified minimum amount of magnesium. For example, there was substantially no infiltration of nominally pure aluminum alloyed only with 10 percent silicon at 1000° C. into a bedding of 500 mesh, 39 Crystolon (99 percent pure silicon carbide from Norton Co.). However, in the presence of magnesium, silicon has been found to promote the infiltration process. As a further example, the amount of magnesium varies if it is supplied exclusively to the preform or filler material. It has been discovered that spontaneous infiltration will occur with a lesser weight percent of magnesium supplied to the spontaneous system when at least some of the total amount of magnesium supplied is placed in the preform or filler material. It may be desirable for a lesser amount of magnesium to be provided in order to prevent the formation of undesirable intermetallics in the metal matrix composite body. In the case of a silicon carbide preform, it has been discovered that when the preform is contacted with an aluminum matrix metal, the preform containing at least about 1% by weight magnesium and being in the presence of a substantially pure nitrogen atmosphere, the matrix metal spontaneously infiltrates the preform. In the case of an alumina preform, the amount of magnesium required to achieve acceptable spontaneous infiltration is sightly higher. Specifically, it has been found that when an alumina preform is contacted with a similar aluminum matrix metal, at about the same temperature as the aluminum that infiltrated into the silicon carbide preform, and in the presence of the same nitrogen atmosphere, at least about 3% by weight magnesium may be required to achieve similar spontaneous infiltration to that achieved in the silicon carbide preform discussed immediately above.

It is also noted that it is possible to supply to the spontaneous system infiltration enhancer precursor and/or infiltration enhancer on a surface of the ally and/or on a surface of the preform or filler material and/or within the preform or filler material prior to infiltrating the matrix metal into the filler material or preform (i.e., it may not be necessary for the supplied infiltration enhancer or infiltration enhancer precursor to be alloyed with the matrix metal, but rather, simply supplied to the spontaneous system). If the magnesium was applied to a surface of the matrix metal, it may be preferred that said surface should be the surface which is closest to, or preferably in contact with, the permeable mass of filler material or vice versa; or such magnesium could be mixed into at least a portion of the preform or filler material. Still further, it is possible that some combination of surface application, alloying and placement of magnesium into at least a portion of the preform could be used. Such combination of applying infiltration enhancer(s) and/or infiltration enhancer precursor(s) could result in a decrease in the total weight percent of magnesium needed to promote infiltration of the matrix aluminum metal into the preform, as well as achieving lower temperatures at which infiltration can occur. Moreover, the amount of undesirable intermetallics formed due to the presence of magnesium could also be minimized.

The use of one or more auxiliary alloying elements and the concentration of nitrogen in the surrounding gas also affects the extent of nitriding of the matrix metal at a given temperature. For example, auxiliary alloying elements such as zinc or iron included in the alloy, or placed on a surface of the alloy, may be used to reduce the infiltration temperature and thereby decrease the amount of nitride formation, whereas increasing the concentration of nitrogen in the gas may be used to promote nitride formation.

The concentration of magnesium in the alloy, and/or placed onto a surface of the alloy, and/or combined in the filler or preform material, also tends to affect the extent of infiltration at a given temperature. Consequently, in some cases where little or no magnesium is contacted directly with the preform or filler material, it may be preferred that at least about three weight percent magnesium be included in the alloy. Alloy contents of less than this amount, such as one weight percent magnesium, may require higher process temperatures or an auxiliary alloying element for infiltration. The temperature required to effect the spontaneous infiltration process of this invention may be lower: (1) when the magnesium content of the alloy alone is increased, e.g. to at least about 5 weight percent; and/or (2) when alloying constituents are mixed with the permeable mass of filler material or preform; and/or (3) when another element such as zinc or iron is present in the aluminum alloy. The temperature also may vary with different filler materials. In general, spontaneous and progressive infiltration will occur at a process temperature of at least about 675° C., and preferably a process temperature of at least about 750° C.-800° C. Temperatures generally in excess of 1200° C. do not appear to benefit the process, and a particularly useful temperature range has been found to be from about 675° C. to about 1200° C. However, as a general rule, the spontaneous infiltration temperature is a temperature which is above the melting point of the matrix metal but below the volatilization temperature of the matrix metal. Moreover, the spontaneous infiltration temperature should be below the melting pint of the filler material or preform unless the filler material or preform is provided with a means of support which will maintain the porous geometry of the filler material or preform during the infiltration step. Such a support means could comprise a coating on the filler particles or preform passageways, or certain constituents of the mass of filler or preform could be non-molten at the infiltration temperature while other constituents were molten. In this latter embodiment, the non-molten constituents could support the molten constituents and maintain adequate porosity for spontaneous infiltration of the filler material or preform. Still further, as temperature is increased, the tendency to form a reaction product between the matrix metal and infiltrating atmosphere increases (e.g., in the case of aluminum matrix metal and a nitrogen infiltrating atmosphere, aluminum nitride may be formed). Such reaction product may be desirable or undesirable based upon the intended application of the metal matrix composite body. Additionally, electric resistance heating is typically used to achieve the infiltrating temperatures. However, any heating means which can cause the matrix metal to become molten and does not adversely affect spontaneous infiltration, is acceptable for use with the invention.

In the present method, for example, a permeable filler material or preform comes into contact with molten aluminum in the presence of, at least some time during the process, a nitrogen-containing gas. The nitrogen-containing gas may be supplied by maintaining a continuous flow of gas into contact with at least one of the filler material or the preform and/or molten aluminum matrix metal. Although the flow rate of the nitrogen-containing gas is not critical, it is preferred that the flow rate be sufficient to compensate for any nitrogen lost from the atmosphere due to nitride formation in the alloy matrix, and also to prevent or inhibit the incursion of air which can have an oxidizing effect on the molten metal.

The method of forming a metal matrix composite is applicable to a wide variety of filler materials, and the choice of filler materials will depend on such factors as the matrix alloy, the process conditions, the reactivity of the molten matrix alloy with the filler material, and the properties sought for the final composite product. For example, when aluminum is the matrix metal, suitable filler materials include (a) oxides, e.g., alumina; (b) carbides, e.g. silicon carbide; (c) borides, e.g. aluminum dodecaboride; and (d) nitrides, e.g. aluminum nitride. If there is a tendency for the filler material to react with the molten aluminum matrix metal, this might be accommodated by minimizing the infiltration time and temperature or by providing a non-reactive coating on the filler. The filler material may comprise a substrate, such as carbon or other non-ceramic material, bearing a ceramic coating to protect the substrate from attack or degradation. Suitable ceramic coatings include oxides, carbides, borides and nitrides. Ceramics which are preferred for use in the present method include alumina and silicon carbide in the form of particles, platelets, whiskers and fibers. The fibers can be discontinuous (in chopped form) or in the form of continuous filament, such as multifilament tows. Further the filler material or preform may be homogeneous or heterogeneous.

It also has been discovered that certain filler materials exhibit enhanced infiltration relative to filler materials by having a similar chemical composition. For example, crushed alumina bodies made by the method disclosed in U.S. Pat. No. 4,713,360, entitled "Novel Ceramic Materials and Methods of Making Same", which issued on Dec. 15, 1987, in the names of Marc S. Newkirk et al., exhibit desirable infiltration properties relative to commercially available alumina products. Moreover, crushed alumina bodies made by the method disclosed in Copending and Commonly Owned U.S. Pat. No. 4,851,375, issued Jul. 25, 1989, from application Ser. No. 819,397 and entitled "Methods of Making Composite Ceramic Articles Having Embedded Filler", in the names of Marc S. Newkirk et al, also exhibit desirable infiltration properties relative to commercially available alumina products. The subject matter of each of the issued Patents is herein expressly incorporated by reference. Thus, it has been discovered that complete infiltration of a permeable mass of ceramic material can occur at lower infiltration temperatures and/or lower infiltration times by utilizing a crushed or comminuted body produced by the method of the aforementioned U.S. Patents.

The size and shape of the filler material can be any that may be required to achieve the properties desired in the composite. Thus, the material may be in the form of particles, whiskers, platelets or fibers since infiltration is not restricted by the shape of the filler material. Other shapes such as spheres, tubules, pellets, refractory fiber cloth, and the like may be employed. In addition, the size of the material does not limit infiltration, although a higher temperature or longer time period may be needed for complete infiltration of a mass of smaller particles than for larger particles. Further, the mass of filler material (shaped into a preform) to be infiltrated should be permeable (i.e., permeable to molten matrix metal and to the infiltrating atmosphere). In the case of aluminum alloys, the infiltrating atmosphere may comprise a nitrogen-containing gas.

The method of forming metal matrix composites according to the present invention, not being dependent on the use of pressure to force or squeeze molten matrix metal into a preform or a mass of filler material, permits the production of substantially uniform metal matrix composites having a high volume fraction of filler material and low porosity. Higher volume fractions of filler material may be achieved by using a lower porosity initial mass of filler material. Higher volume fractions also may be achieved if the mass of filler is compacted or otherwise densified provided that the mass is not converted into either a compact with close cell porosity or into a fully dense structure that would prevent infiltration by the molten alloy (i.e., a structure having insufficient porosity for spontaneous infiltration to occur).

It has been observed that for aluminum infiltration and matrix formation around a ceramic filler, wetting of the ceramic filler by the aluminum matrix metal may be an important part of the infiltration mechanism. Moreover, at low processing temperatures, a negligible or minimal amount of metal nitriding occurs resulting in a minimal discontinuous phase of aluminum nitride dispersed in the metal matrix. However, as the upper end of the temperature range is approached, nitridation of the metal is more likely to occur. Thus, the amount of the nitride phase in the metal matrix can be controlled by varying the processing temperature at which infiltration occurs. The specific process temperature at which nitride formation becomes more pronounced also varies with such factors as the matrix aluminum alloy used and its quantity relative to the volume of filler or preform, the filler material to be infiltrated, and the nitrogen concentration of the infiltrating atmosphere. For example, the extent of aluminum nitride formation at a given process temperature is believed to increase as the ability of the alloy to wet the filler decreases and as the nitrogen concentration of the atmosphere increases.

It is therefore possible to tailor the constituency of the metal matrix during formation of the composite to impart certain characteristics to the resulting product. For a given system, the process conditions can be selected to control the nitride formation. A composite product containing an aluminum nitride phase will exhibit certain properties which can be favorable to, or improve the performance of, the product. Further, the temperature range for spontaneous infiltration with an aluminum alloy may vary with the ceramic material used. In the case of alumina as the filler material, the temperature for infiltration should preferably not exceed about 1000° C. if it is desired that the ductility of the matrix be not reduced by the significant formation of nitride. However, temperatures exceeding 1000° C. may be employed if it is desired to produce a composite with a less ductile and stiffer matrix. To infiltrate silicon carbide, higher temperatures of about 1200° C. may be employed since the aluminum alloy nitrides to a lesser extent, relative to the use of alumina as filler, when silicon carbide is employed as a filler material.

Moreover, it is possible to use a reservoir of matrix metal to assure complete infiltration of the filler material and/or to supply a second metal which has a different composition from the first source of matrix metal. Specifically, in some cases it may be desirable to utilize a matrix metal in the reservoir which differs in composition from the first source of matrix metal. For example, if an aluminum alloy is used as the first source of matrix metal, then virtually any other metal or metal alloy which was molten at the processing temperature could be used as the reservoir metal. Molten metals frequently are very miscible with each other which would result in the reservoir metal mixing with the first source of matrix metal so long as an adequate amount of time is given for the mixing to occur. Thus, by using a reservoir metal which is different in composition than the first source of matrix metal, it is possible to tailor the properties of the metal matrix to meet various operating requirements and thus tailor the properties of the metal matrix composite.

A barrier means may also be utilized in combination with the present invention. Specifically, the barrier means for use with this invention may be any suitable means which interferes, inhibits, prevents or terminates the migration, movement, or the like, of molten matrix alloy (e.g., an aluminum alloy) beyond the defined surface boundary of the filler material. Suitable barrier means may be any material, compound, element, composition, or the like, which, under the process conditions of this invention, maintains some integrity, is not volatile and preferably is permeable to the gas used with the process as well as being capable of locally inhibiting, stopping interfering with, preventing, or the like, continued infiltration or any other kind of movement beyond the defined surface boundary of the ceramic filler.

Suitable barrier means includes materials which are substantially non-wettable by the migrating molten matrix alloy under the process conditions employed. A barrier of this type appears to exhibit little or no affinity for the molten matrix alloy, and movement beyond the defined surface boundary of the filler material or preform is prevented or inhibited by the barrier means. The barrier reduces any final machining or grinding that may be required of the metal matrix composite product. As stated above, the barrier preferably should be permeable or porous, or rendered permeable by puncturing, to permit the gas to contact the molten matrix alloy.

Suitable barriers useful for aluminum matrix alloys are those containing carbon, especially the crystalline allotropic form of carbon known as graphite. Graphite is essentially non-wettable by the molten aluminum alloy under the described process conditions. A particular preferred graphite is a graphite tape product that is sold under the trademark Grafoil®, registered to Union Carbide. This graphite tape exhibits sealing characteristics that prevent the migration of molten aluminum alloy beyond the defined surface boundary of the filler material. This graphite tape is also resistant to heat and is chemically inert. Grafoil® graphite material is flexible, compatible, conformable and resilient. It can be made into a variety of shapes to fit any barrier application. However, graphite barrier means may be employed as a slurry or paste or even as a paint film around and on the boundary of the filler material or preform. Grafoil® is particularly preferred because it is in the form of a flexible graphite sheet. In use, this paper-like graphite is simply formed around the filler material or preform.

Other preferred barrier(s) for aluminum metal matrix alloys in nitrogen are the transition metal borides (e.g., titanium diboride ($TiB_2$)) which are generally non-wettable by the molten aluminum metal alloy under certain of the process conditions employed using this material. With a barrier of this type, the process temperature should not exceed about 875° C., for otherwise the barrier material becomes less efficacious and, in fact, with increased temperature infiltration into the barrier will occur. The transition metal borides are typically in a particulate form (1-30 microns). The barrier materials may be applied as a slurry or paste to the boundaries of the permeable mass of ceramic filler material which preferably is preshaped as a preform.

Other useful barriers for aluminum metal matrix alloys in nitrogen include low-volatility organic compounds applied as a film or layer onto the external surface of the filler material or preform. Upon firing in nitrogen, especially at the process conditions of this invention, the organic compound decomposes leaving a carbon soot film. The organic compound may be applied by conventional means such as painting, spraying, dipping, etc.

Moreover, finely ground particulate materials can function as a barrier so long as infiltration of the particulate material would occur at a rate which is slower than the rate of infiltration of the filler material.

Thus, the barrier means may be applied by any suitable means, such as by covering the defined surface boundary with a layer of the barrier means. Such a layer of barrier means may be applied by painting, dipping, silk screening, evaporating, or otherwise applying the barrier means in liquid, slurry, or paste form, or by sputtering a vaporizable barrier means, or by simply depositing a layer of a solid particulate barrier means, or by applying a solid thin sheet or film of barrier means onto the defined surface boundary. With the barrier means in place, spontaneous infiltration substantially terminates when the infiltrating matrix metal reaches the defined surface boundary and contacts the barrier means.

Through use of the techniques described above, the present invention provides a technique whereby a shaped metal matrix composite can be bonded or integrally attached to at least one second or additional body. This body may comprise: a ceramic matrix body; a ceramic matrix composite body, i.e., a ceramic matrix embedding filler material; a body of metal; a metal matrix composite; and/or any combination of the above listed materials. The final product produced by the present invention is a macrocomposite which comprises at least one metal matrix composite, formed by the spontaneous infiltration of a mass of filler material or a preform with a matrix metal, which is bonded or integrally attached to at least one body comprised of at least one of the materials listed above. Thus, the final product of the present invention can comprise a virtually limitless number of permutations and combinations of spontaneously infiltrated metal matrix composite which are bonded on one or more surfaces to at least one body comprised of at least one of the materials listed above.

As demonstrated in Examples 2, 3 and 5, the present invention permits the formation of multi-layered macrocomposites in a single spontaneous infiltration step. Specifically, a molten matrix metal may be spontaneously infiltrated into a mass of filler material or a preform which is in contact with a second or additional body, such as a ceramic body. Upon infiltrating the filler material or preform to the interface of said filler material or preform with said second or additional body, the molten matrix metal, either alone or in combination with the filler material or preform, interacts with said second or additional body in such a was as to permit bonding or an integral attachment of the metal matrix composite body to the second or additional body upon cooling of the system. Thus, through utilization of the techniques described in Examples 2, 3 and 5, and number of second or additional bodies could be placed in or around a mass of filler material or preform so that when molten matrix metal infiltrates the mass of filler material or preform to the interface of said filler material or preform and said second or additional bodies, an integral attachment or bonding will occur between the metal matrix composite and the other bodies, upon cooling of the system to a temperature which is both below the melting point of the matrix metal and the melting point of all other bodies in the system.

In addition to forming a strong bond or integral attachment between the spontaneously infiltrated metal matrix composite and the second or additional body or bodies, the instant invention also provides a technique whereby the second or additional body or bodies may be placed in compression by the metal matrix composite. Alternatively, the metal matrix composite could be placed in compression by the second or additional body or bodies. Thus, the metal matrix composite may at least partially contain the other body and, if the coefficient of thermal expansion of the metal matrix composite is greater than the coefficient of thermal expansion of the second or additional body or bodies so contained, the metal matrix composite will place the contained body under compression upon cooling from infiltration temperature. Alternatively, the metal matrix composite body could be formed at least partially within a second or additional body having a higher coefficient of thermal expansion than the metal matrix composite body. Thus, upon cooling, the portion of the metal matrix composite which is contained within the second or additional body will be placed under compression by the second or additional body.

The technique of the instant invention can be adapted to produce a continuous macrocomposite chain of virtually any length. Specifically, the process of the instant invention could be adapted to a continuous production method where, for example, a continuous stream of raw materials may be passed through a furnace which heats the matrix metal to a temperature above its melting point; said matrix metal being in a molten state for a sufficient time for said molten matrix metal to infiltrate a predetermined volume of filler material or preform; and thereafter, as the infiltrated filler material is cooled (e.g., removed from the furnace) said matrix metal cools to solidification temperature, thereby having a metal matrix composite. Through the utilization of this continuous process, a metal matrix composite could be bonded to a second material which would be bonded to another metal matrix composite, which would be bonded to another second material, and so on. The molten matrix metal could be supplied in situ or could be continuously supplied to the furnace through a second stream which is supplied from, for example, a reservoir of matrix metal. In addition, a layer of barrier material, such as Grafoil® (described herein), could be interposed between predetermined segments of the macrocomposite chain, thereby terminating the chain at the barrier layer.

The integral attachment or bonding of the metal matrix composite to the second or additional body can be enhanced through the use of mechanical bonding techniques. Specifically, the surface of one or both of the metal matrix composite or the second or additional body can have notches, holes, slots, or any other surface irregularities which are matched with the corresponding inverse shape on the surface of the body to which the bond or attachment is to be made. These inversely matching irregularities can create a mechanical bond in addition to any chemical bond which may be produced between the metal matrix composite and the second or additional body. The combination of these bonds or attachment mechanisms can produce a much stronger bond or attachment than either bond or attachment mechanism separately.

The products produced by the technique of the instant invention will be useful for industrial applications requiring surfaces which must withstand high temperature, abrasion, corrosion, erosion, thermal stress, friction, and/or many other stresses. Thus, the process disclosed and claimed in the instant application will be useful in the production of virtually any industrial product which can have its performance enhanced through the use of surfaces comprised of metal matrix composite, ceramic matrix composites, metals, or combinations of the above. By providing techniques for creating macrocomposites having layers or materials which differ in the properties and characteristics, a wealth of industrial applications which heretofore were through impractical or impossible to satisfy through the use of conventional materials, may now be satisfied through proper engineering of the macrocomposites produced by the process of the present invention. Particularly, industrial applications which require one section of a body to withstand a certain set of conditions and another part of the body to withstand a different set of conditions may now be satisfied through the use of two or more different types of materials which are formed into a macrocomposite having the shape of the desired industrial piece. One exemplary use of macrocomposites produced according to the present invention is int he electronic packaging art, wherein ti is required to hermetically seal a chip within a box or container. The box or container can be made to net or near-net shape from a metal matrix composite having: (1) a thermal expansion coefficient which is similar (e.g., close enough so as not to result in thermal fatigue, under normal operating conditions, of the bond between the ceramic chip and the box or container) to that of the ceramic chip; (2) an acceptable heat transfer so as to provide for the dissipation of any heat generated by the ceramic chip; (3) a relatively low density; (4) a weldable lip or layer due to the presence of the layer or lip of metal on a section of the metal matrix composite body, thereby providing for a hermetic sealing of the chip within the box or container; (5) an electrically insulating sheath or conduit for housing electrical conductors or wires; and/or (6) a coating (e.g., a metal) on at least a portion of the surface of the metal matrix composite to enhance the properties of the electronic package.

Moreover, through the use of the preform and barrier techniques described herein, net or near net shape macrocomposite can be formed which require little or no final machining after the spontaneous infiltration step.

Thus, the products produced by the method of the present invention have a virtually limitless industrial potential and may help to satisfy many of the most challenging engineering requirements existing in the materials world today.

Various demonstrations of the present invention are included in the Examples immediately following. However, these Examples should be considered as being illustrative and should not be construed as limiting the scope of the invention as defined in the appended claims.

EXAMPLE 1

This Example demonstrates that it is possible to utilize the spontaneous infiltration of a molten matrix metal into a shaped preform to obtain a shaped metal matrix composite body which is integrally attached or bonded to a solid piece of matrix metal.

Referring to FIG. 1, an ingot (2) of matrix metal, measuring approximately 2 inches (51 mm) by 2 inches (51 mm) by ½ inch (13 mm) and composed by weight of approximately 5% silicon, 5% Mg, and the balance aluminum, was placed on top of a preform (4) having approximate dimensions 2 inches (51 mm) by 2 inches (51 mm) by ½ inch (13 mm). The preform (4) was produced by mixing C-75 unground calcified alumina from Alcan and Elmer's Wood Glue (from Bordon Co.). The weight of Elmer's Wood glue utilized was approximately 10% of the weight of C-75 unground calcined alumina. Enough water was added to this Elmer's Wood glue/alumina mixture to create a slurry. The slurry was well mixed and cast into a rubber mold. The rubber mold and its contents were then placed into a freezer until the contents of the rubber mold were completely frozen. At this point, the frozen preform was removed from the rubber mold and allowed to dry.

As shown in FIG. 1, the preform (4) and matrix metal ingot (2) assembly was placed on top of an approximately ½ inch (13 mm) thick layer of Grade HTC titanium diboride from Union Carbide contained within an alumina refractory boat (6) obtained from Bolt Technical Ceramics. Additional Grade HTC titanium diboride was then added to the refractory boat (6) until the surface of the titanium diboride bed (8) was approximately level with the upper surface of the matrix metal ingot (2).

Figure 2:
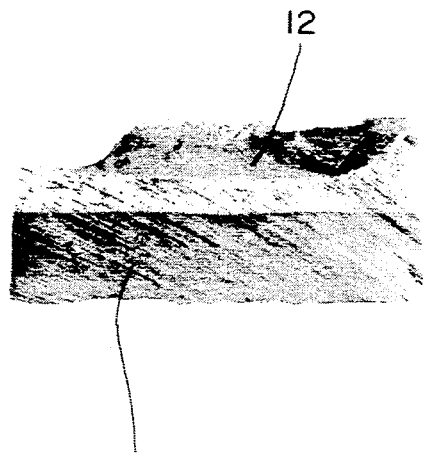
FIG. 2 is a photograph of a cross-section of the macrocomposite produced in Example 1.

The setup, consisting of the refractory boat (6) and its contents were placed within a controlled atmosphere electric resistance heated vacuum furnace at room temperature. A high vacuum (approximately $1 \times 10^{-4}$ torr) was created within the furnace and maintained as the temperature was raised from rom temperature to about 200° C. The furnace and its contents were held at about 200° C. for about two hours before forming gas (approximately 95% by volume nitrogen, 4% by volume hydrogen) was backfilled into the furnace to approximately one atmosphere and a continuous forming gas flow rate of approximately 1000 cc/min was established. The furnace temperature was then ramped to about 875° C. over about 10 hours; held at about 875° C. for about 15 hours; and ramped to room temperature in about 5 hours. Upon reaching room temperature, the setup was removed from the furnace and disassembled. A metal matrix composite comprising the alumina preform infiltrated by matrix metal was recovered. As shown in FIG. 2, the metal matrix composite (10) was integrally bonded with excess residual matrix metal (12).

Thus, this Example has demonstrated that through the use of spontaneous infiltration, it is possible to create a shaped metal matrix composite body which is integrally bonded to a solid piece of excess matrix metal.

EXAMPLE 2

The following Example demonstrates that it is possible to spontaneously infiltrate a bed of filler material with matrix metal to produce a macrocomposite which comprises excess matrix metal which is integrally attached or bonded to a metal matrix composite which is in turn integrally attached or bonded to a ceramic body.

Figure 3:
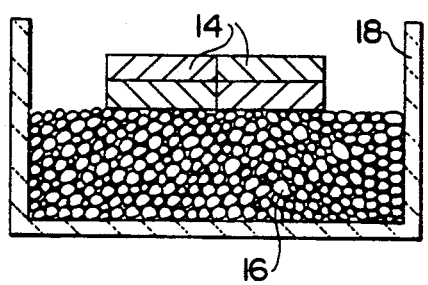
FIG. 3 is a cross-sectional view of the setup utilized to produce the macrocomposite in Example 2.

As shown in FIG. 3, four matrix metal ingots (14), each measuring approximately 2 inches (51 mm) by 1 inch (25 mm) by ½ inch (13 mm) and composed by weight of approximately 3% silicon, 3% Mg and the balance aluminum, were placed on top of a bed (16) or a 90 grit alumina material known by the trade name 38 Alundum and produced by Norton Co. The bed (16) of 90 grit, 38 Alundum was contained within an alumina refractory boat (18), produced by Bolt Technical Ceramics. The matrix metal ingots (14) were arranged as displayed in FIG. 3.

The setup, consisting of the alumina refractory boat (18) and its contents, was placed within a tube furnace and forming gas (approximately 96% by volume nitrogen, 4% by volume hydrogen) was flowed through the furnace at a gas flow rate of about 300 ccm/min. The furnace temperature was then raised from room temperature to about 1000° C. over about 10 hours; maintained at about 1000° C. for about 10 hours; and then ramped to room temperature over about 6 hours.

Figure 4:
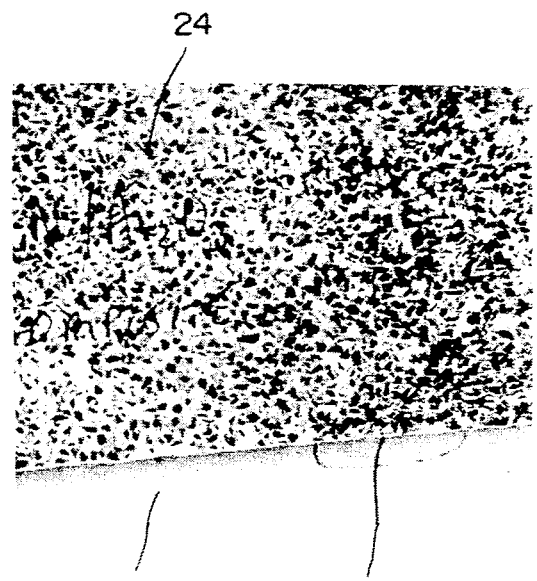
FIG. 4 is a photomicrograph showing the interface between the alumina refractory boat and the metal matrix composite produced in Example 2.

After reaching room temperature, the setup was removed from the furnace and disassembled. A metal matrix composite comprising the 90 grit, 38 Alundum infiltrated by the matrix metal was recovered. The metal matrix composite was integrally attached to or bonded with both the alumina refractory boat (18) and a body of excess matrix metal. FIG. 4 is a photomicrograph showing the interface (20) between the alumina refractory boat (22) and the metal matrix composite (24). This Figure demonstrates that a good bond or attachment is obtained at the metal matrix composite-alumina refractory boat interface. Although it is not shown in FIG. 4, there was also a strong bond or good attachment at the excess matrix metal-metal matrix composite interface. This bond is evidenced by the fact that the excess matrix metal could not be removed without machining.

Figure 5:
FIG. 5 is a photomicrograph taken at a high level of magnification of the microstructure of the metal matrix composite formed in Example 2.

FIG. 5 is a photomicrograph taken at a high level of magnification of the microstructure of the metal matrix composite formed in the present Example. As indicated by the lines labeled (26), significant amounts of aluminum nitride were formed within the metal matrix composite. The aluminum nitride (26) appears as the dark grey phase in FIG. 5 while the matrix metal (28) appears as the light graph phase and the 90 grit, 38 Alundum appears at the dark colored particulate (30). Thus, this example further demonstrates that it is possible to tailor the microstructure of the metal matrix composite to contain reaction products between the infiltrating matrix metal and the infiltrating atmosphere.

Thus, this Example demonstrates that it is possible to utilize spontaneous infiltration to create a macrocomposite comprising excess matrix metal which is integrally attached or bonded to a metal matrix composite body which is in turn integrally attached or bonded to a ceramic body. Further, this example demonstrates that the microstructure of the metal matrix composite may be modified by allowing reaction products to form between the matrix metal and the infiltrating atmosphere.

EXAMPLE 3

The following Example demonstrates that it is possible to create a macrocomposite which comprises excess matrix metal which is integrally attached or bonded to a metal matrix composite which is in turn integrally attached or bonded to a ceramic body.

Figure 6:
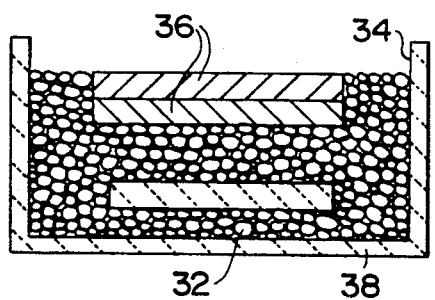
FIG. 6 is a cross-sectional view of the setup utilized to produce the macrocomposite in Example 3.

As shown in FIG. 6, a commercially available alumina plate (32) (ASD85, made by Coors) having approximately dimensions of 3 inches (76 mm) by 4 inches (102 mm) by ½ inch (13 mm) was placed within a alumina refractory boat (34) on top of an approximately ½ inch (13 mm) thick layer of a 90 grit alumina material known by the trade name 38 Alundum and produced by Norton Co. Additional 38 Alundum was then added to the refractory boat (34) until the alumina plate (32) was covered with an approximately 1inch (25 mm) thick layer of the 38 Alundum. Two bars (36) of a matrix metal composed by weight of approximately 5% silicon, 3% Mg, 5% zinc, and the balance aluminum, were placed on top of the 38 Alundum so that they were directly above the alumina plate. Each bar (36) of matrix metal had approximate dimensions of 4½ inches (114 mm) by 2 inches (51 mm) by ½ inch (13 mm) and the two matrix metal bars (36) were stacked one or top of the other, as shown in FIG. 6. At this point, additional 38 Alundum was added to the refractory boat (34) until the surface of the bed (38) of 38 Alundum was approximately level with the surface of the upper matrix metal bar (36).

The setup, consisting of the alumina refractory boat (34) and its contents, was placed within an electrical resistance heated muffle tube furnace at room temperature and a continuous gas flow rate of about 350 cc/min of forming gas (approximately 96% by volume nitrogen, 4% by volume hydrogen) was established. The temperature in the furnace was ramped from room temperature to about 1000° C. over about 12 hours; maintained at about 1000° C. for about 18 hours; and ramped to room temperature over about 5 hours.

Figure 7:
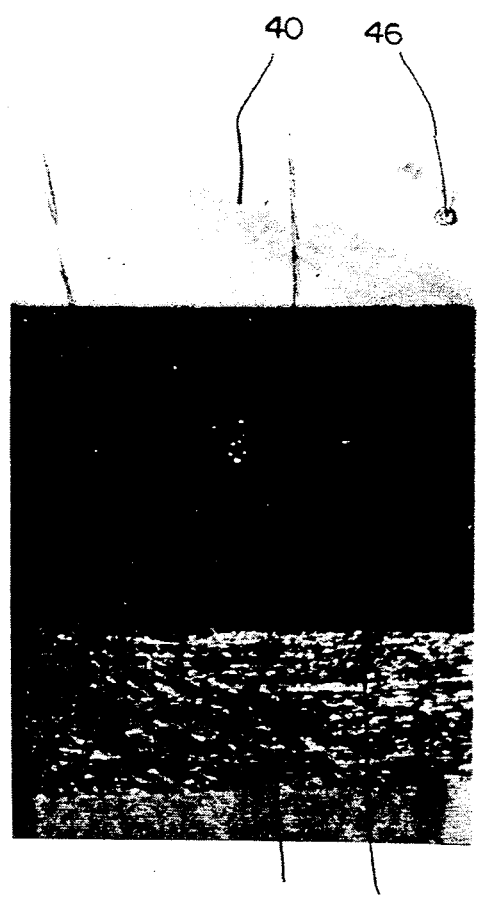
FIG. 7 is a photograph which displays a cross-section of the macrocomposite produced in Example 3.
Figure 14:
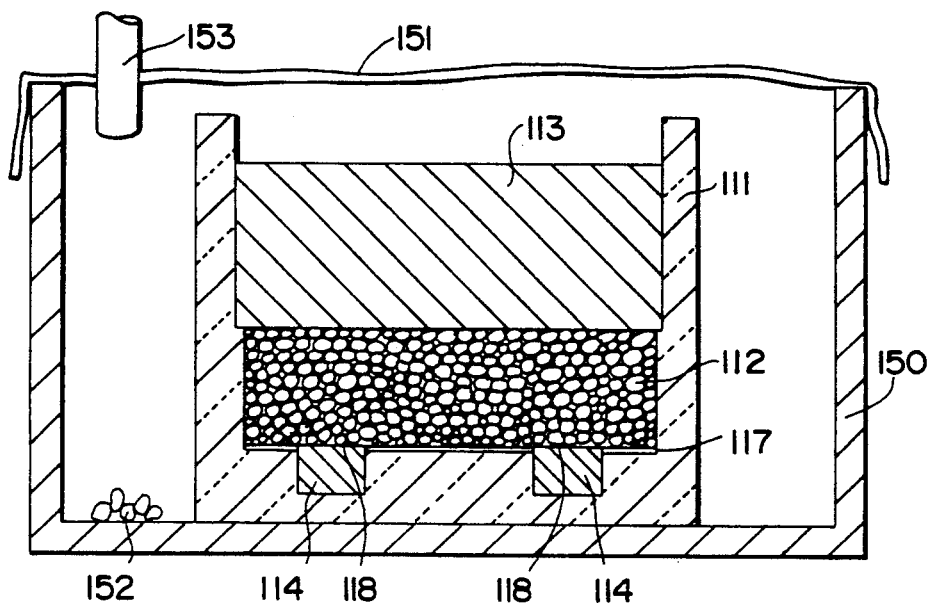
FIG. 14 is a cross-sectional view of the setup utilized to create the macrocomposite produced in Example 7.
Figure 15:
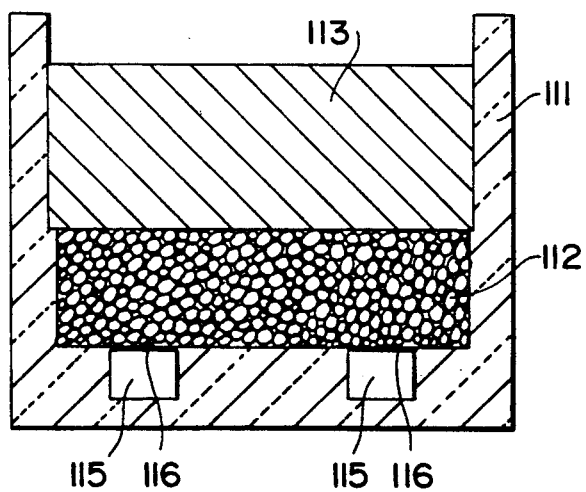
FIG. 15 is a cross-sectional view of the setup utilized to create the macrocomposite produced in Example 8.

After reaching room temperature, the setup was removed from the furnace and disassembled. FIG. 7 is a photograph which displays a cross-section of the macrocomposite (40) which was recovered from the assembly. Specifically, a body of excess matrix metal (42) is integrally attached or bonded to a metal matrix composite (44), which comprises 90 grit, 38 Alundum embedded by the matrix alloy, which is nit urn integrally attached or bonded to a ceramic plate (46).

Thus, this Example demonstrates that it is possible to form a multilayer marocomposite comprising a metal matrix composite which is bonded to a ceramic piece and a solid metal piece which are on opposite sides of the metal matrix composite. Further, the present Example demonstrates that it is possible to form such a multilayered macrocomposite in one spontaneous infiltration step.

EXAMPLE 4

The following Example demonstrates that it is possible to form a metal matrix composite body which is integrally attached to a body of solid matrix metal.

Figure 8:
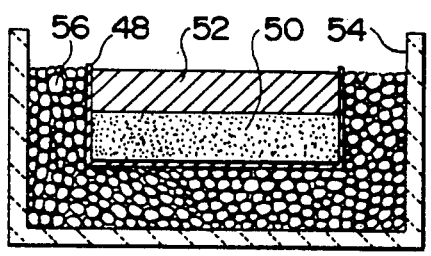
FIG. 8 is a cross-sectional view of the setup utilized to produce the macrocomposite in Example 4.

As shown in FIG. 8, a box (48) having approximate dimensions of 6½ inches (165 mm) by 6½ inches (165 mm) by 2.5 inches (64 mm) formed from a double layer of a 15/1000 inch (0.38 mm) thick Grade GTB graphite tape product produced by Union Carbide and sold under the trademark Grafoil® was produced by stapling appropriate size sections of the Grafoil® together and sealing the seams with a slurry made by mixing graphite powder (Grade KS-44 from Lonza Inc.) and coloidal silica (Ludox HS from du Pont). The weight ratio of graphite to colloidal silica was about ⅓.

An unground alumina filler material known as C-75 unground alumina from Alcan, was then added to the Grafoil box until the bed (50) of alumina material was approximately 1.25 inches (32 mm) thick. An approximately 6½ inch (165 mm) by 6½ inch (165 mm) by 1 inch (25 mm) ingot (52) of a matrix metal composed by weight of approximately 5% silicon, 5% Mg, 5% zinc and the balance aluminum, was placed on top of the bed (50) of alumina filler material within the Grafoil box (48). The Grafoil box (48) and its contents were then placed within a graphite refractory boat (54) on top of an approximately 1 inch (25 mm) thick layer of a 24 grit alumi: a material known as 38 Alundum and produced by Norton Co. Additional 24 grit 38 Alundum was added to the graphite boat until the surface of the bed (56) of 24 grit 38 Alundum was slightly below the top of the Grafoil box (48).

The setup, consisting of the graphite refractory boat (54) and its contents, was placed within a controlled atmosphere electric resistance heated vacuum furnace at room temperature. A high vacuum (approximately 1 ×10−4 torr) was then created within the furnace and the furnace temperature was raised to about 200° C. in approximately 45 minutes. The furnace temperature was maintained at about 200° C. under vacuum conditions for approximately 2 hours before the furnace was backfilled with nitrogen gas to approximately 1 atmosphere. A continuous flow rate of about 1.5 liters/min of nitrogen gas was established within the furnace and the furnace temperature was ramped over about 5 hours to about 865° C.; held at about 865° C. for about 24 hours; and ramped to room temperature in about 3 hours.

After reaching room temperature, the setup was removed from the furnace and disassembled. FIG. 9 is a photograph which displays a cross-section of the macrocomposite recovered from the setup. Specifically, FIG. 9 displays a metal matrix composite (58) comprising C-75 unground alumina embedded by the matrix metal, which is integrally attached to a body (60) of residual matrix metal.

Thus, this Example demonstrates that it is possible to obtain a macrocomposite consisting of a metal matrix composite which is integrally bonded to a body of residual matrix metal.

EXAMPLE 5

This example demonstrates that it is possible to produce a macrocomposite which comprises a body of excess matrix metal which is integrally attached to or bonded with a metal matrix composite which is in turn integrally attached to or bonded with a ceramic body. Specifically, the ceramic body and the body of excess matrix metal are integrally attached to or bonded with a metal matrix composite which comprises a three dimensionally interconnected ceramic structure embedded within a metal matrix.

Figure 10:
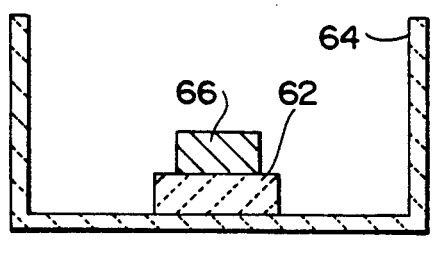
FIG. 10 is a cross-sectional view of the setup utilized to produce the macrocomposite in Example 5.

As shown in FIG. 10, an approximately 1 inch (25 mm) by 1.5 inch (38 mm) by 0.5 inch (13 mm) ceramic filter (62) comprised of approximately 99.5% pure aluminum oxide and containing about 45 pores per inch was obtained from High Tech Ceramics of Alfred, N.Y. The ceramic filter (62) was placed int he bottom of an alumina boat (64) and an ingot (66) of a matrix metal having approximate dimensions of 1 inch (25 )) by 1 inch (25 mm) by ½ inch (13 mm) and composed by weight of about 5% silicon, about 5% zinc, about 10% magnesium, and the balance aluminum, was placed on top of the ceramic filter (62). The alumina boat (64) was a 99.7% alumina Sagger obtained from Bolt Technical Ceramics (BTC-AL-99.7%) and had approximate dimensions of 3.9 inches (100 mm) length by 1.8 inches (45 mm) width by 0.75 inch (19 mm) height of 0.12 inch (3 mm) base thickness. The setup, comprising the alumina refractory boat and its contents, was placed in a tube furnace at room temperature. The furnace door was then closed and forming gas (approximately 95% by volume nitrogen, 4% by volume hydrogen) was supplied to the furnace at a gas flow rate of about 250 cc/minute. The furnace temperature was ramped at about 150° C./hour to about 775° C.; maintained at about 775° C. for 7 hours; and then ramped down at about 200° C./hour to room temperature. Upon removal from the furnace, a macrocomposite was recovered from the setup. The metal matrix composite layer of the macrocomposite was sectioned and a photomicrograph of the microstructure was obtained. This photomicrograph is displayed as FIG. 11.

As shown in FIG. 11, an effective infiltration of matrix metal (68) into the porosity of the ceramic filter (70) was obtained. Moreover, as indicated by the lines labeled (72) in FIG. 11, the matrix metal infiltration was so complete that it infiltrated the porosity (74) contained within the alumina component of the ceramic filter (70). FIG. 11 also shows the interface (75) between the bottom of the alumina boat (76) and the metal matrix composite (78). In addition, although not shown in the photograph, excess matrix metal was integrally attached or bonded to the end of the metal matrix composite which was opposite the ceramic piece, i.e., opposite the bottom of the alumina boat.

Thus, this Example demonstrates that it is possible to form a multi-layered macrocomposite which comprises a body of excess matrix metal which is integrally attached or bonded to a metal matrix composite which is in turn integrally attached or bonded to a ceramic body.

EXAMPLE 6

The following Example demonstrates that it is possible to spontaneously infiltrate a series of preforms in one step to produce a macrocomposite comprising two metal matrix composite which are bonded to opposite sides of a thin layer of matrix metal.

Two preforms, each preform having approximate measurements of 7 inches (178 mm) by 7 inches (178 mm) by 0.5 inch (13 mm), were sediment cast from a mixture of a 220 grit alumina material known by the trade name 38 Alundum ® and produced by Norton Co., and colloidal alumina (Nyacol AL-20). The approximate weight ratio of the colloidal alumina to the 220 grit 38 Alundum was 70/30.

Figure 12:
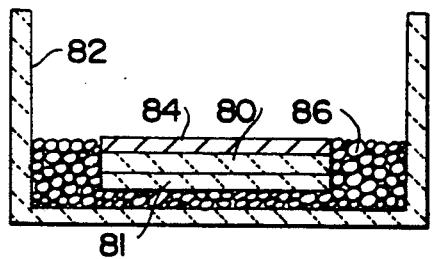
FIG. 12 is a cross-sectional view of the setup utilized to produce the macrocomposite in Example 6.

After the preforms had dried and set, a thin (approximately 1/64 inch (0.4 mm) thick) layer of colloidal alumina paste (Nyacol AL-20) was painted on a surface of each of the two preforms. The two painted surfaces were then brought into contact so as to sandwich the colloidal alumina between the two preforms. As shown in FIG. 12, this assembly of preforms (80), including the interfacial layer (81) of colloidal alumina, was then placed within a refractory boat (82) on top of an approximately ½ inch (13 mm) thick layer of Grade HCI titanium diboride produced by Union Carbide. An ingot (84) of matrix metal having approximate dimensions of 7 inches (178 mm) by 7 inches (178 mm) by ½ inch (13 mm) and composed by weight of approximately 5% silicon, 5% zinc, 7% Mg, 2% copper and the balance aluminum was placed on top of the assembly of preforms (80). Additional Grade HCT titanium diboride was then added to the refractory boat (82) until the surface of the bed (86) of the titanium diboride was approximately level with the upper surface of the matrix metal ingot (84).

The setup, consisting of the refractory boat (82) and its contents, was then placed within a controlled atmosphere electric resistance heated vacuum furnace at room temperature. A high vacuum (approximately $1 \times 10^{-4}$ torr) was then achieved within the furnace and the furnace temperature was raised to about 200° C. in about 45 minutes. The furnace temperature was maintained at about 200° C. under vacuum conditions for approximately 2 hours. After this initial two hour heating period, the furnace was backfilled with nitrogen gas to approximately 1 atmosphere and the temperature was raised to about 865° C. in approximately 5 hours; maintained at about 865° C. for about 18 hours; and then ramped to rom temperature in about 5 hours.

After reaching room temperature, the setup was removed from the furnace and disassembled. FIG. 13 is a photograph of a cross-section of the macrocomposite recovered from the setup. Specifically, a layer of matrix metal (88) is sandwiched between two metal matrix composites (90) each comprising 220 grit 38 Alundum (and residue from the Nycol colloidal alunmina) embedded by matrix metal. The layer of matrix metal (88) is integrally attached or bonded to each of the metal matrix composites (90), thus forming a macrocomposite.

EXAMPLE 7

The following Example demonstrates that it is possible to produce by spontaneous infiltration a macrocomposite comprising a metal matrix composite which is bonded to a plurality of metal pieces.

A silica mold (111) having an inner diameter of approximately 5 inches (127 mm) by 5 inches (127 mm) and 3¼ inches (83 mm) in height, and having nine holes of about ¾ inch (19 mm) diameter and ¾ inch (19 mm) depth in the bottom of the mold (111), was formed by first mixing a slurry of about 2.5 to 3 parts by weight of RANCO-SIL ™ 4 silica powder, about 1 part by weight colloidal silica (Nyacol 830 from Nyacol Products of Ashaldn, Mass.) and about 1 to 1.5 parts by weight of RANCO-SIL ™ A silica sand (Ransom and Randolf or Maumee, Ohio). The slurry was poured into a rubber mold having the negative shape of the desired silica mold and placed in a freezer overnight. The silica mold was subsequently removed from the rubber mold, fired at about 800° C. in an air furnace for about 1 hour and allowed to cool to room temperature.

The bottom surface of the formed silica mold (111) was covered with an approximately 5 inch by 5 inch by 0.010 inch (6.25 mm) thick PF-25-H graphite tape product (117) sold by TT America, Portland, Ore., under the trade name Perma-Foil having approximately ¾ inch (19 mm) diameter holes (118) cut into the graphite tape sheet (117) to correspond in position to the holes in the bottom of the silica mold (111). The holes in the bottom of the mold (111) were filled with approximately ¾ inch (19 mm) diameter by ¾ inch (19 mm) thick plugs (114) of a metal identical in composition to the matrix metal alloy composed of approximately 10% by weight magnesium and the balance aluminum. Approximately 819 grams of a 500 grit alumina filler material (112) known as 38 Alundum and produced by the Norton Company, was mixed with about 5 weight percent magnesium powder and shaken for about 15 minutes in a nalgene jar. The filler material (112) was then placed into the mold (111) to a depth of approximately ¾ inch (19 mm) and tamped lightly to level the surface of the filler material (112). Approximately 1399 grams of a matrix metal ingot (113), comprising about 10% by weight magnesium and the balance aluminum, were placed on top of the bed of alumina filler material (112) within the silica mold (111). The mold (111) and its contents were then placed into an approximately 10 inch (254 mm) by 10 inch (254 mm) by 8 inch (203 mm) high stainless steel container (150). A titanium sponge material (152), weighing about 20 grams, from Chemalloy Company Inc., Bryn Mawr, Pa., was sprinkled into the stainless steel can around the silica mold (111). A sheet of copper foil (151) was placed over the exposed surface of the stainless steel container (150) so as to form an isolated chamber. A nitrogen purge tube (153) was provided through the sheet of copper foil (151), and the stainless steel container (150) and its contents were placed into a air atmosphere resistance heated Unique utility box furnace. The system was ramped from room temperature to about 600° C. at a rate of about 400° C. per hour with a nitrogen flow rate of about 10 liters per minute, then heated from about 600° C. to about 775° C. at a rate of about 400° C. per hour with a nitrogen flow rate of about 2 liters per minute. The system was held at about 775° C. for about 1.5 hours with a nitrogen flow rate of about 2 liters per minute. The system was removed from the furnace at temperature, excess molten alloy was poured out, and a room temperature copper chill plate having dimensions of approximately 5 inches (127 mm) by 5 inches (127 mm) by 1 inch (13 mm) thick was placed within the silica mold (111) such that it contacted a top portion of residual metal (113), to directionally cool the formed composite.

Upon removal from the silica mold, a macrocomposite was recovered comprising a metal matrix composite plate having nine aluminum alloy plugs, corresponding in size and shape to the holes in the bottom of the silica mold, integrally attached to the composite body. Thus, this Example demonstrates that it is possible to form a macrocomposite which comprises a matrix metal composite which is integrally attached or bonded to a metal.

EXAMPLE 8

The method of the previous Example was substantially repeated, except that, rather than filling the ¾ inch (19 mm) holes (115) in the bottom of the silica mold with plugs (114) of matrix metal, the holes were covered with an aluminum foil material (116). Under the process conditions, the matrix metal infiltrated the alumina filler material (112) and substantially filled the holes (115) in the silica mold (111).

The composite was directionally cooled, as described above, and upon removal from the silica mold (111) it was observed that the formed macrocomposite comprised a metal matrix composite body integrally attached to aluminum alloy plugs. This Example further demonstrates that it is possible to form a macrocomposite which comprises a matrix metal composite which is integrally attached or bonded to a metal.

EXAMPLE 9

The following Example demonstrates that it is possible to produce by a spontaneous infiltration technique a macrocomposite comprising a metal matrix composite box with an aluminum-rich edge around a perimeter thereof.

Figure 16:
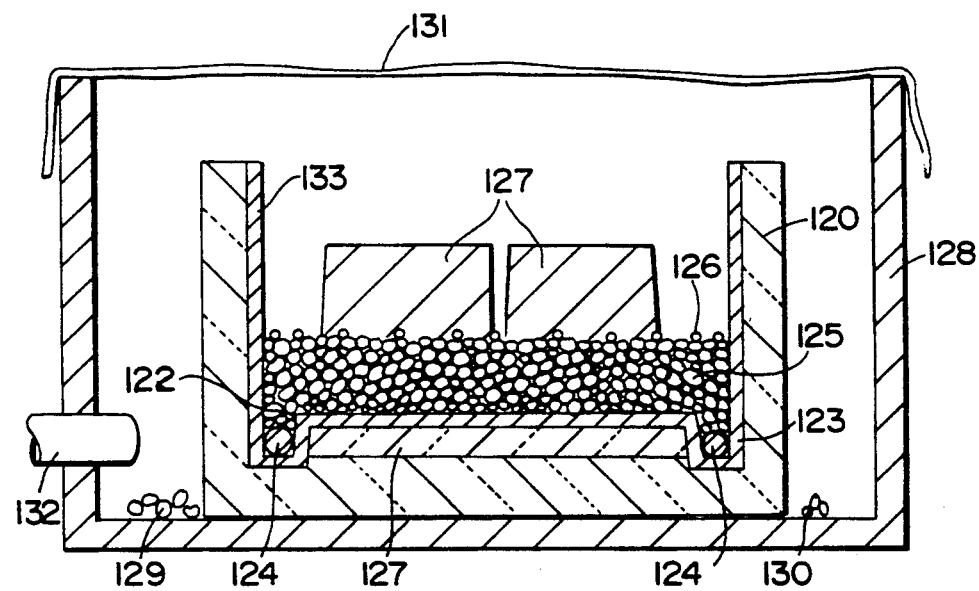
FIG. 16 is a cross-sectional view of the setup utilized to create the macrocomposite produced in Example 9.

As shown in cross-section in FIG. 16, a rectangular shaped mold (12) having a wall thickness of about 0.25 inches (6.4 mm) and a inner cavity measuring about 2.0 inches (51 mm) in length, about 2.0 inches (51 mm) in width, and about 1.25 inches (32 mm) in height, was made from a solid piece of grade ATJ graphite from Union Carbide Corporation. A graphite insert (121) measuring approximately 1.88 inches long (48 mm), 1.88 inches (48 mm) wide, and 0.25 inches (6.4 mm) high was placed into the bottom of the graphite mold (120) such that a 0.25 inch (6.4 mm) deep and 0.063 inch (1.6 mm) wide channel (122) was created along the perimeter of the insert (121) and an inside wall (123) of the rectangular mold (120). The mold (120) and the insert (121) were then spray coated with a mixture (133) consisting of about 1.5 parts by weight alcohol and 1 part by weight DAG 154 colloidal graphite from Acheson Colloids Company, Port Huron, Mich. A 1/16 inch (1.6 mm) diameter aluminum wire (124) was then placed into the channel (122), such that the wire (124) substantially completely surrounded the graphite insert (121).

A filler material (125) was made by mixing in a plastic jar on a ball mill for approximately one hour approximately 600 grams of a mixture consisting of about 19 percent by weight 500 grit 39 Crystolon silicon carbide, 78 percent by weight 220 grit 39 Crystolon silicon carbide, both from the Norton Company. Worchester, Mass. and 3 percent by weight −325 mesh magnesium powder from Atlantic Equipment Engineers, Bergenfield, N.J. This mixing was supplemented by an additional 10 minutes of hand shaking the nalgene jar.

About 21 grams of the filler material mixture (125) were poured into the bottom of the graphite mold (120) and into the channel (122), thereby covering the aluminum wire (124), and the graphite insert (121). The filler material mixture (125) was thereafter leveled within the mold (120). The filler material mixture (125) was then partially covered with a layer of 50 mesh magnesium powder (126) from Alpha Products, Morton Thiokol, Inc., Danvers, Mass., weighing about 0.16 grams. Matrix metal ingots (127) consisting of about 15 percent by weight silicon and the balance aluminum, and weighing about 99.2 grams, were placed on top of the filler material mixture (125) and the layer of magnesium powder (126), within the graphite mold (120). The mold (120) and its contents were then placed into a stainless steel container (128) measuring approximately 7 inches (178 mm) wide, 3.25 inches (83 mm) long, and 5 inches (127 mm) high. A piece of graphite tape product (not depicted in FIG. 16), designated PF-25-H and sold under the trade name Perma-Foil from TT America, Portland, Ore., and measuring about 7 inches (178 mm) by about 3.25 inches (8.3 mm) with a thickness of about 0.010 inch (0.25 mm), covered the bottom of the inner cavity of the stainless steel container. A titanium sponge material (129) weighing about 5 grams, from Chemalloy Company, Inc., Bryn Mawr, Pa. and 50 mesh magnesium powder (130), weighing about 2 grams, from Alpha Products, Morton Thiokol, Inc., Danvers, Mass., were sprinkled into the stainless steel can (128) around the graphite mold (120) onto the graphite tape product (134). A sheet of copper foil (131) was placed over the exposed surface of the stainless steel container (128) so as to form an isolated chamber. A nitrogen purge tube (132) was provided in a side wall of the stainless steel container (128). The stainless steel container (128) and its contents were placed into a Unique air atmosphere resistance heated utility furnace. The furnace was ramped from room temperature to about 600° C. at a rate of about 400° C./hour with a nitrogen flow rate of about 3 liters/minute. Thereafter, the furnace was heated from about 600° C. to about 800° C. at a rate of about 400° C./hour with a nitrogen flow rate of about 1 liter/minute. The furnace was held at about 800° C. for about 2 hours with a nitrogen flow rate of about 1 liter/minute. The stainless steel container (128) and it contents were removed from the furnace and the graphite mold (120) and its contents were placed upon a water cooled aluminum chill plate, which was at room temperature, to directionally solidify the composite.

Figure 17A:
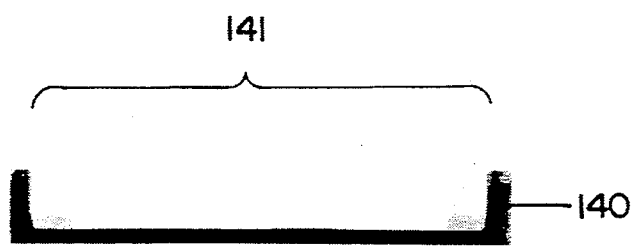
FIGS. 17A and 17B are photographs of a cross-section of the macrocomposite produced ni Example 9.
Figure 17B:
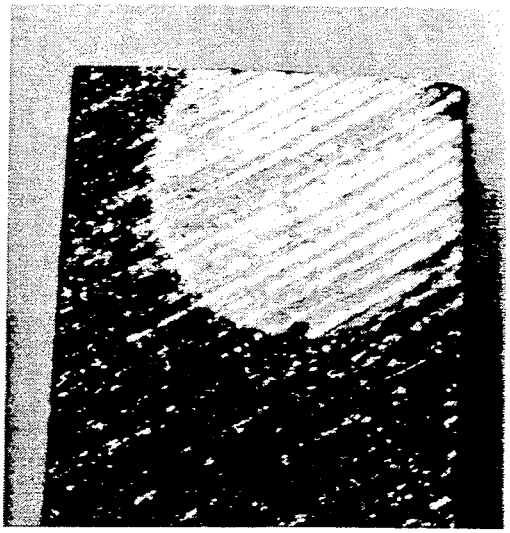

A macrocomposite was recovered from the graphite mold (120), the macrocomposite comprising a thin-walled metal matrix composite box with a integrally bonded aluminum lip located around the perimeter of the open edge of the box. Specifically, FIG. 17A, taken at 1.4×, shows a cross-section of the macrocomposite box (140) with the metal lip (141) located at the top of the box (140). Further, FIG..17B, taken at 35×, shows a higher magnification of the metal lip (141) bonded to the top of the box (140).

EXAMPLE 10

The following Example demonstrates that it is possible to produce by a spontaneous infiltration technique a macrocomposite comprising an electrically insulating ceramic composite structure embedded in a metal matrix composite.

A mold (160) having a trapezoidal cross-section with a closed end (161) measuring about 3 inches (76 mm) by 3inches (76 mm) and an open end (162) measuring about 3.75×3.75 inches (95×95 mm) and a height of about 2.5 inches (64 mm), was made from 14 gauge (1.9 mm thick) carbon steel. The inner surfaces of the mold (160) were covered with a 0.010 inch (0.25 mm) thick grade PF-25-H graphite tape product (163) from TT American, Inc., Portland, Ore. and sold under the trade name Peram-Foil.

A filler material (164) was made by mixing in a plastic jar on a ball mill for approximately one hour approximately 600 grams of a mixture consisting of about 19 percent by weight 500 grit 39 Crystolon silicon carbide, 78 percent by weight 220 grit 39 Crystolon silicon carbide, both from the Norton Company, Worchester, Mass. and 3 percent by weight −325 mesh magnesium powder from Atlantic Equipment Engineers, Bergenfield, N.J. This mixing was supplemented by an additional 10 minutes of hand shaking the plastic jar.

The open ends of seven round double bore thermocouple insulating sheaths were closed with a slurry mixture. Specifically, both ends of four round double bore thermocouple insulating sheaths or conduits (165), having an outer diameter of about 0.062 inch (1.6 mm) and two inner diameters each of about 0.016 inch (0.4 mm) and consisting of MV20 mullite from the Mcdanel Refractory Company, Beaver Falls, Pa.; and both ends of three round double bore thermocouple insulating sheaths or conduits (166) having an outer diameter of about 0.047 inch (1.2 mm) and two inner diameters each of about 0.010 inch (0.25 mm) and consisting of 998 alumina from the Mcdanel Refractory Company, Beaver Falls, Pa. (all seven sheaths having a length of about 2.5 inches (64 mm)), were dip coated with a slurry consisting of about 33 percent by weight colloidal silica (Nyacol 1430 AT, Nyacol Company, Ashland, Mass.) and 67 percent by weight −325 mesh calcium carbonate (Huber Corporation, Quincey, Ill.). The coated rods were fired at about 900° C. in a resistance air atmosphere box furnace for approximately 1 hour.

A layer of the filler material mixture (164) was poured into the bottom of the Perma-Foil lined mold (160) to a depth of about ½ inch (13 mm). The seven dip coated round double bore thermocouple insulating sheaths (165) and (166) were placed onto the filler material mixture (164) and an additional ½ inch (13 mm) thick layer of the filler material mixture (164) was poured over the thermocouple sheaths (165) and (166). The filler material mixture (164) was then partially covered with a layer of 50 mesh magnesium powder (167) from Alpha Products, Morton Thiokol, Inc., Danvers, Mass. weighing about 0.2 grams. Matrix metal ingots (168) consisting of about 15 percent by weight silicon and the balance aluminum, and weighing about 453 grams, were placed on top of the filler material mixture (164) and the layer of magnesium powder (167) within the Parma-Foil lined steel mold (160).

Figure 18:
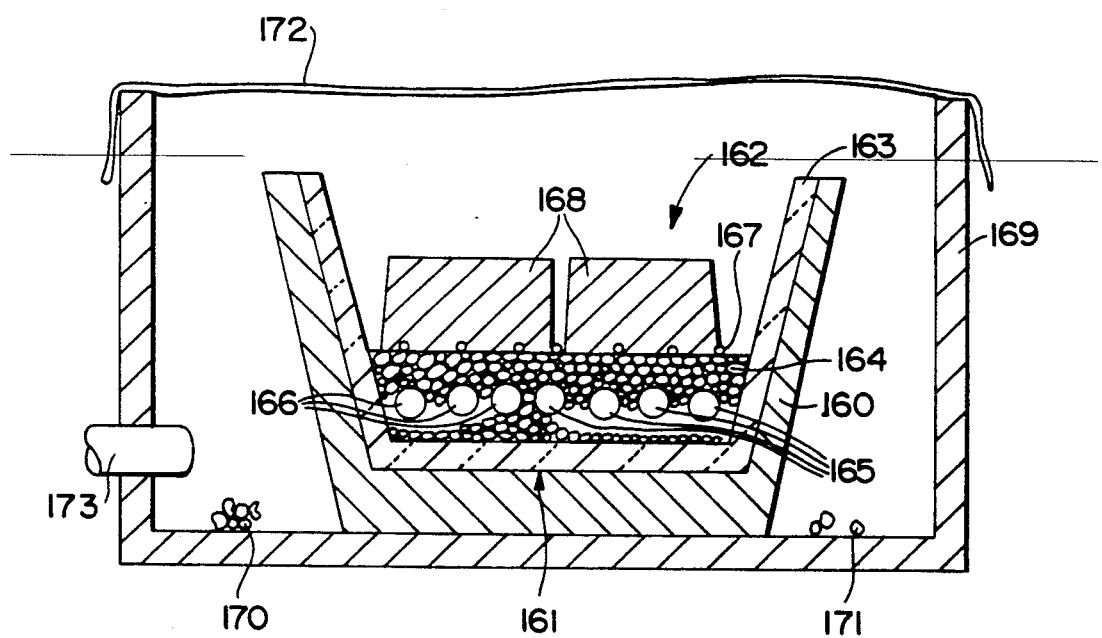
FIG. 18 is a cross-sectional view of the setup utilized to create the macrocomposite produced in Example 10.

The mold (160) and its contents were then placed into a stainless steel container (169) measuring about 10 inches (254 mm) wide by 12 inches (304 mm) long by 10 inches (254 mm) high. A piece of graphite tape product (186), designated PF-25-H and sold under the trade name Perma-Foil from TT America, Portland, Ore., and measuring about 10 inches (254 mm) by about 12 inches (304 mm) with a thickness of about 0.010 inch (0.25 mm), covered the bottom of the inner cavity of the stainless steel container. A titanium sponge material (170), weighing about 20 grams from Chemalloy Company, Incorporated, Bryn Mawr, Pa. and 50 mesh magnesium powder (171), weighing about 2 grams from Alpha Products, Morton Thiokol, Inc., Danvers, Mass., were sprinkled into the stainless steel can (169) around the steel mold (160) and onto the graphite tape product (not depicted in FIG. 18). A sheet of copper foil (172) was placed over the exposed surface of the stainless steel container (169). A nitrogen purge tube (173) was provided in a side wall of the stainless steel container (169). The stainless steel container (169) and its contents were placed into a air atmosphere resistance heated utility furnace. The furnace was ramped from room temperature to about 600° C. at a rate of about 400° C./hour with a nitrogen flow rate of about 10 liters/minute, then from about 600° C. to about 800° C. at a rate of about 400° C./hour with a nitrogen flow rate of about 2 liters/minute. The furnace was held at about 800° C. for about 1.5 hours with a nitrogen flow rate of about 2 liters/minute. The stainless steel can (169) and its contents were removed from the surface and the steel mold (160) was removed from the stainless steel can (169) and the steel mold (160) and its contents were placed on a copper chill plate measuring 6 inches (152 mm) by 6 inches (152 mm) by 1½ inches (38 mm) high to directionally solidify the composite.

Figure 19:
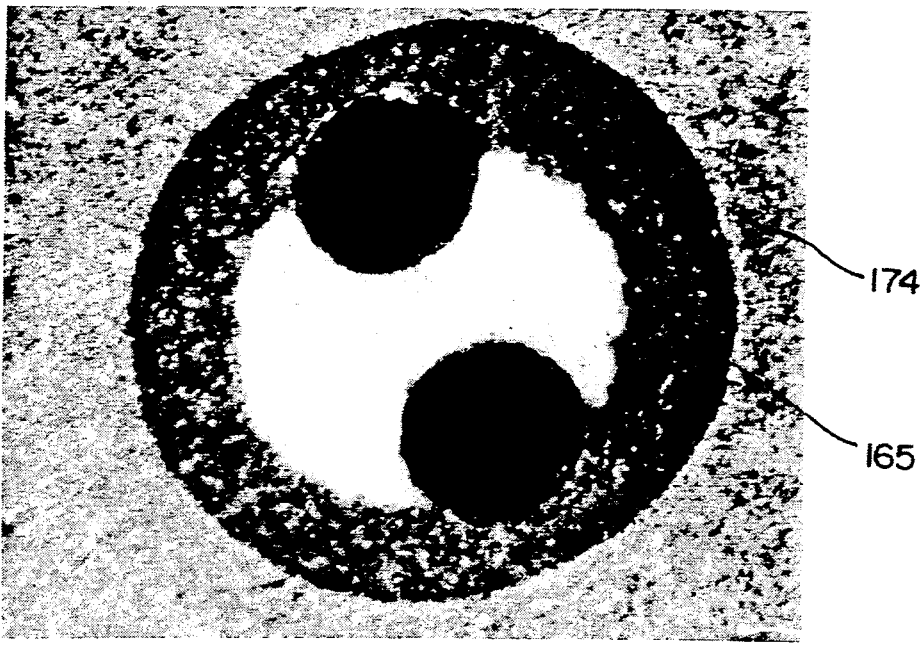
FIG. 19 is a photograph of a section of the macrocomposite produced according to Example 10.

A macrocomposite was recovered from the steel mold (160), the macrocomposite comprising a metal matrix composite plate with seven thermocouple insulating sheaths (165) and (166) integrally bonded and embedded in the metal matrix composite body. Specifically, FIG. 19 shows a photograph taken at 45× of a mullite thermocouple sheath (165) embedded in the metal matrix composite (174). It is clear from the photograph in the metal matrix composite (174). It is clear from the photograph that some chemical reaction has occurred between the mullite sheath (165) and the metal matrix composite (174). Depending upon a particular application, it may be desirable for this chemical reaction to be increased or decreased.

Figure 20:
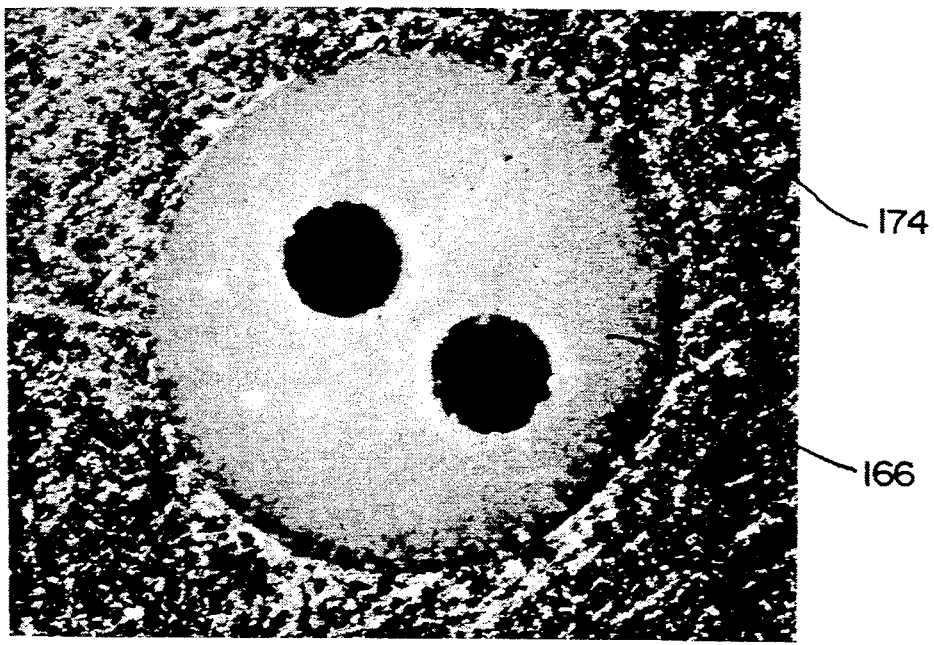
FIG. 20 is a photograph of another section of the macrocomposite produced according to Example 10.

Moreover, FIG. 20 shows a photograph taken at 60× of an alumina thermocouple sheath (166) embedded in the metal matrix composite (174). It is clear from the photograph that the amount of chemical reaction, if any, between the alumina sheath (166) and the metal matrix composite (174) is minimal. Thus, the alumina sheath (166) may be bonded to the metal matrix composite (174) by one or more of a mechanical bond (e.g., shrink or compression fit) and/or a physical bond (e.g., a wetting of the matrix metal from the metal matrix composite (174)).

EXAMPLE 11

The following Example further demonstrates that it is possible to produce by a spontaneous infiltration technique a macrocomposite comprising an electrically insulating ceramic structure embedded in a metal matrix composite and that said embedded structure might be arranged to conform to any specified pattern.

Figure 21:
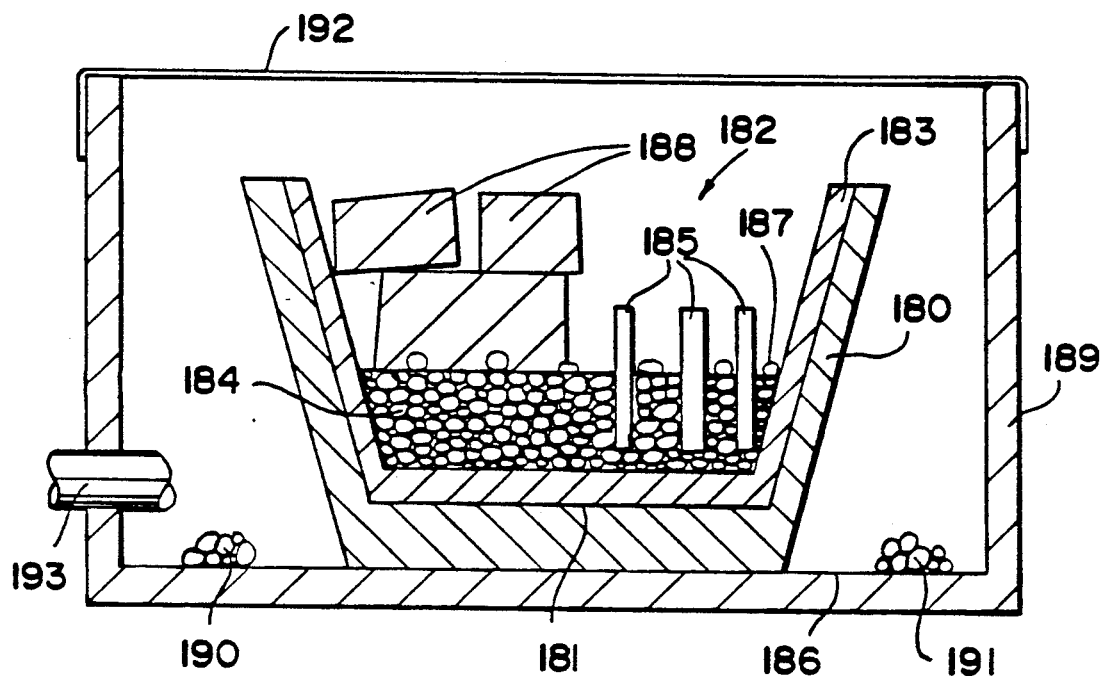
FIG. 21 is a cross-sectional view of the setup utilized to create the macrocomposite produced in Example 11.

As shown in FIG. 21, a mold (180) having a trapezoidal cross-section with a closed end (181) measuring about 3 inches (76 mm)×3 inches (76 mm) and an open end (182) measuring about 3.75 inches (95 mm)×3.75 inches (95 mm) and a height of about 2.5 inches (64 mm) was made from 14 gauge carbon steel. The inner surface of the mold (180) was coated with a graphite mixture comprising about 1.5 parts by volume ethanol from Pharmco Products, Inc., of Bayonne, N.J., and about 1 part by volume DAG-154 colloidal graphite from Acheson Colloids, Port Huron, Mich. At least 3 coats of the graphite mixture were applied with an air brush onto the inner surface of the container to form a coating (183). Each coat of the graphite mixture was permitted to dry before a subsequent coat was applied. The mold was placed into a resistance heated air atmosphere furnace set at about 380° C. for about 2 hours to set the colloidal graphite coating.

A filler material mixture (184) was made by mixing in a plastic jar on a ball mill for approximately 1 hour, approximately 600 grams of a mixture consisting of about 19% by weight 500 grit silicon carbide designated 39 crystolon, 78% by weight 220 grit silicon carbide designated 39 Crystolon, both from the Norton Co. Worcester, Mass., and about 3% by weight −325 mesh magnesium powder from Reade Manufacturing Co., Lakehurst, N.J. This mixing was supplemented by an additional 10 minutes of hand shaking the plastic jar.

The bores of 12 thermocouple insulating sheaths (185) having a length of about 1.5 inches (38 mm) were filled with −325 mesh calcium carbonate from Huber Corporation, Quincy, Ill. Specifically, the bores at both ends of five round double bore thermocouple insulating sheaths (185) or conduits having an outer diameter of about 0.062 inches (1.6 mm) and two inner diameters each about 0.016 inches (0.4 mm) and consisting of MV20 mullite from the McDanel Refractory Corp., Beaver Falls, Pa.; and the bores at both ends of two round double bore thermocouple insulating sheaths (185) or conduits having an outer diameter of about 0.94 inches (2.4 mm) and two inner diameters of about 0.025 inches (0.6 mm) and consisting of 998 alumina from the McDanel Refractory Co., Beaver Falls, Pa.; and the bores at both ends of five round single bore thermocouple insulating sheaths (185) or conduits having an outer diameter of about 0.03 inches (0.79 mm) and inner diameter of about 0.02 inches (0.51 mm) and consisting of about 998 alumina from the McDanel Refractory Co., Beaver Falls, Pa., were jabbed into loose −325 mesh calcium carbonate contained in a dish until about a ¼ inch (6.4 mm) of the bore or bores at each end of the thermocouple sheaths (185) were filled with the calcium carbonate.

A layer of filler material mixture (184) was poured into the bottom of the colloidal graphite coated mold (180) to the depth of about ¾ inch (19 mm). Each of the 12 thermocouple sheaths (185) comprising 5 mullite double bore thermocouple insulating sheaths, 2 alumina double bore insulating sheaths, and 5 single bore alumina insulating sheaths were placed individually into the filler material mixture (184) in a horizontal position. After each thermocouple sheath (185) was placed into the filler material mixture (184) horizontally, the colloidal graphite coated mold containing (180) the filler material mixture (184) was tapped at least twice to settle the filler material mixture (184) around the thermocouple sheath (185). Once all 12 thermocouple sheaths (185) were placed into the filler material mixture (184), the filler material mixture (184) was then partially covered with a layer of 50 mesh magnesium powder (187) from Alfa Products, Morton Thiokol, Inc., Danvers, Mass., which weighed about 0.3 grams. The matrix metal ingots (188) consisting of about 15% by weight silicon and the balance aluminum and weighing about 427 grams were placed on top of the filler material mixture (184) and the layer of magnesium powder (187) within the colloidal graphite coated steel mold (180). The mold (180) and its contents were then placed into an outer carbon steel container (189) measuring about 10 inches wide (254 mm)×12 inches (305 mm) long×10 inches (254 mm) high. A piece of graphite tape product (186), designated PF-25-H and sold under the trade name Perma-Foil from TT America, Portland, Ore., and measuring with 10 inches (254 mm) by about 12 inches (305 mm) with a thickness of about 0.010 inch (0.25 mm), covered the bottom of the inner cavity of the outer carbon steel container (189). A titanium sponge material (190) weighing about 15 grams from Chemalloy Co., Inc. Bryn Mawr, Pa., and 50 mesh magnesium powder (191), weighing about 4 grams from Alfa Products, Morton Thiokol, Danvers, Mass., were sprinkled into the outer carbon steel container (189) around the colloidal graphite coated steel mold (180) and on the graphite tape product (186). A sheet of copper foil (192) was placed over the exposed surface of the outer carbon steel container (189). A nitrogen purge tube (193) was provided in a side wall of the carbon steel outer container (189). The copper foil (192) covered outer steel container (189) and its contents were placed into a Lindberg resistance heated utility furnace. The furnace was ramped from room temperature to about 600° C. at a rate of about 800° C. per hour with a nitrogen flow rate of about 10 liters per minute, then from about 600° C. to about 800° C. at a rate of about 600° C. per hour with a nitrogen flow rate of about 3 liters per minute. The furnace was held at about 800° C. for about 2 hours with a nitrogen flow rate of about 3 liters per minute. The outer carbon steel container (189) and its contents were removed from the furnace and the colloidal graphite coated steel mold (180) was removed from the outer carbon steel container (189) and then the colloidal graphite coated steel mold (180) and its contents were placed on a room temperature copper chill plate measuring about 6 inches (152 mm)×6 inches (152 mm)×1.5 inches (38 mm) high to directionally solidify the composite.

Figure 22A:
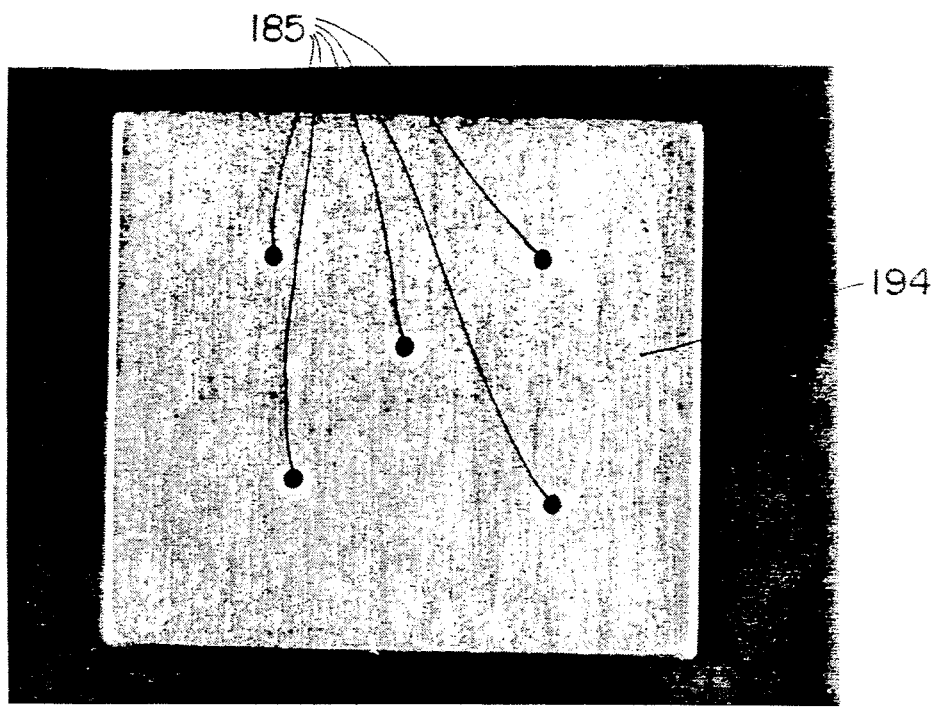
FIG. 22A is a photograph taken at 10× magnification of the macrocomposite produced in accordance with Example 11.
Figure 22B:
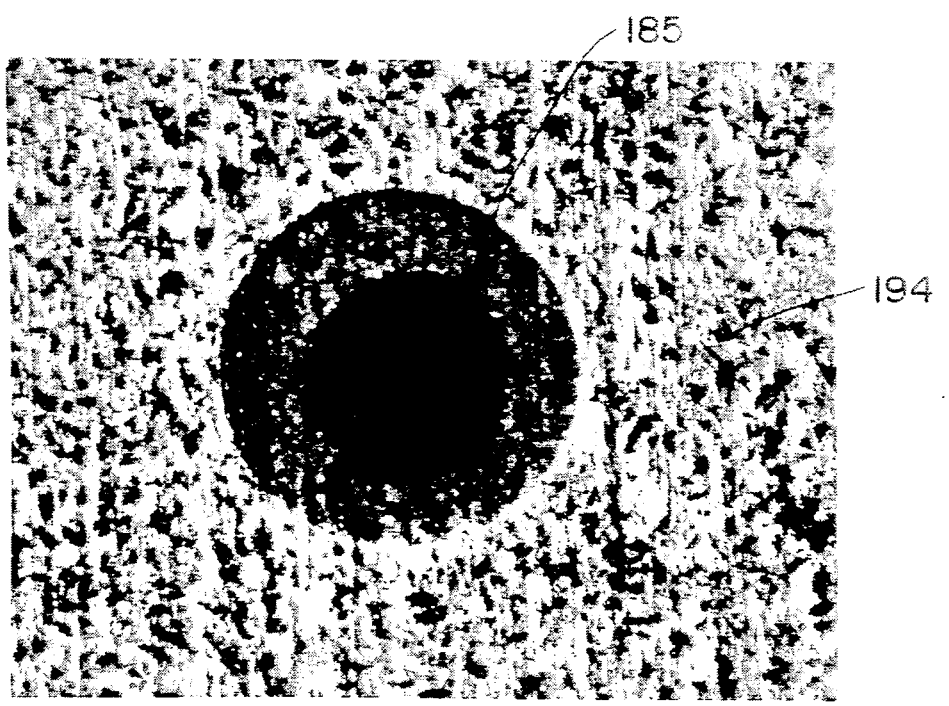
FIG. 22B is a photograph taken at 50× magnification of a portion of the macrocomposite produced in accordance with Example 11.

A macrocomposite was recovered from the colloidal graphite coated steel mold, the macrocomposite comprising a metal matrix composite plate with 12 thermocouple insulating sheaths (185) and integrally bonded and embedded in the metal matrix composite body. Specifically, FIG. 22A shows a photograph taken at about 10× magnification of 5 alumina thermocouple sheaths (185) embedded in the metal matrix composite body (194). Moreover, FIG. 22B shows a photograph taken at about 50× of a single alumina thermocouple sheath (185) embedded in the metal matrix composite body (194). Thus, the alumina sheath may be bonded to the metal matrix composite by one or more of a chemical bond (e.g., shrink or compressor fit) and/or for physical bond (e.g., a wetting of the matrix metal from the metal matrix composite) and the embedded structure may be arranged to conform to any specified pattern.

EXAMPLE 12

The following Example further demonstrates that it is possible to produce by a spontaneous infiltration technique a macrocomposite body comprising a metal matrix composite box with an aluminum rich edge around perimeter thereof.

A setup similar to that shown in FIG. 16 was utilized. Specifically, rectangular mold having a wall thickness of about 0.25 inches (6.4 mm) and an inner cavity measuring about 2 inches (51 mm) in length, about 1 inch (25 mm) in width and about 0.875 inches (22 mm) deep, was made from a solid piece of ATJ Graphite from Union Carbide Corp. A graphite insert measuring about 1.875 inches (48 mm) long, about 0.85 inches (22 mm) wide and about 0.312 inches (7.9 mm) high was placed into the bottom of the graphite mold such that an about 0.312 inch (7.9 mm deep, and about 0.063 inch (1.6 mm) wide channel was created along the perimeter of the insert and the inside wall of the rectangular mold. The mold and the insert were then sprayed with 2 coats of a mixture consisting of 1.5 parts by weight alcohol and 1 part by weight DAG-154 Colloidal Graphite from Atcheson Colloids, Port Huron, Mich. The spray coated mold was then placed into an air atmosphere oven set at about 380° C. for about 2 hours. A gasket was electrical discharge machined from an ingot of 6061 aluminum alloy to the dimensions of about 1.99 inches (51 mm) by 0.99 inch (23 mm) by about 0.40 inch (10 mm) thick having a wall thickness of about 0.05 inch (1.3 mm) such that it substantially completely surrounded the graphite insert.

A filler material was made by mixing in a plastic jar on a ball-mill for approximately 1 hour approximately 600 grams of 220 grit 39 Crystolon silicon carbide from Norton Co., Worcester, Mass. and about 3 percent by weight −325 mesh magnesium powder from Atlantic Equipment Engineers, Bergenfield, N.J. This mixing was supplemented by an additional 10 minutes of hand shaking in the plastic jar.

About 16 grams of filler mixture were poured into the bottom of the graphite mold and into the channel, thereby covering the aluminum gasket and the graphite insert. The filler material mixture was thereafter leveled within the mold. The filler material mixture was then partially covered with a layer of 50 mesh magnesium powder from Alpha Products, Morton Thiokol, Inc., Danvers, Mass., weighing about 2 grams. Matrix metal ingots consisting of about 15 percent by weight silicon and the balance aluminum and weighing about 39.7 grams, were placed on the filler material mixture and the layer of magnesium powder within the graphite mold. The mold and its contents were then placed onto an approximately 2 inch (51 mm) by 5 inch (127 mm) by 1 inch (25 mm) fire brick inside a stainless steel container measuring approximately 7 inches (178 mm) wide, 3.5 inches (83 mm) long, and 5 inches (127 mm) high. A piece of graphite tape product, designating PF-25-H and sold under the trade name Perma-foil from TT America, Portland, Ore., and measuring about 7 inches (178 mm) by about 3.25 inches (8.3 mm) with a thickness of about 0.010 inch (0.25 mm), covered the bottom of the inner cavity of the stainless steel container. A titanium sponge material weighing about 2 grams from Chemalloy Co., Inc. Bryn Mawr, Pa., and 50 mesh magnesium powder, weighing about 2 grams from Alpha Products, Morton Thiokol, Inc., Danvers, Mass. were sprinkled into the bottom of the stainless steel container around the fire brick and onto the graphite tape product. A sheet of copper foil was placed over the openings of the stainless steel container so as to form an isolated chamber. A nitrogen purge tube was provided into the sidewall of the stainless steel container. The stainless steel container and its contents were placed into a Unique brand air atmosphere resistance heated utility furnace. The furnace was ramped from room temperature to about 600° C. at a rate of about 400° C. per hour with a nitrogen flow rate of about 3 liters per minute. Thereafter, the furnace was heated from about 600° C. to about 800° C. at a rate of about 400° C. per hour with a nitrogen flow rate of about 1 liter per minute. The furnace was held at about 800° C. for about 3 hours with the nitrogen flow rate of about 1 liter per minute. The stainless steel container and its contents were removed from the furnace and the graphite mold and its contents were placed upon a water cooled aluminum chill plate, which was at room temperature to directionally solidify the composite.

Figure 23A:
FIG. 23A is a photograph of a cross-section of the macrocomposite produced according to Example 12.
Figure 23B:
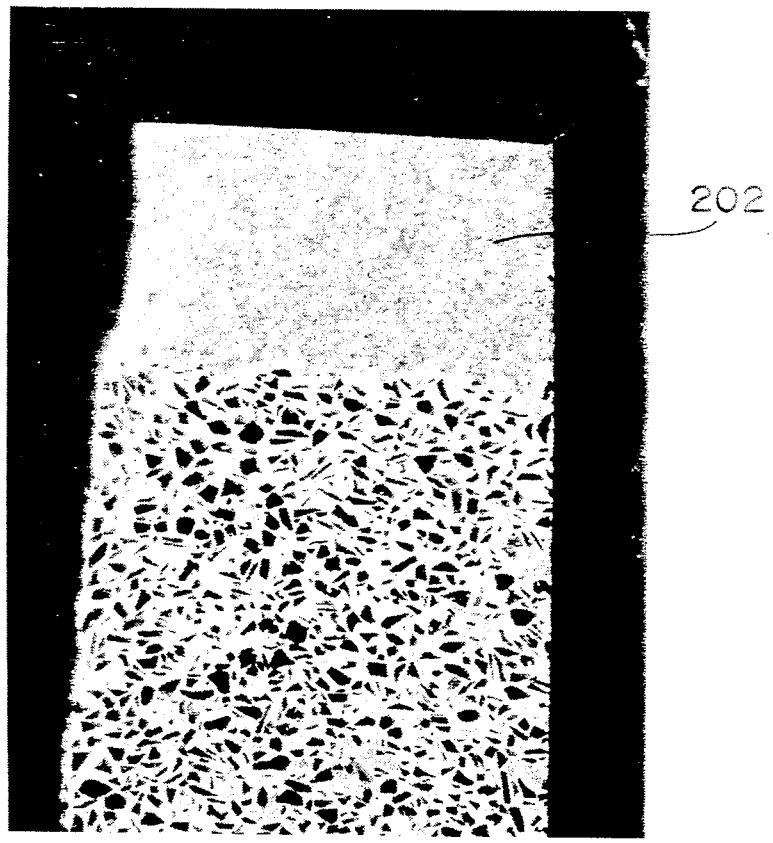
FIG. 23B is a photograph taken at 50× of a portion of the macrocomposite formed in accordance with Example 12.

A macrocomposite was recovered from the graphite mold, the macrocomponents comprising a thin walled metal matrix composite box with an integrally bonded aluminum lip located around the perimeter of the top edge of the box. Specifically, FIG. 23A, taken at about 1.5×, shows a cross-section of the macrocomposite box (201) with the metal lip (202) located at the top of the box. Further, FIG. 23B taken at about 50×, shows a higher magnification of the metal lip (202) bonded to the top of the box.

EXAMPLE 13

The following Example demonstrates that it is possible to produce by the spontaneous infiltration technique a macrocomposite comprising a metal matrix composite box with an electrically insulating ceramic structure embedded in the metal matrix composite box.

A rectangular mold having a wall thickness of about 0.25 inches (6.4 mm) and an inner cavity measuring about 2 inches (51 mm) in length and about 1 inch (25 mm) in width and about 0.750 inches (19 mm) deep was made from a solid piece of Grade ATJ Graphite from Union Carbide Corp., having a cavity into which a graphite insert could be emplaced. A graphite insert measuring approximately 1.8 inches (46 mm) long, 0.88 inches (22 mm) wide, and 0.31 inches (7.9 mm) high was placed into the bottom of the graphite mold such that an approximately 0.31 inch deep (7.9 mm) and about 0.063 inch (1.6 mm) wide channel was created along the perimeter of the insert and the inside wall of the rectangular mold. The mold and the insert were then sprayed with 2 coats of a mixture consisting of about 1.5 parts by weight of DAG-154 Colloidal Graphite from Atcheson Colloids Co., Port Huron, Mich. The mold was heated to about 380° C. for about 2 hours in an air oven to set spray-coated mixture on the mold.

The holes of a round double-bore thermocouple insulating sheath were closed with DAG-154 colloidal graphite. Specifically, a round double bore thermocouple insulating sheath or conduit, having an outer diameter of about 0.094 inches (24 mm) and two inner diameters each of about 0.025 inch (0.064 mm) and consisting of 998 alumina from McDanel Refractory Co., Beaver Falls, Pa., was packed with the DAG-154 Colloidal Graphite. The packed rod was fired at about 380° C. for about 2 hours. Then the graphite packed round double bore insulating sheath was inserted into a hole in one side of the graphite insert within the graphite mold.

A filler material was made by mixing in a plastic jar on a ball-mill for approximately 1 hour approximately 600 grams of a mixture consisting of about 19 percent by weight 500 grit 39 Crystolon silica carbide, about 78 percent by weight 220 grit 39 Crystolon silicon carbide both from the Norton Co. and about 3 percent by weight $-325$ mesh magnesium powder from Atlantic Equipment Engineers, Bergenfield, N.J. The mixing was supplemented by an additional 10 minutes of hand shaking in the plastic jar.

About 13.7 grams of the filler material were poured into the bottom of the graphite mold and into the channel, thereby covering the round double bore thermocouple insulating sheath or conduit, and the graphite insert. The filler material mixture was thereafter leveled within the mold. The filler material mixture was then partially covered with a layer of 50 mesh magnesium powder from Alpha Products, Morton Thiokol, Inc., Danvers, Mass., weighing about 0.12 gram. Matrix metal ingots consisting of about 15 percent by weight silicon and the balance aluminum and weighing about 24.7 grams were placed on top of the filler material mixture and the layer of the magnesium powder within the graphite mold. The mold and its contents were then placed onto the approximately 2 inch (31 mm) by 5 inch (127 mm) by 1 inch (25 mm) fire brick inside a stainless steel container measuring approximately 7 inches (178 mm) wide, 3.25 inches (8.3 mm) long, and 5 inches (127 mm) high. A piece of graphite tape product, designated PF-25-H and sold under the trade name Perma-foil from TT America, Portland, Ore., and measuring about 7 inches (178 mm) by about 3.25 inches (8.3 mm) with a thickness of about 0.010 inch (0.25 mm), covered the bottom of the inner cavity of the inner cavity of the stainless steel container. A titanium sponge material weighing about 2 grams from Chemalloy CO., Inc. Bryn Mawr, Pa., and 50 mesh magnesium powder, weighing about 2 grams from Alpha Products, Morton Thiokol, Inc., Danvers, Mass., were sprinkled into the stainless steel can around the fire brick onto the graphite tape product. A sheet of copper foil was placed over the opening of the stainless steel container so as to form an isolated chamber. A nitrogen purge tube was provided in a sidewall of the stainless steel container. The stainless steel container and its contents were placed into a Unique brand air atmosphere resistance heated utility furnace. The furnace was ramped from room temperature to about 600° C. at a rate of about 400° C. per hour with a nitrogen flow rate of about 3 liters per minute. Thereafter, the furnace was heated from about 600° C. to about 800° C. at a rate of about 400° C. per hour with a nitrogen flow rate of about 1 liter per minute. The furnace was held at about 800° C. for about 2 hours with a nitrogen flow rate of about 1 liter per minute. The stainless steel container and its contents were removed from the furnace and the graphite mold and its contents were placed upon a water cooled aluminum chill plate which was at room temperature, to directionally solidify the composite.

A macrocomposite was recovered from the graphite mold, the macrocomposite comprising a thin walled metal matrix composite box with a integrally bonded round double bore thermocouple sheath or conduit at one end and through the wall of the box. The residual matrix metal from the spontaneous infiltration was removed in a cutting operation with a diamond saw, and the bottom portion of the metal matrix composite box was machined in preparation for plating.

To prepare the metal matrix composite box for plating, the box was degreased in an acetone bath and then an ultrasonic bath of ethanol. The macrocomposite box was zinc plated according to ASTM Method B 253-83, "Standard Practice for Preparation of Aluminum Alloys for Electroplating". This process included conditioning the metal matrix composite in a 2.5 percent sodium hydroxide solution at about 20° C. from about 30 seconds followed by a tap water rinse, cleaned for about 15 seconds in a 75 percent by volume HNO3 bath containing about 120 grams per liter ammonium difluoride held at about 20° C., deoxidizing for about 3 seconds in a 75:25 solution of concentrated sodium hydroxide:sodium fluoride at about 20° C. The metal matrix composite box was then rinsed with tap water, dipped into a zincate bath at about 20° C. for about 1 minute, rinsed with tap water, dipped into a zincate coating in a 50 volume percent nitric acid at about 20° C. for about 30 seconds, rinsed with tap water, and again dipped into a zincate bath for about 1 minute at about 20° C. The macrocomposite box was rinsed with deionized water, and air dried, thus resulting in a zinc coating.

The macrocomposite box was then nickel plated in a plating bath sold under the trademark Barret SN® sulfamate nickel plating process from Witco Corporation Product, Melrose Park, Il. Two nickel plates having dimensions of about 12 inches (305 mm) long, 1 inch (25 mm) wide, and 0.25 inch (6.4 mm) thick were connected to the positive terminal of a direct current powder supply and placed on opposite sides of the bath to become the collective anode of the electrical circuit. The metal matrix composite box was connected to the negative terminal of the direct current power supply to become the cathode of the electrical circuit. Before the metal matrix composite box cathode was placed into the plating both, the current and voltage of the power supply were set and the power supply were energized. The bath conditions were a temperature of about 55° C., a current density of about 50 amps per square foot and mechanical stirring. The plating time was approximately 1 hour and the rack supporting the macrocomposite box was turned after about 30 minutes. Following the 1 hour treatment, the metal matrix composite box was first rinsed with tap water, then deionized water and air dried, to result in a nickel coating.

Figure 24:
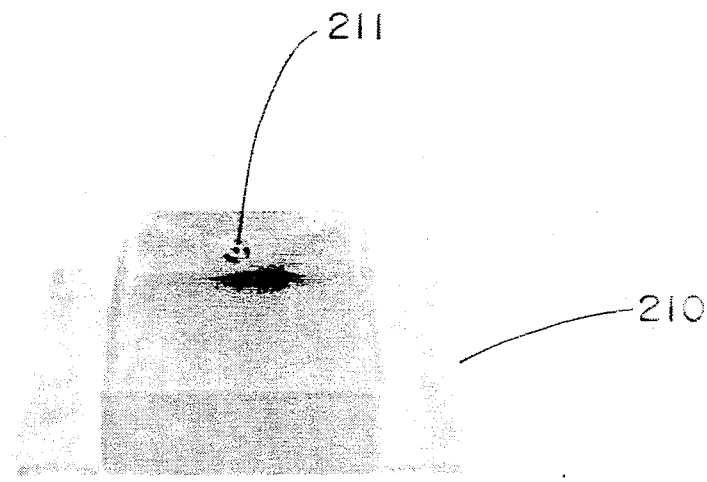
FIG. 24 is a photograph of a top view of the macrocomposite produced according to Example 13.

In a final step, the metal matrix composite box was gold plated in a plating bath from Sel-Rex Company sold under the trademark Pure-A-Gold 125. The bath conditions were a temperature of about 60° C, a plating current of about 1 amp per square foot and mechanical stirring. The anode in the bath was a platinum clad niobium. The plating time was about 20 minutes and the rack supporting the component was turned after about 10 minutes. Once removed from the bath, the gold plated metal matrix composite box was rinsed with deionized water and rinsed in an ethanol. Finally, the component was hung to dry in a static air oven set at about 110° C. This produced a substantially flawless macrocomposite box. Specifically, FIG. 24, taken about 1.7× shows the macrocomposite box (210) with the round double bore insulating conduits (211) in the side of the box.

EXAMPLE 14

The following Example demonstrates that it is possible to machine a metal matrix composite box produced by a spontaneous infiltration technique.

A rectangular shaped mold was formed from substantially the same material and with substantially the same dimensions as the mold in Example 12.

A filler material was made by mixing in a plastic jar on a ball-mill for approximately 1hour approximately 600 grams of a mixture consisting of about 19 percent by weight of 500 grit 39 Crystolon silica carbide and about 78 percent by weight 220 grit 39 Crystolon silicon carbide both from the Norton Co., Worcester, Mass., and about 3 percent by weight −325 mesh powder from Atlantic Equipment Engineers, Bergenfield, N.J. This mixing was supplemented by an additional 10 minutes of hand shaking of the plastic jar.

About 14 grams of the filler material was poured into the bottom of the graphite mold and into the channel, thereby covering the graphite insert. The filler material mixture was thereafter leveled within the mold. The filler material mixture was then partially covered with a layer of 50 mesh magnesium powder from ALFA ® Products, Morton Thiokol, Inc., Danvers, Mass., weighing about 2 grams. Matrix metal ingots consisting of about 15 percent by weight silicon and the balance aluminum and weighing about 25 grams were placed on top of the filler material mixture and the layer of the magnesium powder within the graphite mold. The mold and its contents were then placed onto about a 2 inch (51 mm) by about 5 inch (127 mm) by about 1 inch (25 mm) fire brick inside. a stainless steel container measuring approximately 7 inches (178 mm) wide, 3.25 inches (8.3 mm) long, and 5 inches (127 mm) high. A piece of graphite tape product, designated PF-25-H and sold under the trade name Perma-foil from TT America, Portland, Ore., and measuring about 7 inches (178 mm) by about 3.25 inches (8.3 mm) with a thickness of about 0.010 inch (0.25 mm), covered the bottom of the inner cavity of the inner cavity of the stainless steel container. A titanium sponge material weighing about 2 grams from Chemalloy Co., Inc., Bryn Mawr, Pa., and 50 mesh magnesium powder, weighing about 2 grams from Alpha Products, Morton Thiokol, Inc., Danvers, Mass., were sprinkled into the stainless steel container around the fire brick onto the graphite tape product. A sheet of copper foil was placed over the opening of the stainless still container so as to form an isolated chamber. A nitrogen purge tube was provided in a wall of the stainless steel container. The stainless steel container and its contents were placed into a Unique brand air atmosphere resistance heated utility furnace. The furnace was ramped from room temperature to about 600° C. at a rate of about 400° C. per hour with a nitrogen flow rate of about 3 liters per minute. Thereafter, the furnace was heated from about 600° C. to about 800° C. at a rate of about 400° C. per hour with a nitrogen flow rate of about 1 liter per minute. The furnace was held at about 800° C. for about 2 hours with a nitrogen flow rate of about 1 liter per minute. The stainless steel container and its contents were removed from the furnace and the graphite mold and its contents were placed under a water cooled aluminum chill plate which was at room temperature, to directionally solidify the composite. .

A metal matrix composite box was recovered from the graphite mold, with residual matrix metal attached to it. The residual matrix metal was cut from the metal matrix composite box and new surface machined to prepare the box for plating. Prior to plating, two holes were drilled into the sidewall of the metal matrix composite box. Holes were also drilled into the two flanges on opposite ends of the metal matrix composite box that formed a means of mounting the box to a substrate. The metal matrix composite box was then plated by the method described above in Example 13.

Figure 25:
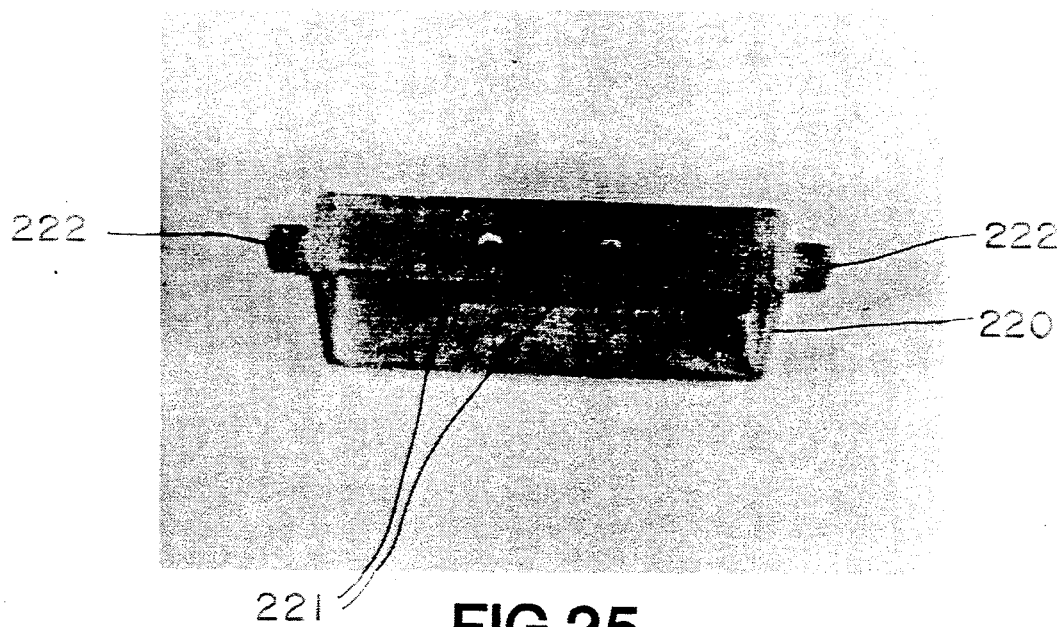
FIG. 25 is a photograph of the macrocomposite produced according to Example 13.

Specifically, FIG. 25 is a photograph which shows the metal matrix composite formed box in accordance with this Example. The Figure shows machined holes (221) located in the sidewall of the macrocomposite box (220) and machined holes (222) in the flanges located at the base of the box (220) for fastening the box to a substrate.

EXAMPLE 15

The following Example demonstrates that it is possible to produce by a spontaneous infiltration technique a metal matrix composite box having a plurality of chambers.

An electronic package prototype was machine from an aluminum bock to final dimensions of about 1 inch (25 mm) high, 2.2 inches (25 mm) long, and 1 inch (25 mm) wide with two adjacent chambers measuring about 0.26 inches (6.6 mm) deep and having dimensions of about 0.65 by 0.9 inches (16.5 by 23 mm) and 1.2 inches by 0.9 inches (31 by 23 mm). The electronic package prototype was set into a clay base and surrounded by a cylindrical plastic frame. Approximately 100 grams of GI 1000 rubber molding compound from Plastic Tooling Supply Co. was mixed, vacuum degassed and poured over the pattern to fill the outer frame. Once the rubber mold had set (about 12 hours), the aluminum pattern was removed from the rubber mold and ready for remolding.

To obtain a wax pattern of the electronic package, molten green wax (at about 110° C.) manufactured by Yates Co. was poured into a rubber mold which had been preheated for about 1 hour to about 75° C. The rubber mold was vibrated during the pouring of the molten wax so as to aid in the infiltration of the 0.05 inch (1.3 mm) channels. At the same time, a hot air gun was used to keep the wax molten and to blow it into the cavities. Following solidification, the wax pattern was removed from the rubber mold and was attached to one end of a wax reservoir. A steel threaded rod was attached to the wax reservoir on the end opposite the wax pattern.

The wax pattern was used to form a investment shell by immersing it into a primary slurry comprising 1 part water, 1.2 parts Nyacol 43 AT colloidal silica and 4.2 parts −325 calcium carbonate. After dipping, the part was allowed to drain for approximately 15 seconds and a −90 grit silica sand stucco designated RANCO-SIL TM A from Ransom and Randolph was applied thereto. This stucco was allowed to dry for approximately 2 to 3hours after which the stucco part was dipped into a colloidal silica (Nyacol 1430 AT) for about 60 seconds to bind the 90 grit silica sand stucco. A second slurry comprising 1 part colloidal silica and 1.8 parts RANCO-SIL TM 2 powder was used to form the remaining 7 investment shell secondary layers, which were built-up by dipping, stuccoing and drying. A re-dip indicator supplied by Ransom and Randolph changed from green-yellow to bright orange when each investment shell secondary layer was dry. The investment shell was frozen at −18° C. for about 2 hours. The shell was steam autoclaved at about 166° C. at about 90 psi for about 4 minutes. The shell was then prefired in a Lindbergh side by side resistance heated air atmosphere furnace for about 6 hours at about 800° C. to burn off residual wax and drive off any residual water in the calcium carbonate shell. The shell was allowed to cool to room temperature.

A filler material was made by mixing in a plastic jar on a ball-mill for approximately 1 hour approximately 600 grams of a mixture consisting of about 78 percent 220 grit silicon carbide designated 39 Crystolon from the Norton Co., 19 percent 500 grit silicon carbide, again from the Norton Co., and 3 weight percent −325 mesh magnesium powder from Reade Manufacturing Co. This mixing was supplemented by an additional 10 minutes of hand shaking the plastic jar.

About 15.1 grams of filler material was poured into the bottom of the investment shell and into the channel. The filler material mixture was thereafter leveled within the shell. The filler material mixture was then partially covered with a layer of 50 mesh magnesium powder from Aesar, Johnson Matthey Co., Seabrook, N.H., weighing about 0.04 grams. Matrix metal ingots consisting of about 15 percent by weight silicon and the balance aluminum and weighing about 83 grams were placed on top of the filler material mixture and on the layer of magnesium powder, within the shell. The shell and its contents were then placed into a stainless steel container measuring about 12 inches (305 mm) wide by 10 inches (254 mm) long by 8 inches (203 mm) high. A piece of graphite tape product, designated PF-25-H and sold under the trade name Perma-foil from TT America, Portland, Ore., and measuring about 12 inches (305 mm) by about 10 inches (254 mm) with a thickness of about 0.01 inch (0.25 mm) covered the bottom of the inner cavity of the stainless steel container. A titanium sponge material, weighing about 2 grams from Chemalloy Co., Inc., Bryn Mawr, Pa., and 50 mesh magnesium powder, weighing about 2 grams, from Alpha Products, Morton Thiokol, Danvers, Mass., were sprinkled into the stainless steel container around the shell onto the graphite tape product. A copper sheet foil was placed over the opening of the stainless steel container so as to form an isolated chamber. A nitrogen purge tube was placed in a sidewall of the stainless steel container. The stainless container and its contents were placed into a air atmosphere resisted heated utility furnace. The furnace was ramped from room temperature to about 600° C. at a rate of about 600° C. per hour with a nitrogen flow rate of about 10 liters per minute. Thereafter, the furnace was heated from about 600° C. to about 780° C. at a rate of about 600° C. per hour with a nitrogen flow rate of about 3 liters per minute. The furnace was held at about 780° C. for about 3 hours with a nitrogen flow rate of about 3 liters per minute. The stainless steel container and its contents were removed from the furnace and the shell and its contents were placed on a water cooled aluminum chill plate which was at room temperature to directionally solidify the composite. Ceramic fiber blanket (a amorphous alumina silicate) was placed on the top of the about 2 inches (51 mm) thick shell in order to assist in the directional solidification process.

Figure 26:
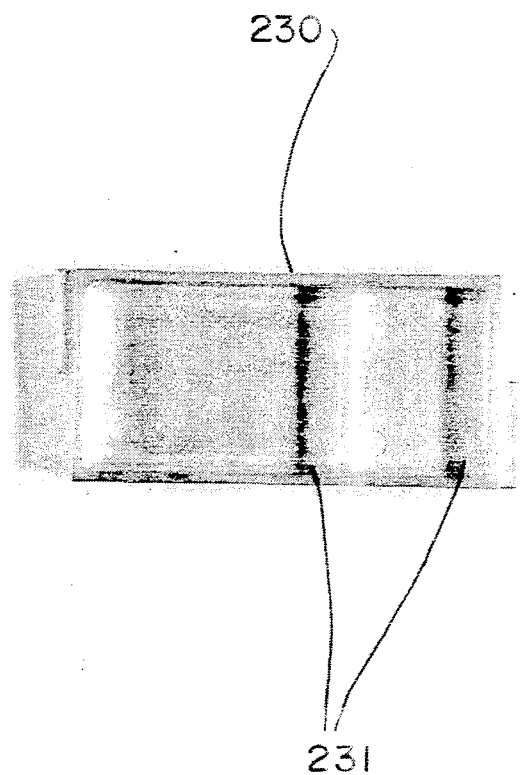
FIG. 26 is a photograph of the macrocomposite produced in accordance with Example 15.

The shell was sandblasted away to reveal a metal matrix composite box with a plurality of chambers. The residual matrix metal was diamond from the metal matrix box and the box was machined in preparation for plating. The procedure described in Example 13 was followed in order to plate the metal matrix composite box. FIG. 26 shows a metal matrix composite box (230) with a plurality of chambers (231) that was gold plated by the procedure in Example 13.

EXAMPLE 16

The following example demonstrates that it is possible to produce by the spontaneous infiltration technique a macrocomposite comprising a metal matrix composite plate with a deposited metallic coating on its surface. A metal matrix composite body measuring about 5 inches long by about 5 inches wide by about 0.5 inch thick (127 mm × 127 mm × 12.7 mm) was made substantially by the method of Example 13, except that no thermocouple sheaths were incorporated within the metal matrix composite body, the filler material was dried in a vacuum oven at about 150° C. for about 12 hours prior to placing in the colloidal graphite coated mold, the graphite mold had been coated three times with the colloidal graphite spray, and the matrix metal comprised by weight of about 12.0 percent silicon, 2.0 percent nickel, 1.0 percent copper and the balance aluminum.

The metal matrix composite body was cut with a diamond saw and surface ground to produce a plate measuring about 3 inches long by about 2 inches wide by about 0.04 inch thick (76 mm × 51 mm × 1.0 mm) and having at each of the corners of the plate a hole measuring about 0.125 inch (3.2 mm) in diameter located about 0.125 inch (3.2 mm) from both ends at the corner.

The metal matrix composite plate was submerged and degreased in an ultrasonically agitated acetone bath ranging in temperature from about 20° C. to about 30° C. for about 10 minutes, then in an ultrasonically agitated ethanol bath ranging in temperature from about 25° C. to about 30° C. for about 10 minutes. The plate was removed from the ethanol bath and dried with clean compressed air.

The metal matrix composite plate was then conditioned in an approximately 15 volume percent $H_2SO_4$-aqueous bath at about 80° C. for about 3 minutes. After about 3 minutes, the plate was removed to cascading tap water to rinse any residual $H_2SO_4$ solution from the plate and cool the plate. The metal matrix composite plate was subsequently conditioned in a bath comprising about 100 grams of NIKLAD TM multi-prep [520] 502 (Witco Chemical Corporation, Melrose Park, Ill.) acid pickle, descaler and desmutter per liter of concentrated $HNO_3$ at a temperature about 22° C. to about 30° C. for about 30 seconds and immediately rinsing in cool cascading tap water.

The metal matrix composite plate was then submerged in an about 10% by volume NIKLAD TM 261 pre-catalyst sensitizer-aqueous bath at a temperature from about 22° C. to about 30° C. for about 1 minute and immediately rinsed in cool cascading tap water and then submerged in an ultrasonically agitated deionized water bath for about 5 minutes and again rinsed in cool cascading tap water.

The metal matrix composite plate was then dipped in a 10% by volume NIKLAD TM 262 catalyst-aqueous bath at a temperature from about 45° C. to about 50° C. for about 3 minutes and rinsed in cool cascading tap water and then submerged in an ultrasonically agitated deionized water bath for about 5 minutes and again rinsed in cool cascading tap water.

An electroless nickel plating was then formed on the metal matrix plate by submerging the plate in a bath comprising by volume about 8.5% NIKLAD TM 1000A nickel source/replenisher about 15% NIKLAD TM 1000B complexer/buffer and the balance deionized water at about 90°·C. for about 25 minutes to produce a nickel plating thickness of about 340 micro inches (measured with a beta-backscatter thickness meter, model TC2600, Twin City International, Inc., Tonawanda, N.Y.). The nickel plated metal matrix plate was dried with cleaned compressed air.

In a final step, the nickel plated metal matrix plate was gold plated in a plating bath from SEL-REX ® Corporation, Nutley, N.J. sold under the trade name SEL-REX ® NUTRONICS ® 309 gold electroplating process. The bath was at a temperature of about 55° C. to about 65° C., a plating current density of about 3 [amps] amperes per square foot and mechanical stirring. The anode in the bath was platinum clad neobium. The plating time was about 24 minutes and the rack supporting the component was turned after about 12 minutes. Once removed from the bath, the gold-nickel plated metal matrix composite plate was rinsed with deionized water and then with ethanol. This revealed a macrocomposite had been formed comprising a metal matrix plate coated with an about 340 micro inch ($8.6 \times 10^{-3}$ mm) coating of electroless nickel and about 109 micro inch ($2.8 \times 10^{-3}$ mm) coating of gold.

EXAMPLE 17

The following example demonstrates that it is possible to produce by the spontaneous infiltration technique a macrocomposite comprising a metal matrix composite box having a metal lip along the perimeter of the box opening and a deposited metallic coating.

The method of Example 13 was substantially repeated to produce a metal matrix composite box having outer dimension of about 3.5 inches long by about 0.88 inch wide by about 0.25 inches deep (89 mm×22 mm×6.4 mm) with an inner chamber of about 3.0 inches long by about 0.81 inches wide by about 0.06 inches deep (76 mm×15 mm×1.5 mm), except that the matrix metal comprised by weight of about 12.0 percent silicon, 2.0 percent nickel, 1.0 percent copper, and the balance aluminum, the graphite mold was coated five times with the colloidal graphite spray, no thermocouple sheaths were incorporated into the metal matrix box, the filler material was dried in a vacuum oven for about 12 hours at about 150° C. and −325 mesh alumina alloy powder comprised by weight of about 7.5-8.5% Si, 3.0-4.0% Cu, 2.7-3.5% Zn, 0.20-0.30% Mg, 0.7-1.0% Fe, ≦0.5% Mn, ≦0.35% Sn, ≦0.01 Cu, ≦0.10% Ti, ≦0.15% Pb and the balance aluminum was placed in a channel defined by the graphite insert and the graphite mold to form a metal lip around the perimeter of the metal matrix composite box opening.

The plating method of Example 16 was substantially repeated to form a metal deposited coating on the metal matrix composite box, except that the gold plating step was replaced with a tin plating step essentially consisting of submerging the nickel-plated metal matrix box in a bath comprising by volume about 0.88% CEIL-MATTE Sn make-up (Witco Chemical Corporation, Melrose Park, Ill.), 2.2% CEIL-MATTE Sn PRIMIS, 8.8% chemical purity $H_2SO_4$, 88.0% deionized water, and stannous sulfate in an amount of about 0.112 kg stannous sulfate per liter of mixture. A tin plate having dimensions of about 12 inches (305 mm) long, 1 inch (25 mm) wide, and about 0.5 inch (13 mm) thick was connected to the positive terminal of a direct current power supply and placed in the bath to become the anode of the electrical circuit. The nickel plated metal matrix composite box was connected to the negative terminal of the direct current power supply to become the cathode of the electrical circuit. Before the nickel plated composite box was placed into the plating bath, the current and voltage of the power supply were set and the power supply was energized. The bath was operated at a temperature from about 20° C. to about 35° C. with a current density of about 10 amps per square foot for about 30 minutes. A tin-nickel plated metal matrix composite box with a metal lip at the perimeter of the box opening was recovered from the bath.

EXAMPLE 18

The following example further demonstrates that it is possible to produce by a spontaneous infiltration technique a macrocomposite comprising a metal matrix composite box with a deposited metallic coating on the surface.

The method of Example 17 was substantially repeated to form a metal matrix composite box having an outer dimensions of about 2 inches long by about 1 inch wide by about 0.37 inches deep (51 mm×25 mm×9 mm) and an inner cavity having dimensions of about 1.8 inches long by about 0.88 inches wide by about 0.31 deep (46 mm×22 mm×8 mm).

The plating method of Example 16 was substantially repeated to plate the metal matrix composite box with nickel and gold, except that after the electroless-nickel plating step, the nickel plated metal matrix composite box was further plated with an electro-nickel plating process comprising a bath of Barret SN ® sulfamate nickel plating process performed at about 10 amperes per square foot for about 15 minutes at bout 60° C., with mechanical agitation during the plating. After the metal matrix composite box was rinsed in cool cascading tap water, the metal matrix composite was again nickel plated in the electroless-nickel plating bath for about 10 minutes, as described in Example 16. The nickel plated metal matrix composite box was subsequently gold plated in a manner substantially the same as the plating technique in Example 16.

The above steps produced a macrocomposite body comprising a metal matrix composite box having thereon a series of layers comprising electroless-nickel, electro-nickel, electroless-nickel and gold.

EXAMPLE 19

The following Example further demonstrates that it is possible to produce by a spontaneous infiltration technique a macrocomposite body comprising an open-ended metal matrix composite box with electrical feed-throughs incorporated therein.

Figure 27A:
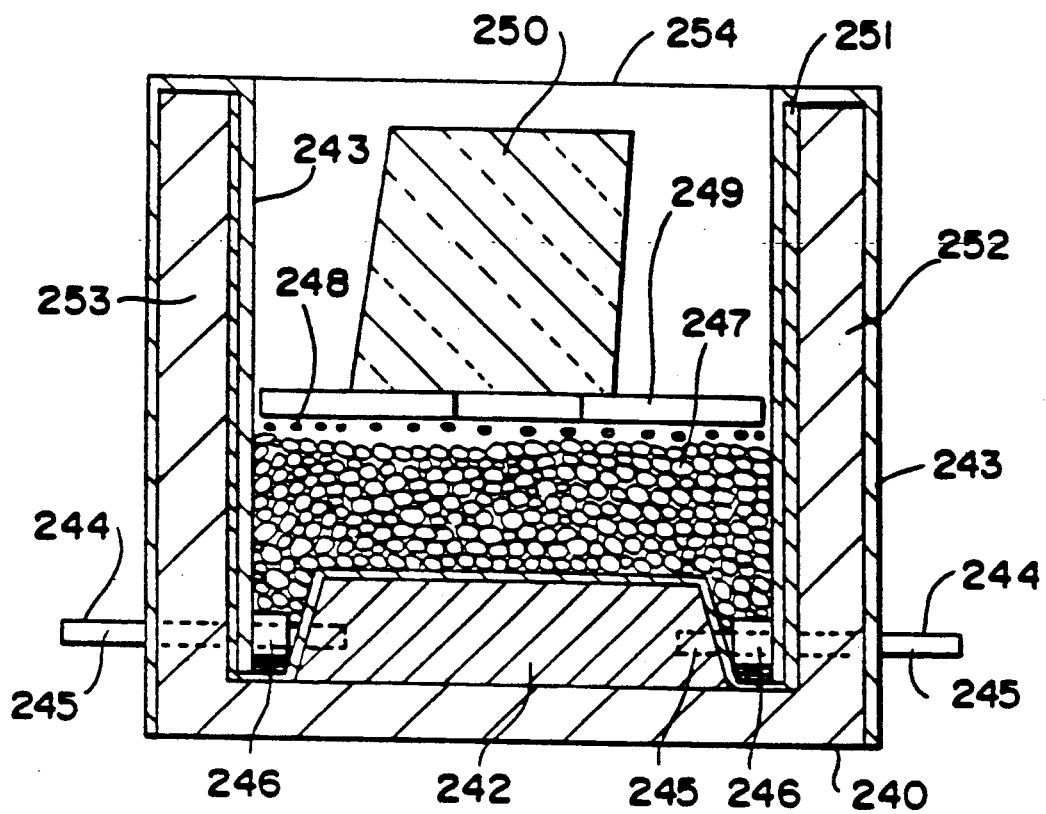
FIG. 27a is a cross-sectional schematic of the setup used to produce the macrocomposite body in accordance with Example 19.
Figure 27B:
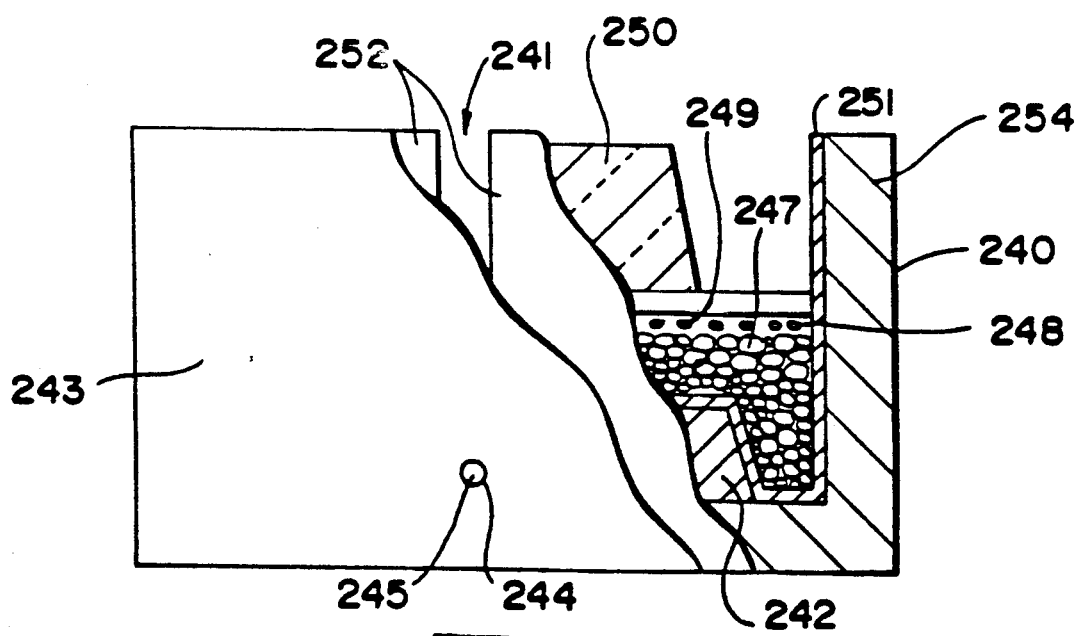
FIG. 27b is a partial cross-sectional schematic of the setup used to produce the macrocomposite body in accordance with Example 19.

FIG. 27a is a cross-sectional schematic of the setup used to produce the macrocomposite body of this Example while FIG. 27b is a partial cut-away of the setup used to produce the macrocomposite body. FIG. 27b is a side view of FIG. 27a.

A rectangular mold 240 having a wall thickness of about 0.25 inches (6.4 mm) and an inner cavity measuring about 2 inches (51 mm) long, about 1 inch (25 mm) wide, about 1 inch (25 mm) deep was machined from a solid piece of Grade ATJ graphite (Union Carbide Corporation, Carbon Products Division, Cleveland, Ohio). A slot 241 measuring about 0.063 inch (1.6 mm) wide by about 1 inch (25 mm) long was cut through the graphite mold at about the midpoint of each of the side walls which measured about 2 inches (51 mm) long (side walls 252 and 253). Each of these vertical slots extended from the top of the wall to about the bottom of the wall. A graphite insert 242 measuring about 1.875 inches (48 mm) long, about 0.874 inch (22 mm) wide, and about 0.312 inch (7.9 mm) high was placed into the bottom of the graphite mold 240 such that an about 0.312 inch (7.9 mm) deep by about 0.063 inch (1.6 mm) wide channel was created along the perimeter of the graphite insert 242 and the inside wall of the graphite mold 240. An extended section measuring about 1.5 inches (38 mm) long, about 0.38 inch (9.6 mm) wide, and about 0.13 inch (3.3 mm) high protruded from the bottom portion of the graphite insert 242. This extended section engaged a hole in the bottom of the graphite mold 240 so as to affix the graphite insert 242 to the graphite mold 240. A piece of GRAFOIL ® graphite foil 242 (Union Carbide Corporation, Carbon Products Division, Cleveland, Ohio), measuring about 2.25 inches (57 mm) long, about 2 inches (51 mm) wide, and about 0.005 inch (0.127 mm) thick was provided to each side wall 252 and 253 containing the slot 241. The graphite foil 243 was placed onto the interior portion of the cavity such that the graphite foil 243 covered each wall with a slot. The graphite foil 243 was then folded over the top of each wall to cover the exterior portion of each wall containing a slot (side walls 252 and 253).

Electrical feed-throughs 244 (Frenchtown Ceramic Company, Frenchtown, N.J.) were passed from the exterior side walls 252 and 253 to the interior of the rectangular mold 240 by piercing the exterior and interior layers of the graphite foil 243 with the electrical feed-throughs so that the electrical feed-throughs passed through the slots 241 and contacted the graphite insert 242 in such a manner so as to leave marks on the graphite insert 242. Each electrical feed-through 244 comprised a coated copper pin 245 which measured about 0.692 inch (18 mm) long, and had a diameter of about 0.040 inch (1.0 mm). An alumina disk 246 having an outer diameter of about 0.156 inch (3.96 mm) and an inner diameter of about 0.70 inch (1.78 mm) was coaxially bonded to the coated copper pin so that an approximately 0.51 inch (13 mm) long portion (the long portion) of the coated copper wire extended from one side of the alumina disk 246, and an approximately 0.12 inch (3 mm) portion (the short portion) of the coated copper wire extended from the other side of the alumina disk 246. The long portions of the feed-throughs were used to puncture holes through the graphite foil 243 covering the side walls 252 and 253 of the graphite mold 240 and to mark the graphite insert 242 contained within the graphite mold 240, as described above.

After the graphite insert 242 had been appropriately marked, the graphite foil 243, electrical feed-through 244, graphite insert 242, and graphite mold 240 were disassembled. After the disassembly step, the graphite insert 242 was drilled to contain two holes that would accept the short portions of the electrical feed-throughs at the points which had been previously marked by the electrical feed-throughs. In addition, the interior surfaces of the graphite mold 240 and the exterior surfaces of the graphite insert 242 were spray coated (using an air brush) with a mixture comprising by volume about 50% DAG 154 colloidal graphite (Acheson Colloids, Port Huron, Mich.) and about 50% ethanol (Fisher Scientific, Pittsburgh, Pa.). The coating was then allowed to dry. The above-described coating procedure was repeated two times so that a total of three coatings were applied to the interior surfaces of the graphite mold 240 and the exterior surfaces of the graphite insert 242. Once the third coating of colloidal graphite-ethanol mixture had sufficiently dried, the inner and outer surfaces of side walls 252 and 253 of the graphite mold 240 were brush coated with a thin layer of RIGI-LOCK ® graphite cement (Polycarbon Corporation, Valencia, Calif.).

All surfaces of a first electrical feed-through 244, except the circumferential edge of the alumina disk 246, were dip-coated with a mixture comprising by weight about 15% $B_2O_3$ (Fisher Scientific, Pittsburgh, Pa.) and the balance A-1000 alumina powder (Alcoa, Pittsburgh, Pa.) having a mean diameter of about 0.5 μm. The circumferential edge of the alumina disk 246 is then cleaned with a brush dipped in ethanol. Once the coating had sufficiently dried, the short portion of the feed-through was inserted into one of the two holes within the graphite insert 242 and the long portion of the feed-through was inserted into the earlier formed holes in one of the sheets of graphite foil 243.

All surfaces of a second electrical feed-through 244, except the circumferential edge of the alumina disk, were spray coated with a mixture comprising by volume about 50% DAG 154 colloidal graphite (Acheson Colloid, Port Huron, Mich.) and about 50% ethanol. The circumferential edge of the alumina disk 246 was then cleaned with a brush dipped in ethanol. Once the coating had sufficiently dried, the short portion of the feed-through was inserted in the remaining hole within the graphite insert 242 and the longer portion of the feed-through was inserted through the earlier formed holes in the remaining piece of graphite foil 243.

The assembly comprising the two feed-throughs 244 with their short portions inserted into the graphite insert 242 and their long portions inserted through the two pieces of graphite foil 243 was then positioned so tat the graphite insert 242 was on the bottom of the graphite mold 240 and the sheets of graphite foil 243 straddled side walls 252 and 253 with the long portion of the feed-throughs passing through the slots 241 in side walls 252 and 253 of the graphite mold 240, as shown in FIG. 27a. The graphite insert was attached securely to the bottom of the graphite mold by engaging the extended section on the bottom of the graphite insert 242 with the hole in the bottom of the graphite mold 240. The graphite foil 243 was pressed against the graphite cement located along both the inner and outer portions of each side wall 252 and 253 of the graphite mold 240. In addition, the feed-throughs 244 were securely fastened within the graphite mold 240 by the graphite foil 243 and the graphite insert 242. The alumina disks 246 were suspended within the channel defined by the outer perimeter of the graphite insert 242 and the inner perimeter of the graphite mold 240.

The setup comprising the graphite mold 240 with walls covered by graphite foil 243 and containing a graphite insert 242 containing two feed-throughs 244 was placed into a resistance heated air atmosphere furnace held at about 400° C. After about two hours at about 400° C., during which time the colloidal graphite-ethanol coating and the graphite cement set and formed a graphite layer 251 on the graphite mold 240 and graphite insert 242, the setup was removed from the resistance heated air atmosphere furnace and allowed to cool to about room temperature. A paintable mixture comprising −325 mesh (particle diameter less than about 45 μm) magnesium powder (Reade Manufacturing Company, Lakehurst, N.J.) and ethanol was applied to the graphite foil to form a thin layer just above the alumina disks of the feed-throughs. The coating is not shown in either FIGS. 27a or 27b.

A filler material mixture 247 comprising by weight about 67.3% 39 CRYSTOLON ® 220 grit (average particle diameter of about 66 μm) silicon carbide (Norton Company, Worcester, Mass.), about 28.9% 39 CRYSTOLON ® 500 grit (average particle diameter of about 17 μm) silicon carbide (Norton Company, Worcester, Mass.) and about 3.8% −325 mesh (particle diameter less than about 45 μm) magnesium powder (Reade Manufacturing Company, Lakehurst, N.J.) was placed into the setup to a level that substantially covered the graphite insert 242 and embedded the portions of the two feed-throughs 244 which were within the channel defined by the outer perimeter of the graphite insert 242 and the inner perimeter of the graphite mold 240. After the surface of the filler material mixture 247 had been leveled, a thin coating 248 of −100 mesh (particle diameter less than about 150 μm) magnesium powder (Hart Corporation, Tamaqua, Pa.) was placed onto the surface of the filler material mixture 247. A third piece of graphite foil 249 measuring about 2 inches (51 mm) long, about 1 inch (25 mm) wide, about 0.005 inch (0.127 mm) thick and having a hole measuring about 0.5 inch (13 mm) in diameter in the center thereof, was placed on top of the magnesium powder coating 248.

An approximately 39 gram body of matrix metal 250 designated aluminum alloy 336 and nominally comprising by weight about 11.0–13.0% Si, ≦1.2% Fe, 0.05–1.5% Cu, ≦0.35% Mn, 0.7–1.3% Mg, 2.0–3.0% Ni, ≦0.35% Zn, ≦0.25% Ti, and the balance aluminum, was placed onto the graphite foil sheet 249. The assembly, comprising the graphite mold 240 and its contents and attachments, was placed within a graphite boat, not shown in FIGS. 27a and 27b, having an inner cavity measuring about 13 inches (330 mm) long, about 9.7 inches (246 mm) wide, and about 1 inch (25 mm) deep and having a wall thickness of about 0.375 inch (9.5 mm) thick, to form a lay-up.

The lay-up, comprising the graphite boat and its contents, was then placed within a retort contained within a resistance heated furnace and the retort door was closed. The retort chamber was evacuated to about 30 inches (762 mm) of mercury vacuum and then backfilled with a nitrogen atmosphere flowing at a rate of about 5 liters per minute. The about 5 liters per minute nitrogen gas flow rate was maintained at the furnace was heated to about 200° C. in about one hour. After about 7 hours at about 200° C., the furnace and its contents were heated to about 810° C. at about 200° C. per hour while maintaining the nitrogen flow rate of about 5 liters per minute. After about 5 hours at about 810° C. with a nitrogen flow rate of about 5 liters per minute, both the nitrogen flow rate and the power to the furnace were terminated and the lay-up was removed from the furnace at about 810° C. and placed in contact with a water cooled copper chill plate to directionally solidify the molten metal contained within the lay-up.

Figure 28:
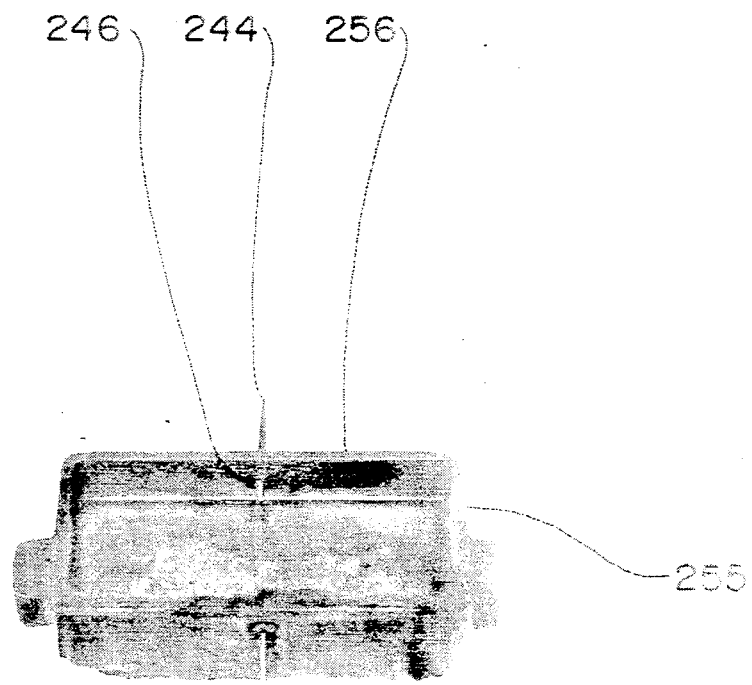
FIG. 28 is a photograph of the macrocomposite body produced in accordance with Example 19.

After the lay-up had cooled to room temperature, the lay-up was disassembled to reveal that the matrix metal 250 had infiltrated the filler material mixture 247 and embedded the alumina disks 246 of the electrical feed-throughs 244 contained within the filler material mixture 247 to result in a macrocomposite body comprising an open-ended metal matrix composite box with electrical feed-throughs 244 intimately bonded to and electrically insulated from the metal matrix composite box by the alumina disks 246 of the electrical feed-throughs 244. Specifically, FIG. 28 is a photograph showing the open-ended metal matrix composite box 255 with the electrical feed-through 244 in the side wall 256. The electrical feed-through 244 is electrically insulated form the metal matrix composite box 255 by the alumina disk 246 which is intimately bonded to the open-ended metal matrix composite box 255.

EXAMPLE 20

The following Example demonstrates that a spontaneous infiltration technique may be used to produce a macrocomposite body comprising stainless steel tubes embedded in a metal matrix composite body. The embedded stainless steel tubes may be used to provide a means for attaching the macrocomposite body to a second structure.

Figure 29:
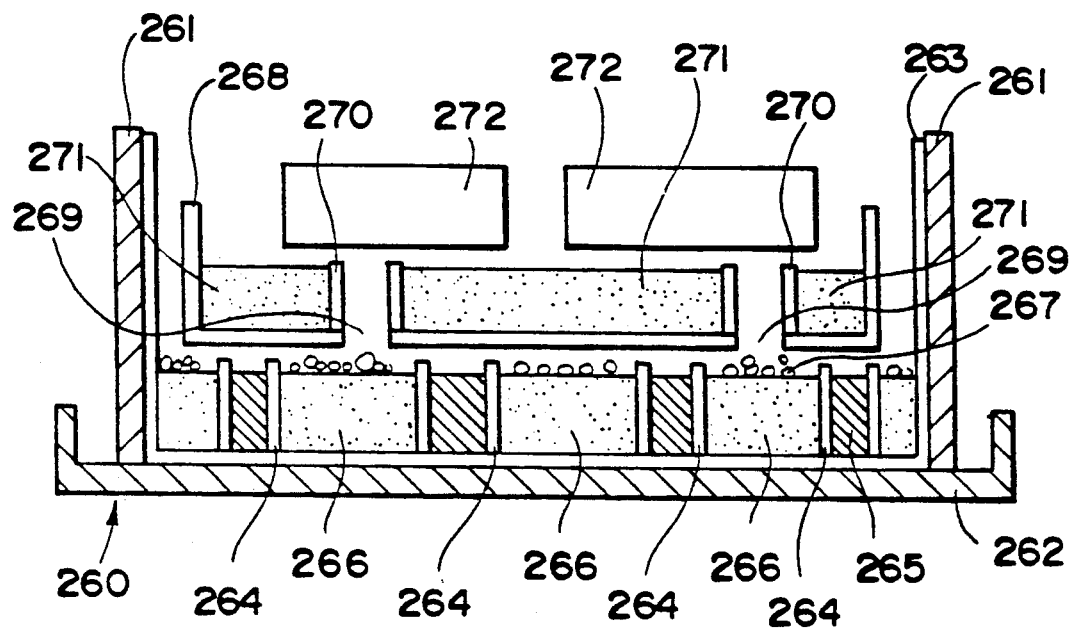
FIG. 29 is a cross-sectional schematic of the setup used to produce the macrocomposite body in accordance with Example 20.

As illustrated in FIG. 29, a rectangular shaped graphite mold 260 having a wall thickness of about 0.5 inch (13 mm) and an inner cavity measuring about 18 inches (457 mm) long, about 12 inches (305 mm) wide, and about 4 inches (102 mm) in height, was made by clamping four plates 261 of Grade ATJ graphite together (Union Carbide Corporation, Carbon Product Division, Cleveland, Ohio) and placing the clamped pieces 261 of graphite on a graphite fixture 262 having an inner-cavity measuring bout 35 inches (889 mm) long, about 22 inches (559 mm) wide, and about 2 inches (51 mm) tall. Two of the plates 261 were about 13 inches (330 mm) long, about 4 inches (102 mm) wide and about 0.5 inch (13 mm) thick, and the remaining two plates were about 18 inches (457 mm) long, about 4 inches (102 mm) wide, and about 0.5 inch (13 mm) thick.

A graphite foil box 263 was fabricated by cutting and folding a piece of GRAFOIL ® graphite foil (Union Carbide Corporation, Carbon Product Division, Cleveland, Ohio) which was about 26 inches (660 mm) long, about 20 inches (508 mm) wide, and about 0.015 inch (0.38 mm) thick. The final graphite foil box 263, which was about 18 inches (457 mm) long, about 12 inches (305 mm) wide, and about 4 inches (102 mm) in height, was inserted into the graphite mold 260.

Twelve stainless steel tubes 265 having an outer diameter of about 0.5 inch (13 mm) and an inner diameter of about 0.38 inch (9.6 mm), were placed into the bottom of the graphite foil box 263 such that the longitudinal axis of the tubes were perpendicular to the plane of the bottom of the graphite foil box 263. The stainless steel tubes 264 were arranged in three rows, each row having four uniformly spaced tubes. The rows were parallel to one another and to the 18 inch (457 mm) long wall of the graphite foil box 263. The interior of the stainless steel tubes 265 was filled with DAG 154 colloidal graphite (Acheson Colloids, Port Huron, Mich.).

A filler material mixture 266 comprising by weight about 98% 39 CRYSTOLON ® 220 grit (average particle diameter of about 66 μm) silicon carbide, (Norton Company, Worcester, Mass.) and about 2% −325 mesh (particle diameter less than about 45 lm) magnesium powder (Reade Manufacturing Company, Lakehurst, N.J.) was prepared by combining the materials in a plastic jar and placing the plastic jar on a ball m˙'l for about two hours. After the mixing step, the filler material mixture 266 was poured into the graphite foil box 263 to a depth of about 1 inch (25 mm), and the box was tapped lightly to level the surface of the filler material mixture 266. The surface of the filler material mixture 266 was then evenly coated with a layer of −100 mesh (particle diameter less than about 150 lm) magnesium powder 267 (Hart Corporation, Tamaqua, Pa.). A second graphite foil box 268 having an inner-cavity measuring about 17.9 inches (455 mm) long, about 11.9 inches (302 mm) wide, and about 4 inches (102 mm) tall, was placed on the layer of magnesium powder 267 covering the filler material mixture 266. The bottom of the second graphite foil box 268 contained two holes 269. The second graphite foil box 268 was made b˙ substantially the same method as the first graphite foil box 263 except for the addition of the two holes 269 in the bottom of the second graphite foil box 268. Each of the holes 269 was about 2.5 inches (64 mm) in diameter and was positioned in the bottom of the second graphite foil box 268 so that the center of each hole was equidistant from the 17.9 inch (455 mm) long sides of the second graphite foil box 268, and about 5.55 inches (141 mm) from one of the 11.9 inch (302 mm) wide ends of the second graphite foil box 268. Two graphite tubes 270 having inner diameters of about 2.125 inches (54 mm) and having outer diameters of about 2.5 inches (64 mm) and a height of about 0.5 inch (13 mm) were placed into the second graphite foil box 268 to coincide with the holes 269 in the second graphite foil box 268. These tubes 270 were secured to the second graphite foil box 268 with RIGIDLOCK ® graphite cement (Polycarbon Corporation, Valencia, Calif.). 38 ALUNDUM ® 90 grit (average particle diameter of about 216 lm) alumina powder 271 (Norton Company, Worcester, Mass.) was placed into the second graphite foil box 268 and around the graphite tubes 270 until the level of alumina powder 271 was substantially equal to the top of the graphite tubes 270. After the RIGIDLOCK ® graphite cement set, additional −100 mesh (particle diameter less than about 150 lm) magnesium powder 267 (Hart Corporation, Tamaqua, Pa.) was sifted into the graphite tubes 270 to provide additional magnesium powder to the surface of the filler material mixture 266, which was visible at the bottom of the graphite tubes 270.

An approximately 20.1 pound (9.1 kologram) body of matrix metal 272 designated aluminum alloy 413 and nominally comprising by weight about 11.0–13.0% Si; ≦2.0% Fe; ≦1.0% Cu; ≦0.35% Mn; ≦0.10% Mg; ≦0.50% Ni; ≦0.50% Zn; ≦0.15% Sn and the balance aluminum, was placed onto the alumina powder 271 contained within the second graphite foil box 268. The graphite mold 260 and its contents comprised a lay-up to be used for the formation of a macrocomposite body comprising a metal matrix composite body with the stainless steel tubes 264 incorporated therein.

The lay-up comprising the graphite mold 260 and its contents was placed into a retort contained within a resistance heated furnace and the retort door was closed. The retort chamber was evacuated to about 30 inches (762 mm) of mercury vacuum and then back-filled with nitrogen gas flowing at a rate of about 12 liters per minute. A nitrogen gas flow rate of about 12 liters per minute was maintained while the furnace was heated to about 200° C. in about one hour. After about 2 hours at about 200° C., the furnace and its contents were heated to about 550° C. in about 3 hours. After about 2 hours at about 550° C., the furnace and its contents were heated to about 790° C. in about 3 hours. After about 12 hours at about 790° C., with the nitrogen gas continuously flowing at a rate of about 12 liters per minute, the furnace and its contents were cooled to about 670° C. in about 3 hours. At about 670° C., both the supply of nitrogen gas and the power to the furnace were terminated and the lay-up was removed from the furnace at 670° C. and contacted with a graphite plate measuring about 36 inches (914 mm) long, about 24 inches (610 mm) wide, and about 4 inches (102 mm) thick, at room temperature, to directionally solidify the molten metal contained within the lay-up.

After the lay-up had cooled to room temperature, the lay-up was disassembled to reveal that the matrix metal had infiltrated the filler material mixture 266 and embedded the stainless steel tubes 264 to make a metal matrix composite plate with stainless steel tubes 264 intimately bonded to the metal matrix plate, thereby forming a macrocomposite body. The DAG 154 colloidal graphite was then removed from the interior of the stainless steel tubes 265 to form through-holes in the macrocomposite body.

EXAMPLE 21

The following Example demonstrates the utilization of a spontaneous infiltration technique to form a macrocomposite body comprising an open-ended metal matrix composite box with a metallic lip around the perimeter of the open-end of the box.

Figure 30:
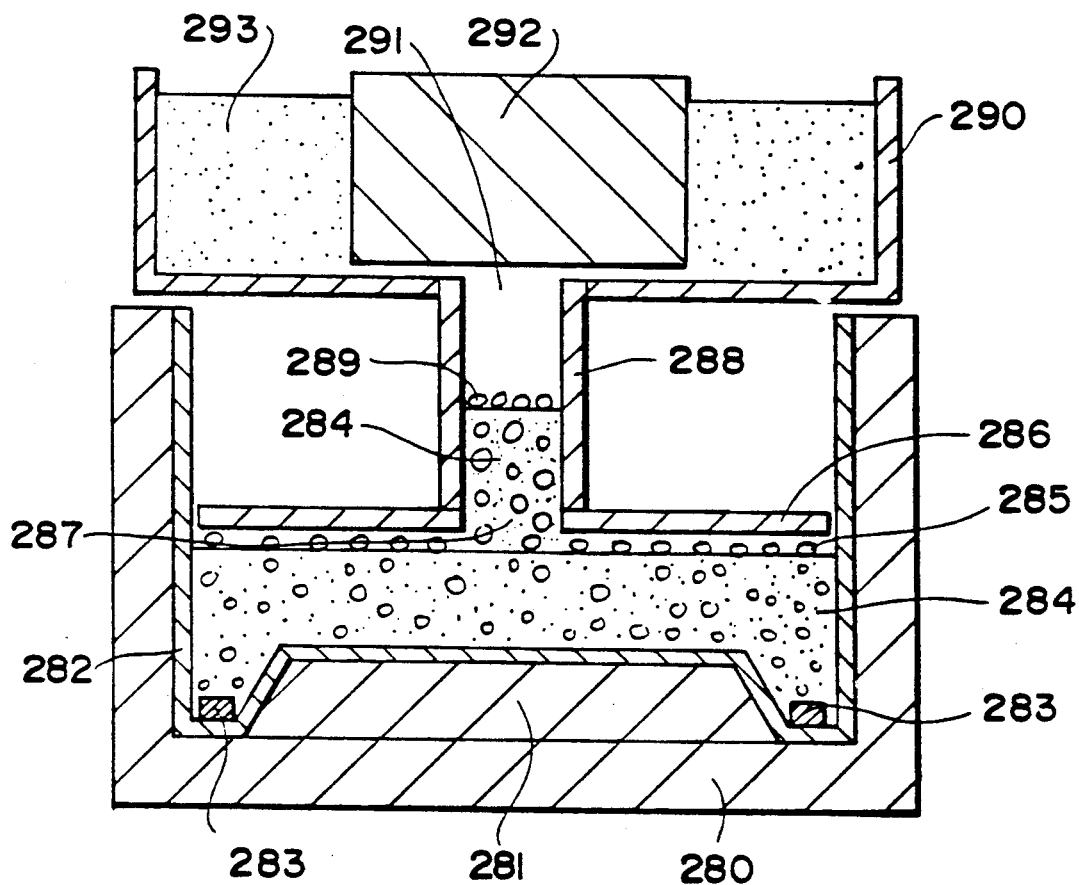
FIG. 30 is a cross-sectional schematic of the setup used to produce the macrocomposite body in accordance with Example 21.
Figure 31A:
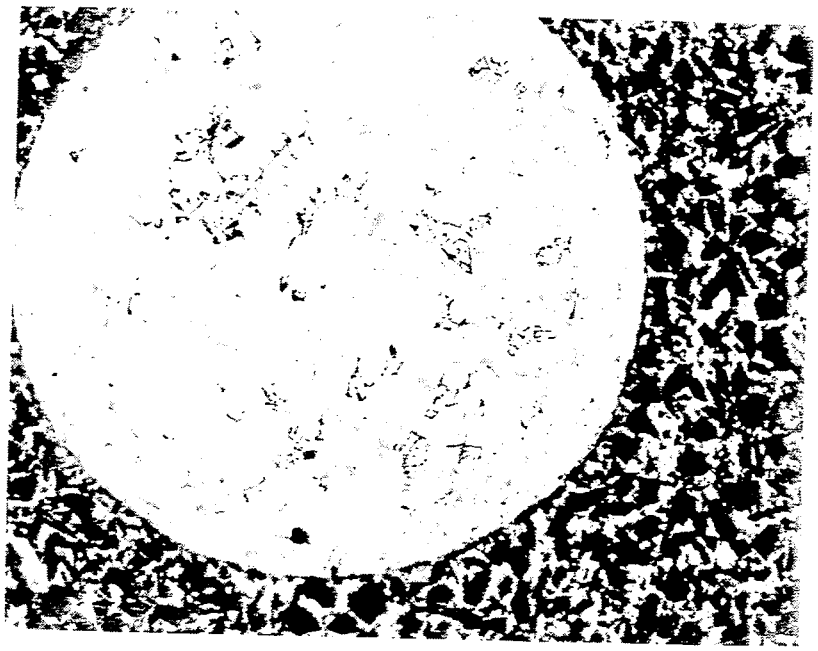
FIG. 31a, 31b, 31c and 31d are microstructures taken at about 50× magnification of the metal rich areas of the macrocomposite body as produced in Example 30.
Figure 31B:
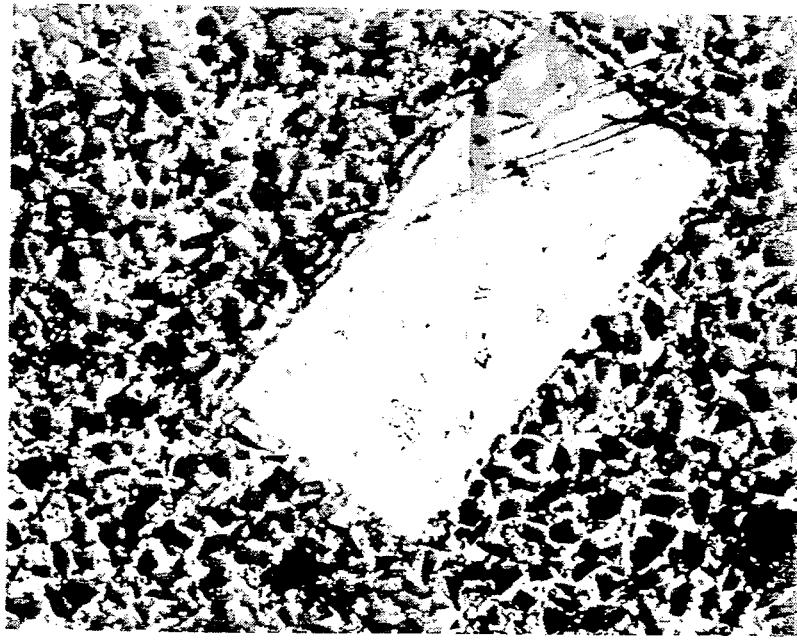
Figure 31C:
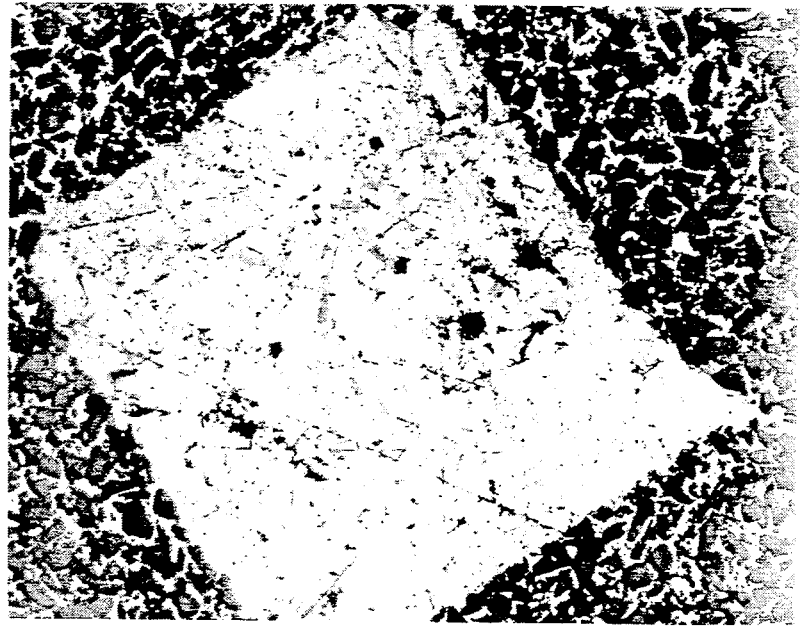
Figure 31D:
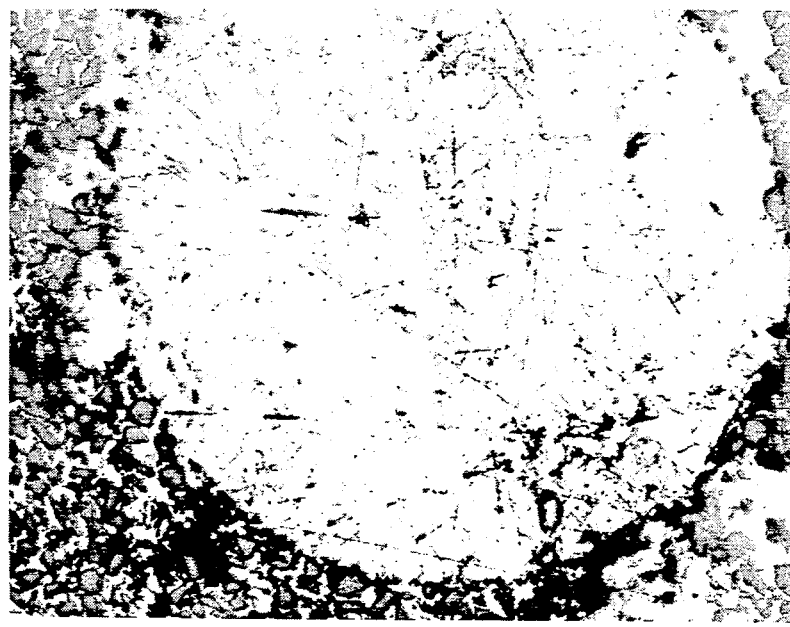

FIG. 30 is a cross-sectional schematic of the setup used to provide the macrocomposite body of this Example. Specifically, a rectangular graphite mold 280 having a wall thickness of about 0.25 inch (6.4 mm) and an inner cavity measuring about 2 inches (51 mm) long, about 1 inch (25 mm) wide, and about 1 inch (25 mm) deep, was machined from a solid piece of Grade ATJ graphite (Union Carbide Corporation, Graphite Products Division, Cleveland, Ohio). A graphite insert 281 measuring about 1.875 inches (48 mm) long, about 0.874 inch (22 mm) wide, and about 0.312 inch (7.9 mm) high was placed into the bottom of the graphite mold 280 so that an about 0.312 inch (7.9 mm) deep and about 0.63 inch (1.6 mm) wide channel was created between the perimeter of the graphite insert 281 and the inside wall of the rectangular graphite mold 280. The graphite mold 280 and the graphite insert 281 were then spray coated with five applications of a mixture comprising by volume about 50% DAG 154 colloidal graphite (Acheson Colloids, Port Huron, Mich.) and about 50% ethanol. Each coating was allowed to dry before the subsequent coating was applied. The spray coated graphite mold and the spray coated graphite insert 281 were placed into an air atmosphere oven at about 450° C. for about 3 hours to cure the graphite coating 282. A metal gasket 283 was electrical discharge discharge machined from an about 0.04 inch (1 mm) thick sheet of KOVAR ® alloy having a nominal composition comprising by weight $\leq 0.02\%$ C; $\leq 0.30\%$ Mn; $\leq 0.20\%$ Si; 29.0% Ni; 17.0% Co and the balance iron. The metal gasket 283 had dimensions of about 1.99 inches (51 mm) for its long sides, about 0.9 inch (23 mm) for its short sides about 0.40 inch (10 mm) thick from top surface to bottom surface, and about 0.50 inch (1.30 mm) in wall width so that it substantially completely covered the exposed surfaces of the bottom of the rectangular mold 280 which were not covered by the graphite insert 281.

A filler material mixture 284 was made by mixing in a plastic jar on a ball mill for about 24 hours a mixture comprising a weight about 77.7% 39 CRYSTOLON ® 220 grit (average particle diameter of about 66 μm) silicon carbide (Norton Company, Worcester, Mass.), 19.4% 39 CRYSTOLON ® 500 grit (average particle diameter of about 17 μm) silicon carbide (Norton Company, Worcester, Mass.) and about 2.9% −325 mesh (particle diameter less than about 45 μm) magnesium powder (Reade Manufacturing Company, Lakehurst, N.J.).

A sufficient amount of filler material mixture 284 was poured into the bottom of the graphite mold 280 to cover the KOVAR ® alloy gasket 283 and the graphite insert 281. The filler material mixture 284 was thereafter leveled within the graphite mold 280 and covered with a layer 285 of −100 mesh (particle diameter less than about 150 μm) magnesium powder (Hart Corporation, Tamaque, Pa.). The layer 285 of magnesium powder was then substantially covered with a piece of graphite foil 286 measuring about 2 inches (51 mm) long, about 1 inch (25 mm) wide, and about 0.015 inch (0.38 mm) thick. A hole 287 having a diameter of about 0.5 inch (13 mm) was located in the center of the piece of graphite foil. A graphite tube 288 having an inner diameter of about 0.5 inch (13 mm), an outer diameter of about 0.75 inch (19 mm) and a height of about 0.75 inch (19 mm) was placed onto the graphite foil 286 so that the opening 287 in the graphite foil 286 and the inner diameter of the graphite tube 288 were aligned. An additional amount of filler material mixture 284 was disposed within the graphite tube 288 so that the tube was about half-filled. Approximately 0.10 grams of −100 mesh (particle diameter less than about 150 μm) magnesium powder 289 was placed on the surface of the filler material mixture 284 contained within the graphite tube 288. A graphite foil box 290 measuring about 3 inches (76 mm) long, about 1.5 inches (38 mm) wide, and about 1.5 inches (38 mm) tall and having a hole 291 in the center of its bottom measuring about 0.75 inch (19 mm) in diameter was placed onto the top edges of the graphite mold 280 so that the outer surface of the graphite tube 288 fit within the hole 291 in the bottom of the graphite foil box 290.

An approximately 90 gram body of matrix metal 292 designated aluminum alloy 336 and nominally comprising by weight 11.0-13.0% Si; $\leq 1.2\%$ FGe; 0.05-1.5% Cu; $\leq 0.35\%$ Mn; 0.7-1.3% Mg; 2.0-3.0% Ni; $\leq 0.35\%$ Zn; $\leq 0.25\%$ Ti and the balance aluminum, was placed into the graphite foil box 290 and on top of the opening 291 in the bottom of the graphite foil box 290. A mixture of 39 CRYSTOLON ® 90 grit and finer (particle diameter less than about 180 μm) silicon carbide powder was poured into the remaining volume of the graphite foil box 290 until the surface of the silicon carbide powder bed 293 was substantially level with the top of the body of matrix metal 292.

The lay-up comprising the graphite mold 280, the graphite foil box 290, and their contents, was placed into a retort contained within a resistance heated furnace and the retort door was closed. The retort chamber was then evacuated to about 30 inches (762 mm) of mercury vacuum and backfilled with nitrogen gas flowing at a rate of about 2.5 liters per minute. The about 2.5 liters per minute nitrogen gas flow rate was maintained as the furnace was heated to about 200° C. in about one hour. After about 3 hours at about 200° C., the furnace and its contents were heated to about 790° C. at about 200° C. per hour. After about 12 hours at about 790° C. with a nitrogen gas flow rate of about 2.5 liters per minute, the furnace and its contents were cooled to about 670° C. at about 200° C. per hour. At about 670° C., both the continuous flow of nitrogen gas and the power to the furnace were terminated. The lay-up was removed from the furnace at about 670° C. and placed on top of a water cooled aluminum chill plate. In addition, shortly after the lay-up was placed on top of the chill plate, the surface of the excess molten metal contained within the graphite fill box 290 was covered with FEEDOL ® No. 90 hot-topping material (Foseco, Cleveland, Ohio) to cause an exothermic reaction which supplied heat to the surface of the excess molten metal. The combination of a heat source on the upper end of the lay-up and a heat sink on the bottom of the lay-up resulted in the directional solidification of the molten metal contained within the lay-up.

After the lay-up had cooled to room temperature, the lay-up was disassembled to reveal that the KOVAR ® alloy gasket 283 was attached to an open-ended metal matrix composite box comprising the filler material mixture 284 embedded within the matrix metal. Further inspection revealed that there had been extensive interaction between the KOVAR ® alloy gasket and the aluminum matrix metal resulting in some alloying of the matrix metal with the KOVAR ® alloy gasket. Thus, the final macrocomposite body produced by the instant example comprised an open-ended metal matrix composite box having a metal lip attached to the perimeter of the open-end of the box.

EXAMPLE 22

The following Example demonstrates that a spontaneous infiltration technique may be utilized to form a macrocomposite body comprising an open-ended metal matrix composite box with a metallic lip around the perimeter of the open-end of the box. The method of Example 21 was substantially repeated, except that in place of the KOVAR ® alloy gasket, an INCONEL ® 600 alloy gasket nominally comprising by weight about C. per hour to about 815° C. while maintaining the nitrogen gas flow rate. After about 3 hours at about 815° C. with the nitrogen gas flow rate maintained at about 5 liters per minute, the graphite mole and its contents were removed from the retort at about 815° C. and placed on a copper chill plate at about room temperature. The copper chill plate measured about 16 inches (406 mm) long, about 16 inches (406 mm) wide, and about 2.4 inches (61 mm) thick. An insulating ceramic blanket was placed over the top of the setup to prevent the excess molten matrix metal from cooling too rapidly. Thus, by maintaining the high temperature at the top of the setup and providing a heat sink at the bottom of the setup, directional solidification of the molten metal within the setup was effected.

After the setup had cooled to room temperature, the setup was disassembled to reveal that the matrix metal had infiltrated the filler material mixture to form a macrocomposite body comprising an open-ended metal matrix composite box with an aluminum alloy metal lip attached to the perimeter of the open-end of the box.

EXAMPLE 26

The following Example demonstrates the utilization of a spontaneous infiltration technique to form a macrocomposite body comprising an open-ended metal matrix composite body with an aluminum alloy lip around the perimeter of the open-end of the box.

The method of Example 25 was substantially repeated, except that a metal gasket made from an alloy comprising by weight about 15.0% silicon and the balance aluminum was placed into the channel between the outer perimeter of the graphite insert and the inside wall of the rectangular graphite mold prior to injecting the mixture of metal powder and ethanol into the channel. Other differences between the method of the instant Example and the method of Example 25 were that: (1) the aluminum alloy gasket had been cut into two pieces prior to insertion into the channel to prevent the warping of the metal gasket during the heating of the setup to the infiltration temperature; and (2) the filler material mixture had been dried in a vacuum oven at about 150° C. for about 1 hour prior to being disposed within the graphite mold.

After the setup had cooled to room temperature, the setup was disassembled to reveal that the matrix metal had infiltrated the filler material mixture to form a macrocomposite body comprising an open-ended metal matrix composite box with an aluminum alloy lip attached to the perimeter of the open-end of the box.

EXAMPLE 27

The following Example demonstrate the utilization of a spontaneous infiltration technique to form a macrocomposite body comprising an open-ended metal matrix composite box with a silicon-aluminum alloy lip around the perimeter of the open-end of the box.

The method of Example 25 was substantially repeated, except that the mixture that was injected into the channel comprised $-325$ mesh (particle diameter less than about 45 $\mu$m) silicon powder and ethanol. In addition, the filler material mixture had been dried in a vacuum oven at bout 150° C. for about 1 hour prior to being disposed within the graphite mold. After the setup had cooled to room temperature, the setup was disassembled to reveal that the matrix metal had infiltrated the filler material mixture to form a macrocomposite body comprising an open-ended metal matrix composite box with a silicon-alumina alloy lip attached to the perimeter of the open-end of the box.

EXAMPLE 28

The following Example demonstrates the utilization of a spontaneous infiltration technique to form a macrocomposite body comprising an open-ended metal matrix composite box with an aluminum alloy lip attached to the perimeter of the open-end of the box.

A rectangular graphite mold having an inner cavity measuring about 2 inches (51 mm) long, about 1 inch (25 mm) wide, and about 1 inch (25 mm) deep, was machined from a solid piece of Grade ATJ graphite (Union Carbide Corporation, Graphite Products Division, Cleveland, Ohio). A graphite insert measuring about 1.875 inches (48 mm) long, about 0.874 inch (25 mm) wide, and about 0.312 inch (7.9 mm) high was placed into the bottom of the graphite mold so that an about 0.312 inch (7.9 mm) deep and about 0.063 inch (1.6 mm) wide channel was created between the perimeter of the graphite insert and the inside wall of the rectangular graphite mold. The interior surfaces of the graphite mold and the exterior surfaces of the graphite insert were then spray coated with the same material, and by the same procedure, described in Example 21. In addition, after the graphite mold and the graphite insert had been coated and dried, the interior of the graphite mold and the surface of the graphite insert were wiped with a clean cloth to remove residue within the graphite mold and on the graphite insert. The interior of the graphite mold and the surface of the graphite insert were then lightly coated with $-325$ mesh (particle diameter less than about 45 $\mu$m) magnesium powder (Reade Manufacturing Company, Lakehurst, N.J.). The light coating was effected by holding a cotton-tipped applicator covered with magnesium powder above the graphite mold and the graphite insert, and tapping the cotton-tipped applicator with a finger to cause the magnesium powder to fall from the cotton-tipped applicator and onto the surfaces of the graphite mold and graphite insert. About 30 grams of a $-325$ mesh (particle diameter less than about 45 $\mu$m) aluminum alloy powder comprising by weight about 7.5–8.5% Si; 3.0–4.0% Cu; 2.7–3.5% Zn; 0.2–0.3% Mg; $\leq$0.01% Cr; $\leq$0.01% Ti; 0.7–1.0% Fe; $\leq$0.50% Ni; $\leq$0.50% Mn; $\leq$0.35% Sn; $\leq$0.01% Be; $\leq$0.15% Pd; and the balance aluminum was placed into the channel defined by the perimeter of the graphite insert and the inside wall of the rectangular graphite mold. The aluminum alloy powder was leveled by gently shaking the graphite mold in a side-to-side motion. After the aluminum alloy powder had been leveled, a light coating (applied as described above) of $-325$ mesh (particle diameter less than about 45 $\mu$m) magnesium powder (Reade Manufacturing Company, Lakehurst, N.J.) was placed on top of the $-325$ mesh (particle diameter less than about 45 $\mu$m) aluminum alloy powder.

A filler material mixture comprising by weight about 79.7% 39 CRYSTOLON ® 220 grit (average particle diameter of about 66 $\mu$m) silicon carbide (Norton Company, Worcester, Mass.), about 19.4% 39 CRYSTOLON ® 500 grit (average particle diameter of about 17 $\mu$m) silicon carbide, and about 2.9% $-325$ mesh (particle diameter less than about 45 $\mu$m) magnesium powder (Reade Manufacturing Company, Lakehurst, N.J.) was made by placing the three materials into a plastic jar and gently shaking the plastic jar to effect mixing. About 20 grams of the filler mixture were then 14.0–17.0% Cr; 6.0–10.0% Fe; ≦1.5% C; ≦1.0% Mn; ≦0.015% S; ≦0.50% Si; ≦0.50% Cu and a minimum of about 72% Ni, was used. As with the KOVAR® alloy gasket, the INCONEL® 600 alloy gasket interacted with the aluminum matrix metal resulting in an open-ended metal matrix composite box attached to a metallic in that was comprised of aluminum, nickel, chromium, iron, magnesium, and silicon.

EXAMPLE 23

The following Example demonstrates the utilization of a spontaneous infiltration technique to form a macrocomposite body comprising an open-ended metal matrix composite box with a metallic lip around the perimeter of the open-end of the box. The method of Example 21 was substantially repeated, except that in place of the KOVAR® alloy gasket, a substantially pure copper gasket was used. As with the KOVAR® alloy gasket, the copper gasket interacted with the aluminum matrix metal resulting in an open-ended metal matrix composite box attached to the metallic lip that was comprised of aluminum, copper, magnesium, and silicon.

EXAMPLE 24

The following Example demonstrates the utilization of a spontaneous infiltration technique to form a macrocomposite body comprising an open-ended metal matrix composite box with a metallic lip around the perimeter of the open-end of the box. The method of Example 21 was substantially repeated, except that in place of the KOVAR® alloy gasket, a substantially pure commercially available titanium gasket was used. Other differences between the method of the instant Example and the method of Example 21 were that the infiltration of the matrix metal into the filler material was performed at about 800° C. for about 5 hours with a nitrogen flow rate of about 4 liters per minute, and the removal of the setup to the water cooled aluminum chill plate was preformed at about 700° C. As with the KOVAR® alloy gasket, the titanium gasket interacted with the aluminum matrix metal resulting in an open-ended metal matrix composite box attached to a metallic lip that was comprised of aluminum, titanium, magnesium, and silicon.

EXAMPLE 25

The following Example demonstrates the utilization of a spontaneous infiltration technique to form a macrocomposite body comprising an open-ended metal matrix composite box with an aluminum rich edge around the perimeter of the open-end of the box.

A setup similar to that shown in FIG. 16 was used. Specifically, a rectangular graphite mold having a wall thickness of about 0.25 inch (6.4 mm) and an inner-cavity measuring about 2.3 inches (58 mm) long, about 0.45 inch (11 mm) wide, and about 1 inch (25 mm) deep was machined from a solid piece of Grade ATJ graphite (Union Carbide Corporation, Carbon Products Division, Cleveland, Ohio). A graphite insert measuring about 2 inches (51 mm) long, about 0.4 inch (9.8 mm) wide, and about 0.10 inch (2.5 mm) high was placed into the bottom of the graphite mold such that an about 0.14 inch (3.5 mm) deep, and about 0.04 inch (1 mm) wide channel was created between the outer perimeter of the graphite insert and the inside wall of the rectangular graphite mold. The interior surfaces of the graphite mold and the exterior surfaces of the graphite insert were then sprayed (using an air brush) with a mixture comprising by volume about 50% of DAG 154 colloidal graphite (Acheson Colloids, Port Huron, Mich.) and about 50% ethanol. After the coating had substantially dried, the coating procedure was repeated until a total of four coatings had been applied. The spray coated graphite mold and graphite insert were then placed into an air atmosphere oven for about 2 hours at a temperature of about 380° C.

An admixture comprising by weight about 98% −325 mesh (particle diameter less than about 45 μm) aluminum alloy powder comprising by weight about 7.5–8.5% Si; 3.0–4.0% Cu; 2.7–3.5% Zn; 0.2–0.3% Mg; ≦0.01% Ca; ≦0.01% Ti; 0.7–1.0% Fe; ≦0.5% Ni; ≦0.5% Mn; ≦0.35% Sn; ≦0.001% Be; ≦0.15% Pb; and the balance aluminum, and about 2% −325 mesh (particle diameter less than about 45 μm) magnesium powder (Reade Manufacturing Company, Lakehurst, N.J.) was mixed with ethanol and poured into a syringe. The mixture was then injected into the channel defined by the outer perimeter of the graphite insert and the inside wall of the rectangular graphite mold. The ethanol evaporated from the mixture leaving a dense layer of metal powder in the channel. A thin layer of −325 mesh (particle diameter less than about 45 μm) magnesium powder was then placed onto the surface of the dense layer of metal powder contained within the channel.

A filler material mixture was made by combining by weight about 79.7% 39 CRYSTOLON® 220 grit (average particle diameter of about 66 μm) silicon carbide (Norton Company, Worcester, Mass.), about 19.4% 39 CRYSTOLON® 500 grit (average particle diameter of about 17 μm) silicon carbide (Norton Company, Worcester, Mass.), and about 2.9% −325 mesh (particle diameter less than about 45 μm) magnesium powder (Reade Manufacturing Company, Lakehurst, N.J.) in a plastic jar and placing the jar on a ball mill for approximately 1 hour. The filler material mixture was then poured into the graphite mold and over the graphite insert to cover both the layer of metal powder in the channel and the graphite insert. The graphite mold was the placed on a vibrator to level the filler material mixture. The surface of the leveled filler material mixture was about 0.3 gram (9.5 mm) above the upper surface of the graphite insert. The leveled filler material mixture was covered with an approximately 0.04 gram per square inch ($62.2 \times 10^{-5}$ gram per square millimeter) thick layer of −50 mesh (particle diameter less than about 300 μm) magnesium powder (ALFA®, Johnson Matthey, Ward Hill, Mass.). An approximately 24 gram body of matrix metal designated aluminum alloy 336 and nominally comprising by weight about 11.0–13.0% Si; ≦1.2% Fe; 0.5–1.5% Cu; ≦0.35% Mn; 0.7–1.3% Mg; 2.0–3.0% Ni; ≦0.35% Zn; ≦0.25% Ti; and the balance aluminum, was placed on top of the layer of magnesium powder.

The setup comprising the graphite mold and its contents was placed into a retort contained within a resistance heated furnace and the retort door was closed. The retort chamber was then evacuated to about 30 inches (762 mm) of mercury vacuum. After the vacuum had been reached, nitrogen gas flowing at a rate of about 5 liters per minute was introduced into the retort. While maintaining the nitrogen gas flow rate, the furnace and its contents were heated to about 200° C. at about 90° C. per hour. After about 2 hours at about 200° C., the furnace and its contents were heated at about 90° placed on top of the −325 mesh (particle diameter less than about 45 μm) magnesium powder covering the −325 mesh (particle diameter less than about 45 μm) aluminum powder. The filler material mixture covered the graphite insert contained within the graphite mold. The filler material mixture was leveled by gently shaking the graphite mold in a side-to-side motion. The level surface of the filler material mixture was about 0.38 inch (9.5 mm) above the upper surface of the graphite insert. About 0.15 grams of −50 mesh (particle diameter less than about 300 μm) magnesium powder (ALFA ® Johnson Matthey, Ward Hill, N.J.) was then sprinkled evenly on the level surface of the filler material mixture. Copper foil strips were then placed over the opening of the graphite mold to provide a support means for a body of matrix metal. Thereafter, −50 mesh (particle diameter less than about 300 μm) magnesium powder was sprinkled over the surface of the clean copper strips. A gap existed between the copper strips so that the matrix metal, after melting, could gain access to the filler material mixture contained within the graphite mold.

An approximately 38 gram body of matrix metal designated aluminum alloy 336 and nominally comprising by weight about 11.0-13.0% Si; ≦1.2% Fe; 0.5-1.4% Cu; ≦0.35% Mn; 0.7-1.3% Mg; 2.0-3.0% Ni; ≦0.35% Zn; ≦0.25% Ti; and the balance aluminum was placed on top of the magnesium powder coated copper strips located over the opening of the graphite mold, to form a setup.

The setup was then placed into a stainless steel containers measuring about 10 inches (254 mm) wide, about 12 inches (305 mm) long, and about 3 inches (76 mm) high. Prior to disposing the setup within the stainless steel container, a piece of Grade PF-25H PERMA FOIL graphite foil (TTAmerica, Portland, Ore.) measuring about 12 inches (305 mm) long, about 10 inches (254 mm) wide and about 0.01 inch (0.25 mm) thick, was placed on the bottom of the inner cavity of the stainless steel container. About 10 grams of a titanium sponge material (Chemalloy Company, Incorporated, Bryn Mawr, Pa.), and about 2 grams of −50 mesh (particle diameter less than about 300 μm) magnesium powder (Reade Manufacturing Company, Lakehurst, N.J.) were sprinkled into the bottom of the stainless steel container around the outer edges of the graphite mold and on top of the graphite foil sheet. Both the titanium sponge material and the magnesium powder were utilized as oxygen-getters. A second piece of graphite foil was placed over the top of the setup and pressed against the outer walls of the setup.

The lay-up, comprising the stainless steel container and its contents, was placed into a retort contained within a resistance heated furnace and the retort door was closed. The retort chamber was evacuated to about 30 inches (762 mm) of mercury vacuum and then backfilled with nitrogen gas at a flow rate of about 10 liters per minute. The nitrogen gas flow rate was maintained as the furnace and its contents were heated from room temperature to about 815° C. at about 400° C. per hour. After about 15 hours at about 815° C. with a nitrogen gas flow rate of about 10 liters per minute, the stainless steel container and its contents were removed from the furnace and excess matrix metal was poured out of the graphite mold. The graphite mold and its contents, which were at a temperature of about 815° C. were then placed onto a water cooled aluminum chill plate, which was at about room temperature, and the top of the graphite mold was covered with an insulating ceramic blanket. By maintaining the high temperature at the top of the setup and contacting a heat sink with the bottom at the setup, directional solidification of the molten metal contained within the setup was achieved.

After the setup had cooled to room temperature, the setup was disassembled to reveal that the matrix metal had infiltrated the filler material mixture to form a macrocomposite body comprising a thin walled metal matrix composite box with an aluminum alloy lip attached to the perimeter of the open-end of the box.

EXAMPLE 29

The following Example demonstrates the utilization of a spontaneous infiltration technique in combination with several coating techniques to form a macrocomposite comprising an open-ended metal matrix composite box with an aluminum alloy metal lip along the perimeter of the open-end of the box and a metal coating deposited uniformly on all surfaces of the open-ended metal matrix composite box.

The method of Example 25 was substantially repeated to produce a metal matrix composite box having dimensions of about 2.3 inches (58 mm) long, about 0.45 inch (11 mm) wide, about 0.13 inch (3.3 mm) deep and with an inner chamber having dimensions of about 2.0 inches (51 mm) long, about 0.38 inch (9.5 mm) wide, and about 0.09 inch (2.3 mm) deep. The metal matrix composite box was degreased by submerging the box for about 10 minutes in an ultrasonically agitated acetone bath (ranging in temperature from about 20° C.-30° C.) and then submerging the box in an ultrasonically agitated ethanol bath for about 10 minutes (ranging in temperature from about 25° C.-35° C.). The metal matrix composite box was removed from the ethanol bath and dried with several blasts of clean compressed air.

The metal matrix composite box was then conditioned in a bath comprising approximately 15 volume percent $H_2SO_4$ in water at about 80° C. for about 4 minutes. After this conditioning, the metal matrix composite box was rinsed under cascading tap water to remove any residual $H_2SO_4$ solution from the metal matrix composite box and to cool the box. The metal matrix composite box was subsequently conditioned in a bath comprising about 100 grams of NIKLAD TM multiprep 502 (Witco Corporation, Melrose Park, Ill.) acid pickle, descaler, and desmutter per liter of concentrated $HNO_3$ at a temperature of about 22° C. to about 32° C. for about 1 minute and then immediately rinsed in cool cascading tap water.

The metal matrix composite box was then submerged in an about 10 percent by volume NIKLAD TM 261 (Witco Corporation, Melrose Park, Ill.) precatalyst sensitizer aqueous bath at a temperature of about 22° C. to about 32° C. for about 1.5 minutes and immediately rinsed in cool cascading tap water before being submerged in an ultrasonically agitated deionized water bath at about room temperature for about 5 minutes and again rinsed in cool cascading tap water.

The metal matrix composite box was then dipped in a 10 percent by volume NIKLAD TM 262 (Witco Corporation, Melrose Park, Ill.) catalyst-aqueous bath at a temperature of about 45° C.-50° C. for about 5 minutes and rinsed in cool cascading tap water before being submerged in an ultrasonically agitated deionized water bath at about room temperature for about 5 minutes and again rinsed in cool cascading tap water.

An electroless nickel plating was then formed on the metal matrix composite box by submerging the box in a bath comprising by volume about 8.5% NIKLAD ™ 1000A (Witco Corporation, Melrose Park, Ill.) nickel source/replenisher, about 15.7 NIKLAD ™ 1000B (Witco Corporation, Melrose Park, Ill.) complexor/buffer, and the balance deionized water at about 90° C. for about 25 minutes to produce a nickel plate on the metal matrix composite box.

The nickel plated metal matrix composite box was further plated with an electro-nickel plating process which utilized a bath of SN ® (Witco Corporation, Melrose Park, Ill.) sulfamate nickel plating solution. Two nickel plates having dimensions of about 12 inches (305 mm) long, 1inch (25 mm) wide, and 0.25 inch (6.4 mm) thick were connected to the positive terminal of a direct current power supply and placed on opposite sides of the bath to become the collective anode of the electrical circuit. The metal matrix composite box was connected to the negative terminal of the direct current power supply to become the cathode of the electrical circuit. Before the metal matrix composite box cathode was placed in the plating bath, a current was supplied to create a current density of about 30 amperes per square foot. The plating process was performed for about 30 minutes at about 60° C. Mechanical stirring was supplied during the plating procedure.

In a final coating step, the nickel plated metal matrix composite box was gold plated in a plating bath from SEL-REX ® Corporation, Neutly, N.J. sold under the trade name SEL-REX ® Neutronics 300 gold electroplating solution. The anode in the bath was paladium clad niobium mesh. The cathode in the bath was the nickel plated metal matrix composite box. The original plating bath conditions were a temperature of about 50° C.–55° C., a plating current density of about 16 amperes per square foot, and mechanical stirring. The plating time at the original plating bath conditions was about 30 seconds. Thereafter, the plating current density was changed to about 2 amperes per square foot. The plating time at the lower plating current density was about 27 minutes and the nickel plated metal matrix composite box was inverted in the plating bath after about 13.5 minutes. After the gold plating step was complete, the plated metal matrix composite box was removed from the bath, and rinsed first in deionized water and then in ethanol. A final examination revealed that a macrocomposite body had been formed comprising an open-ended metal matrix composite box with an aluminum alloy metal lip attached to the perimeter of the open-end of the ox and with an about 50–100 microinch coating of gold on top of an about 200–300 microinch coating of nickel. Both the nickel and gold coatings were well bonded to all surfaces of the metal matrix composite box, including the aluminum alloy metal lip.

EXAMPLE 30

The following Example demonstrates the utilization of a spontaneous infiltration technique to form a macrocomposite body comprising an open-ended metal matrix composite box with alloy rich sections in the bottom thereof.

A setup similar to that shown in FIG. 16 was utilized, except for the following differences: (1) no alloy gasket was inserted into the channel created along the perimeter of the graphite insert and the inside wall of the rectangular graphite mold; (2) six holes having a diameter of about 0.065 inch (1.6 mm) and two holes having a diameter of about 0.16 inch (3.9 mm) were drilled perpendicular to the plane of the graphite insert and toward its centers and two about 0.5 inch (13 mm) long segments of each of the metal wires listed in the following paragraph were inserted into the holes, with about 0.375 inch (9.5 mm) segments of each wire protruding from the top of the graphite insert.

The first pair of wires comprised a commercially available pure 99.99% aluminum (California Fine Wire Co., Goven City, Calif.) and had a diameter of about 0.064 inch (1.6 mm). The second pair of wires comprised by weight about 12.0% silicon and the balance aluminum and had been electrical discharge machined from an ingot to a cross-section measuring about 0.06 inch (1.5 mm) long and about 0.03 inch (0.76 mm) wide. The third pair of wires comprised commercially pure nickel and had a diameter of about 0.066 inch (1.7 mm). The fourth pair of wires comprised of weight about 4.0% copper and the balance silicon and had been electrical discharge machined from an ingot to a cross-section measuring about 0.06 inch (1.5 mm) long and about 0.06 inch (1.5 mm) wide.

The setup was processed into a metal matrix composite box by the same technique as described in Example 21, except that the matrix metal was coated with −325 mesh (particle diameter less than about 45 μm) magnesium powder prior to being placed on the filler material mixture. Further, deviations from the procedure set forth in Example 21 include the following: the graphite mold was placed on top of a bed of AlN powder contained within a stainless steel container measuring about 6 inches (152 mm) long, about 6 inches (152 mm) wide, and about 4.5 inches (114 mm) deep; the retort chamber and its contents were heated at a rate of about 400° C. per hour to about 815° C. while a nitrogen gas flow rate of about 5 liters per minute was maintained; and after about 3 hours at about 815° C., the flow of nitrogen gas was terminated and the furnace and its contents were cooled to about room temperature at a rate of about 400° C. per hour.

After the lay-up had reached room temperature, the lay-up was disassembled to reveal that the alloy wires had produced metal rich regions within the bottom of the metal matrix composite box. Further analysis showed that the metal wire segments had interacted with the matrix metal and formed alloys in the metal rich regions in the bottom of the metal matrix composite box. Specifically, FIG. 31a, 31b, 31c, and 31d show micrographs (taken at about 50× magnification) of the metal rich regions in the bottom of the metal matrix composite box corresponding respectively to the pure aluminum wire, the 12% silicon and balance aluminum wire, the 4.0% copper and balance silicon wire, and the pure nickel wire.

EXAMPLE 31

The following Example demonstrates the utilization of a spontaneous infiltration technique to form a macrocomposite body comprising a metal matrix composite body with an aluminum alloy region bonded to the surface of the metal matrix composite body.

Figure 32:
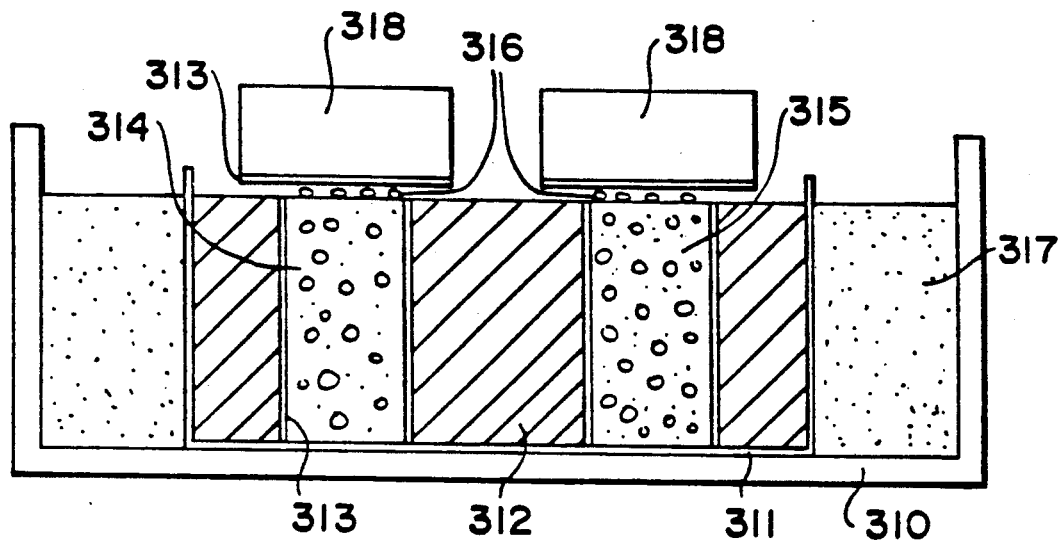
FIG. 32 is a cross-sectional schematic of the setup used to produce the macrocomposite body in accordance with Example 31.

FIG. 32 shows the lay-up cross-section that was used to form the macrocomposite body by spontaneous infiltration. Specifically, a matrix metal ingot comprising about 12% by weight silicon and the balance aluminum and measuring about 4.5 inches (114 mm) long, about 2 inches (51 mm) wide, and about 1 inch (25 mm) thick was subjected to electrical discharge machining to form two holes measuring about 1.97 inches (50 mm) long, about 0.319 inch (8.1 mm) wide, and extending through the ingot. The inner surfaces of the holes were coated with a mixture comprising −325 mesh (particle diameter less than about 45 μm) magnesium powder and ethanol to produce a surface density of magnesium of about 0.05 grams per square inch ($7.75 \times 10^{-5}$ grams per square millimeter). After the magnesium powder coating 313 had substantially dried, the matrix metal ingot was placed into a graphite foil box 311. The graphite foil box 311 was made from a piece of GRAFOIL ® (Union Carbide, Carbon Products Division, Cleveland, Ohio) measuring about 6.5 inches (165 mm) long, about 4 inches (102 mm) wide, and about 0.015 inch (0.4 mm) thick. Two parallel cuts about 1 inch (25 mm) long were made in the graphite foil on each 6.5 inch (165 mm) long side about 1 inch (25 mm) from each 4 inch (102 mm) wide end. The cut graphite foil was then folded to form the graphite foil box 311 which was about 4. 5 inches (114 mm) long, about 2 inches (51 mm) wide, and about 1 inch (25 mm) high.

The graphite foil box 311 containing the matrix metal ingot 312 was placed within a stainless steel container 310 having an inner cavity measuring about 6 inches (152 mm) long, about 6 inches (152 mm) wide, and about 4.5 inches (114 mm) deep. The holes within the matrix metal ingot were then filled with a filler material mixture 314 comprising by weight about 97% 39 CRYSTOLON ® 220 grit (average particle diameter of 66 μm) silicon carbide (Norton Co., Worcester, Mass.) and about 3% −325 mesh (particle diameter less than 45 μm) magnesium powder. 39 CRYSTOLON ® 220 grit (average particle diameter of about 66 μm) silicon carbide 317 was then poured into the cavity between the outer surface graphite foil box and the inner wall of the stainless steel container to support the graphite foil box during the infiltration process. The surface of the filler material mixture contained within the holes in the matrix metal ingot was covered with a thin layer of −50 mesh (particle diameter less than about 300 μm) magnesium powder 316 (ALFA ®, Johnson Matthey, Ward Hill, Mass.). A second matrix metal ingot 318 designated as aluminum alloy 336 and nominally comprising by weight about 11.0–13.0% Si, ≦1.2% Fe, 0.5–1.5% Cu, ≦0.35% Mn, 0.7–1.3% Mg, 2.0–3.0% Ni, ≦0.35% Zn, ≦0.25% Ti, and the balance aluminum, was placed over the filler material mixture filled openings in the first matrix metal ingot 312 to substantially cover those openings.

The lay-up comprising the stainless steel container 310 and its contents was placed into a retort contained within a resistance heated furnace and the retort door was closed. The retort was then evacuated to about 30 inches (762 mm) of mercury vacuum and heated to about 200° C. at about 300° C. per hour. After about 2 hours, at about 200° C., nitrogen gas was introduced into the retort at a flow rate of about 5 liters per minute and the furnace and its contents were heated to about 815° C. at about 300° C. per hour. After about 3.5 hours at about 815° C., the furnace and its contents were cooled to about 700° C. at about 400° C. per hour while maintaining the nitrogen flow rate at about 5 liters per hour. After about 10 hours at about 700° C., with a nitrogen flow rate of about 5 liters per hour, the flow of nitrogen and the power of the furnace were terminated and the lay-up was removed from the furnace at about 700° C. and placed onto a water cooled copper chill plate at about room temperature. Immediately after placing the lay-up onto the copper chill plate, the top of the lay-up was covered with a ceramic insulating blanket to maintain the high temperature at the top of the lay-up. By maintaining the high temperature at the top of the lay-up and providing a heat-sink at the bottom of the lay-up, directional solidification of the molten metal contained within the lay-up was effected.

Figure 33:
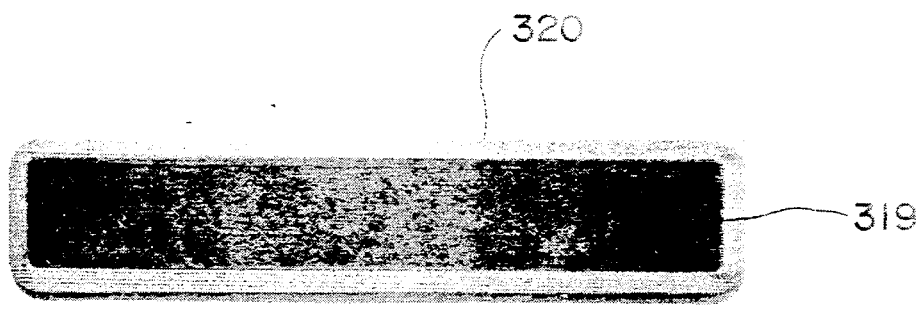
FIG. 33 is a photograph of the macrocomposite body produced in accordance with Example 31.

After the lay-up had cooled to room temperature, the lay-up was disassembled to reveal that the matrix metals has infiltrated the filler material mixtures 314 and 315 to form a macrocomposite body comprising two metal matrix composite bodies surrounded, and attached to, a body of aluminum alloy. The macrocomposite body was then cut in half so that each of the matrix metal infiltrated bodies of filler material mixture (314 and 315) were separate. Each of the separate matrix metal infiltrated bodies of filler material mixture was surrounded by and attached to a body of aluminum alloy. The above described bodies were then further subjected to electro-discharge machining to form wafers measuring about 2.09 inches (53 mm) long, about 0.439 inches (11 mm) wide, and about 0.060 inch (1.5 mm) thick. These macrocomposite wafers comprised a metal matrix composite body with an aluminum alloy band attached to the perimeter thereof that is suitable for laser welding to a macrocomposite box formed by the technique described in Example 25. Specifically, FIG. 33 shows a photograph of the macrocomposite wafer with the metal matrix portion 319 surrounded by an aluminum alloy lip 320.

EXAMPLE 32

The following Example demonstrates the utilization of a spontaneous infiltration technique to form a macrocomposite body comprising a metal and a metal matrix composite, wherein the metal is pre-reacted in order to minimize the reaction of the matrix metal of the metal matrix composite body and the metal incorporated therein.

Figure 34:
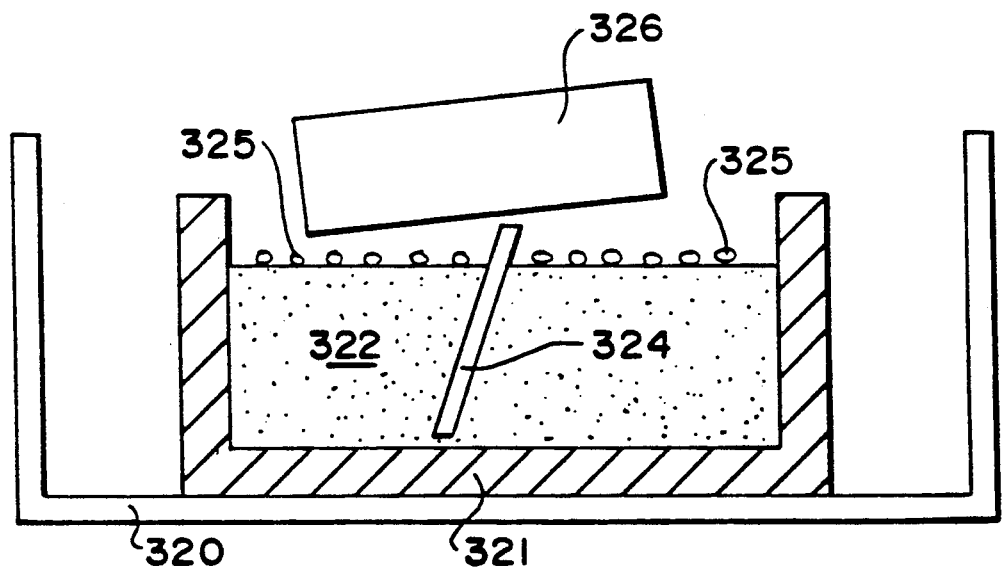
FIG. 34 is a cross-sectional schematic of the setup used to produce the macrocomposite body in accordance with Example 32.

FIG. 34 shows a schematic cross-section of the setup used to produce the macrocomposite body. Specifically, a graphite boat 321 having an inner cavity measuring about 3 inches (76 mm) long, about 3 inches (76 mm) wide, and about 2.5 inches (64 mm) high was machined from Grade ATJ graphite (Union Carbide Corp., Carbon Products Division, Cleveland, Ohio). The graphite boat 321 was placed into a stainless steel container 320 measuring about 6 inches (152 mm) long, about 6 inches (152 mm) wide, and about 4.5 inches (114 mm) deep. A filler material mixture 322 comprising by weight about 77.7% 39 CRYSTOLON ® 220 grit (average particle diameter of about 66 μm) silicon carbide (Norton Co., Worcester, Mass.), about 19.4% 39 CRYSTOLON ® 500 grit (average particle diameter of about 17 μm) silicon carbide, and about 2.9% −325 mesh (particle diameter less than about 45 μm) magnesium powder (Reade Manufacturing Co., Lakehurst, N.J.) was placed into the graphite boat 321 to a depth of about 1 inch (25 mm) and levelled. The filler material mixture 322 was then coated with −50 mesh (particle diameter less than about 300 μm) magnesium powder 325 (ALFA ®, Johnson Matthey, Ward Hill, Mass.).

In one setup, as described above and schematically shown in FIG. 34, a pre-nitrided piece of commercially available (description) titanium 324 measuring about 2 inches (50 mm) long, about 1 inch (25 mm) wide, and about 0.06 inch (1.5 mm) thick was placed into the filler material mixture 322. The titanium piece 324 had been pre-nitrided by heating it from room temperature to about 1400° C. at about 250° C. per hour in flowing nitrogen gas having a flow rate of about 1 liter per minute. After about 1 hour at about 1400° C., with a nitrogen flow rate of about 1 liter per minute, the sample was cooled to room temperature at about 250° C. per hour. An approximately 63 gram body of matrix metal 326 designated aluminum alloy 336 and having the composition described in the following paragraph was placed onto the filler material mixture 322 coated with the magnesium powder 325.

In a second setup, as described above and illustrated in FIG. 34, a piece or titanium alloy 324 having substantially the same size as that described above for the nitrided piece of titanium was placed into the filler material mixture 322 as illustrated in FIG. 34. An approximately 63 gram body of matrix metal 326 designated aluminum alloy 336 and nominally comprising by weight about 11.0–13.0% Si, ≦1.2% Fe, 0.5–1.5% Cu, ≦0.35% Mn, 0.7–1.3% Mg, 2.0–3.0% Ni, ≦0.35% Zn, ≦0.25% Ti, and the balance aluminum, was placed onto the filler material mixture 322 coated with the magnesium powder 325.

Each of the two setups described above were placed into retorts contained within separate resistance heated furnaces and the retort doors were closed. At about room temperature, a vacuum of about 30 inches of mercury was created within the retort chambers and the furnaces and their contents were heated to about 200° C. at about 400° C. per hour. After about an hour at about 200° C., nitrogen gas at a flow rate of about 5 liters per minute was introduced to each retort chamber and the furnaces and their contents were heated at about 400° C. per hour to about 815° C. After about 3 hours at about 815° C, the flow of nitrogen gas was terminated and the furnaces were cooled to about room temperature at about 400° C. per hour.

Figure 35A:
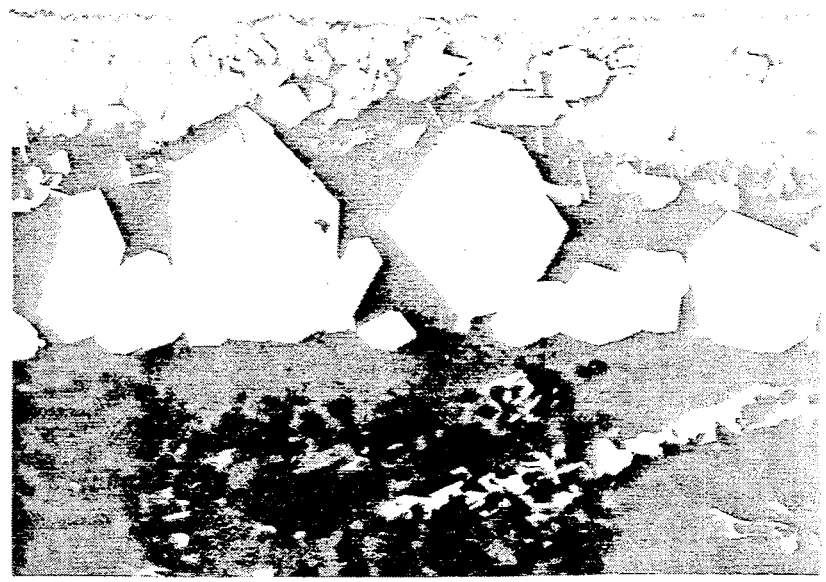
FIG. 35a and 35b are micrographs done in the back-scattered electron mode taken at about 200× magnification of the interaction of the matrix metal and the titanium alloy in Example 32.
Figure 35B:

After the lay-ups had cooled to room temperature, the lay-ups were disassembled to reveal that the matrix metal had infiltrated the filler material mixture 322 and embedded the titanium pieces 324 to form macrocomposite bodies. The macrocomposite bodies were then sectioned with a diamond saw, and the sections were mounted and polished so that the interaction between the matrix metal and the titanium metal incorporated within the aluminum alloy metal matrix could be examined. FIGS. 35a and 35b are microstructures of the two macrocomposite bodies showing the interaction between the matrix metal and the titanium inserts. Specifically, FIG. 35a micrograph taken at about 200× magnification of the interaction are between the titanium metal insert which was not prenitrided and the aluminum alloy matrix metal showing the formation of intermetallics to a depth of about 250 microns within the titanium metal insert. In contrast, FIG. 35b, which is also a micrograph taken at about 200× magnification, shows that the extent of the interaction between the titanium metal insert and the matrix metal can be reduced by pre-nitriding the titanium metal insert. As shown in FIG. 35b, the interaction area has been reduced to a thickness of about 10 microns.

Thus, this Example demonstrates that the interaction between the molten matrix metal and a body of metal to be bonded between the matrix metal can be reduced by forming a coating on the body of metal which resists interaction with the molten matrix metal.

EXAMPLE 33

The following Example demonstrates the utilization of a spontaneous infiltration technique to form a macrocomposite body comprising an open-ended metal matrix composite box containing a plurality of electrical feed-throughs.

FIG. 26a shows a top view schematic of the setup used to make a macrocomposite comprising an open-ended metal matrix composite box with 14 electrical feed-throughs through its side walls. Specifically, a mold similar to the mold used in Example 19, was cut in half and in the side walls of each mold half seven holes, each having a diameter of about 0.039 inch (1.0 mm), were drilled in a line about 0.28 inch (7.1 mm) above the bottom of the mold. The holes were equally spaced about 0.25 inch (6.4 mm) apart. Likewise, a graphite insert, similar to the graphite insert described in Example 19, was also drilled with seven holes on each side which aligned with the holes in the side walls of the mold halves when the mold halves and graphite insert were assembled. Each of these holes was designed to accommodate a portion of an electrical feed-through. After the holes had been drilled, the mold halves, the graphite insert, and 14 electrical feed-throughs were coated with a colloidal graphite mixture as described in Example 19. The coating procedure was repeated four times and each coating was allowed to dry prior to the application of a subsequent coating. The seam between mold halves 1201 and 1202 was filled with three pieces of GRAFOIL ® graphite foil 1207. The circumferential edges of the alumina disk portion 1205 of the electrical feed-throughs 1206 were sanded prior to assembly to remove any of the colloidal graphite coating. The mold halves 1201 and 1202, the graphite insert 1204, and the electrical feed-throughs 1206 were cured together in an air atmosphere furnace for about 2 hours at about 400° C.

Figure 36A:
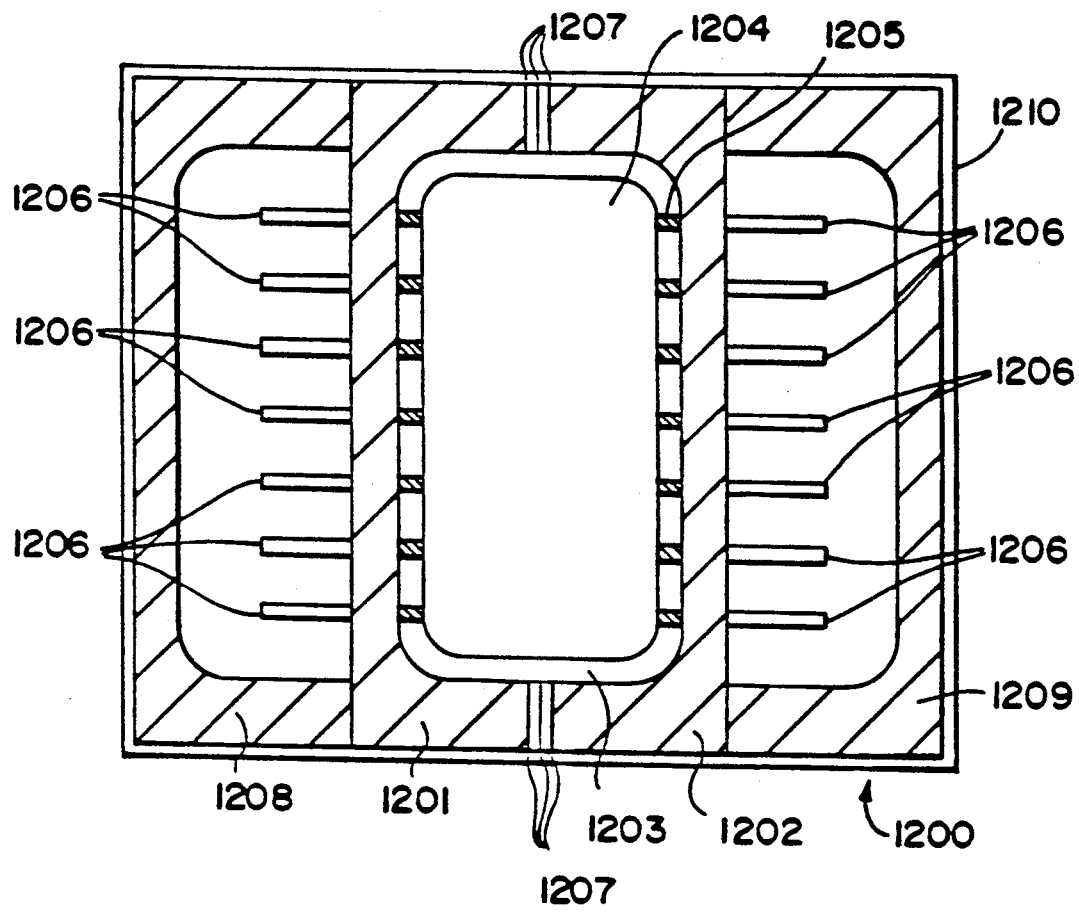
FIG. 36a is a top view schematic of the setup used to produce the macrocomposite body in accordance with Example 33.

To complete the setup as shown in FIG. 36a, a second graphite mold was cut in half and the mold halves 1208 and 1209 were contacted to the outer surfaces of mold halves 1201 and 1202 as shown in FIG. 35 and copper wire 1210 was wrapped three times around the setup to clamp the setup together.

After the assembly, as shown in FIG. 36a, had been completed, a filler material mixture comprising by weight about 67.3% 39 CRYSTOLON ® 220 grit silicon carbide (average particle diameter of about 66 μm) (Norton Co., Worcester, Mass.), about 28.8% 39 CRYSTOLON ® 500 grit silicon carbide (average particle smaller than about 75 μm) (University of Missouri—Rolla), was mixed with a mortar and pestle and poured then into the first graphite mold formed by mold halves 1201 and 1202. The surface of the filler material mixture was then covered with a piece of graphite foil having a hole measuring about 0.50 inch (13 mm) in diameter and additional −200 mesh Mg$_2$Cu was placed along the perimeter of the graphite foil and within the hole. A body of the same matrix metal used in Example 19, but weighing about 52.3 grams, was placed onto the graphite foil.

The setup, comprising the assembly and its contents, was placed onto a bed of Grade B aluminum nitride powder (about 0.4 micron in diameter) (Hermann C. Stark, Inc., New York, N.Y.) contained within a graphite boat. The graphite boat and its contents were placed into a retort contained within a resistance heated furnace, as described in Example 19 and a vacuum of about 30 inches (762 mm) of mercury was created within the retort chamber. The furnace and its contents were then heated to about 200° C. in about one hour and a nitrogen flow rate of about 5 liters per minute was introduced. After about 7.7 hours at about 200° C. with a nitrogen flow rate of about 5 liters per minute, the furnace and its contents were heated to about 810° C. at about 200° C. per hour. The same nitrogen gas flow rate was maintained at all times. After about 5 hours at about 810° C., the power to the furnace and the flow of nitrogen gas were terminated and the graphite boat was removed from the furnace. The setup at about 810° C. was placed onto a water cooled aluminum chill plate at about room temperature. The aluminum chill plate had dimensions of about 12 inches (305 mm) long, about 10 inches (254 mm) wide, and about 2 inches (51 mm) thick. By providing a heat sink at the bottom of the hot setup, the directional solidification of the molten metal contained within the setup was effected.

Figure 36B:
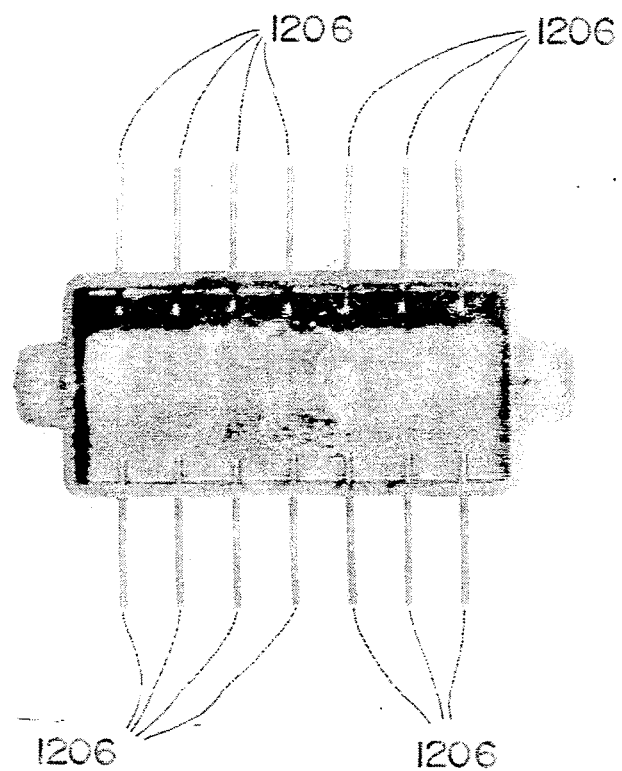

After the setup had cooled to room temperature, the setup was disassembled to reveal that the matrix metal had infiltrated the filler material mixture and embedded the alumina disk portions 1205 of the electrical feed-throughs 1206, to form a macrocomposite body comprising an open-ended metal matrix composite box, with the electrical feed-throughs bonded to and electrically insulated from the metal matrix composite box by the alumina disk portions 1205 of the electrical feed-throughs 1206. Specifically, FIG. 36b shows the open-ended metal matrix composite box with the 14 electrical feed-throughs 1206 in its side walls.

EXAMPLE 34

The following Example demonstrates a method of incorporating a strip line feed-throughs into a metal matrix composite box.

Figure 37:
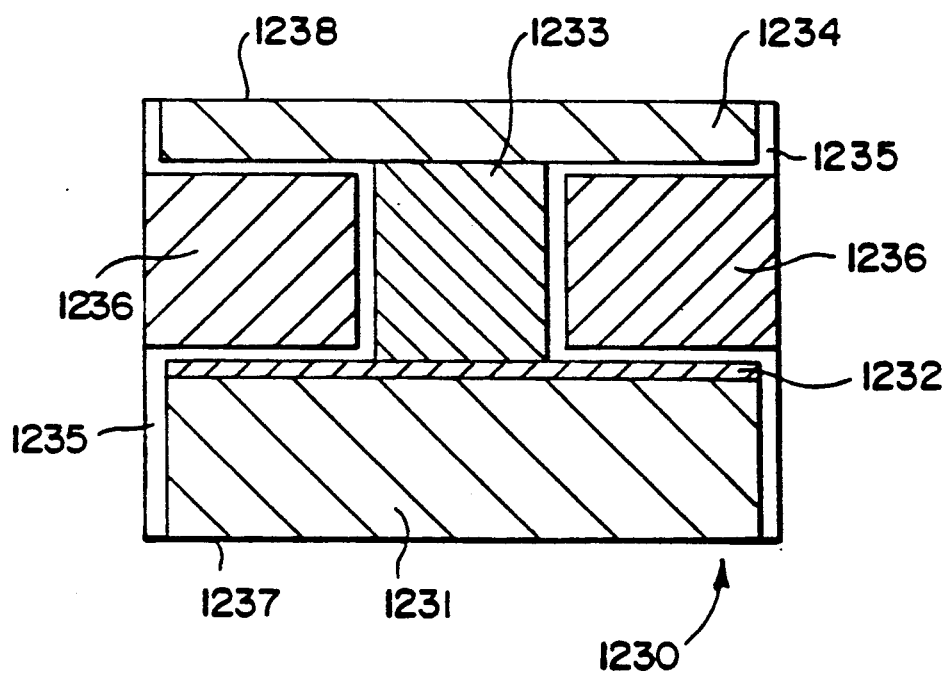
FIG. 37 is a cross-sectional schematic of the strip line feedthrough prepared for incorporation into the setup to produce a macrocomposite body in accordance with Example 34.

Specifically, FIG. 37 shows a cross-sectional schematic of a strip line feed-through 1230 just prior to incorporation into a graphite mold for the subsequent formation of a macrocomposite body comprising an open-ended metal matrix composite box containing the strip line feed-throughs therein. The strip line feed-through, as illustrated in FIG. 37, comprises an alumina base 1231 measuring about 0.36 inch (9.1 mm) long, about 0.11 inch (2.8 mm) wide, and about 0.015 inch (0.4 mm) thick. An electrically conductive coating 1232 comprising tungsten was placed onto the base 1231. Subsequently, an alumina pedestal 1233 is placed on top of the electrically conductive coating 1232. The pedestal 1233 measured about 0.36 inch (9.1 mm) long, about 0.04 inch (1.0 mm) wide, and about 0.15 inch (0.4 mm) high. An alumina top piece 1234 measuring bout 0.36 inch (9.1 mm) long, about 0.11 inch (2.8 mm) wide, and about 0.01 inch (0.25 mm) thick is attached to pedestal 1233. The strip line feed-through was manufactured by Tech-Ceram Corp., Amesbury, Mass. to applicants' specifications.

The strip line feed-throughs was placed onto a piece of masking tape such that surface 1237 contacted the adhesive side of the tape. The remaining surfaces were then coated four times with the colloidal graphite ethanol mixture described in Example 19. Each coating was allowed to substantially dry before the subsequent coating was applied. After the fourth coating had sufficiently dried to form a graphite coating 1235, the graphite coating was scraped from the top 1234 to expose surface 1238. A gap along the length of both sides of the pedestal 1233 was filled with several pieces of graphite foil 1236 to complete the preparation of the strip line electrical feed-through for incorporation into a two piece graphite mold (similar to the mold described in Example 33) designed for making an macrocomposite body comprising an open-ended metal matrix composite box with strip line feed-throughs in the side walls thereof.

A filler material mixture comprising about 66% 39 CRYSTOLON ® 220 grit (average particle diameter of about 66 μm) silicon carbide (Norton Co., Worcester, Mass.), about 28.3% 39 CRYSTOLON ® 500 grit (average particle diameter about 17 μm) silicon carbide (Norton Company, Worcester, Mass.), and about 5.7% −200 mesh (particle diameter less than about 75 μm) $Mg_2Cu$ (description) was mixed with a mortar and pestle and placed into the graphite mold. The surface of the filler material mixture was then covered with a piece of graphite foil having two holes measuring about 0.25 inch (6.4 mm) in diameter. Additional $Mg_2Cu$ was then placed along the perimeter of the graphite foil and within the holes in the graphite foil. Two about 12.5 gram bodies of the same matrix metal used in Example 19, were placed over the holes in the graphite foil. The graphite mold and its contents were then placed onto a bed of Grade B aluminum nitride powder (about 0.4 micron in diameter) (Hermann Starck, Inc., New York, N.Y.) contained within a graphite boat. The heating schedule described in Example 33 was repeated, except that the time at about 200° C. was about 6.5 hours. After the setup had cooled to room temperature, the setup was disassembled to reveal that the matrix metal had infiltrated the filler material mixture and embedded the strip line feed-throughs to form a macrocomposite body comprising an open-ended metal matrix composite box with strip line feed-throughs contained in the side walls thereof. The strip line feed-throughs were well bonded to the open-ended metal matrix composite box at surfaces 1237 and 1238 of the feed-throughs and the electrically conductive tungsten coating of each feed-through was electrically insulated from the metal matrix composite box by the alumina structure of each feed-through as well as the graphite coating and graphite foil on the side surfaces of each feed-through.

In another embodiment of the instant invention a macrocomposite body comprising a metal matrix composite attached to a second metal, having a compatible coefficient of thermal expansion with the attached metal matrix composite, is formed. Moreover, a second metal has a high electrical resistivity and low thermal conductivity. Upon coating the second metal with a third metal (e.g., gold) the resultant macrocomposite is compatible with seam welding processes.

What is claimed is:
1. A method for producing a sealable electronic package comprising:
   juxtaposing at least one material selected from the group consisting of at least one weldable body of material and at least one electrically insulating material relative to a mass of filler material or preform;
   juxtaposing a body of matrix metal relative to said mass of filler material or preform such that said matrix metal, when molten, will spontaneously infiltrate said mass of filler material or preform up to said at least one material to form a macrocomposite body comprising a metal matrix composite body integrally bonded to said at least one material;

heating said matrix metal in an infiltrating atmosphere to a temperature above the melting point of said matrix metal but below the melting point of said filler material or preform;

spontaneously infiltrating at least a portion of said mass of filler material or preform with said matrix metal up to at least a portion of said at least one material; and cooling said matrix metal to a temperature below said melting point of the matrix metal., while said matrix metal is in contact with said at least one material, thereby forming said sealable electronic packaging.

2. The method of claim 1, wherein said weldable body of material comprises at least one seam weldable body of material selected from the group consisting of a metal matrix composite body, copper, and aluminum.

3. The method of claim 2, wherein both said at least one seam weldable body of material and said at least one electrically insulating material are juxtaposed to said filler material or preform prior to spontaneously infiltrating said filler material or preform.

4. The method of claim 3, wherein said at least one electrically insulating material comprises alumina.

5. The method of claim 3, wherein said electrically insulating material comprises mullite.

6. The method of claim 3, wherein said electrically insulating material contains an electrically conductive material.

7. The method of claim 3, wherein said electrically insulating material contains an electrical conductor therein, said electrical conductor and said electrically insulating material forming a hermetic seal therebetween during said spontaneously infiltrating step.

8. The method of claim 2, wherein at least a portion of said macrocomposite body is coated by at least one process selected from the group consisting of sputtering, electroless plating, electoplating and ion vapor deposition.

9. The method of claim 1, wherein said weldable body of material comprises at least one laser weldable body of material selected from the group consisting of aluminum and aluminum metal matrix composite bodies.

10. The method of claim 2, wherein said weldable body of material functions as a weldable lip on said electronic package.

11. The method of claim 8, wherein said coating assists in seam sealing said macrocomposite body to another body.

12. The method of claim 1, wherein said electrically insulating material is located in a wall of said macrocomposite body and functions as an insulating area in said electronic package.

13. The method of claim 12, wherein the electronic chip is affixed to said electrical insulating area.

14. The method of claim 8, wherein at least two layers are deposited on said macrocomposite body.

15. The method of claim 8, wherein said coating comprises at least one material selected from the group consisting of gold, nickel, tin, zinc, epoxy, resins and mixtures thereof.

* * * * *